(12) United States Patent
Yoshida et al.

(10) Patent No.: US 9,917,263 B2
(45) Date of Patent: Mar. 13, 2018

(54) TRANSPARENT ELECTRODE, ELECTRONIC DEVICE, AND ORGANIC ELECTROLUMINESCENT ELEMENT

(71) Applicant: Konica Minolta Inc., Tokyo (JP)

(72) Inventors: Kazuhiro Yoshida, Tachikawa (JP); Takeshi Hakii, Sagamihara (JP); Toshiyuki Kinoshita, Hino (JP); Shigeru Kojima, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 341 days.

(21) Appl. No.: 14/760,354

(22) PCT Filed: Jan. 8, 2014

(86) PCT No.: PCT/JP2014/050118
§ 371 (c)(1),
(2) Date: Jul. 10, 2015

(87) PCT Pub. No.: WO2014/112410
PCT Pub. Date: Jul. 24, 2014

(65) Prior Publication Data
US 2015/0357581 A1 Dec. 10, 2015

(30) Foreign Application Priority Data

Jan. 15, 2013 (JP) .................. 2013-004795

(51) Int. Cl.
*H01L 51/50* (2006.01)
*H01L 51/00* (2006.01)
*H01L 51/52* (2006.01)

(52) U.S. Cl.
CPC ........ *H01L 51/0072* (2013.01); *H01L 51/007* (2013.01); *H01L 51/0065* (2013.01);
(Continued)

(58) Field of Classification Search
None
See application file for complete search history.

(56) References Cited

U.S. PATENT DOCUMENTS

2011/0057920 A1  3/2011  Matsuura et al.

FOREIGN PATENT DOCUMENTS

JP  2002015623 A  1/2002
JP  2002110365 A  4/2002
(Continued)

OTHER PUBLICATIONS

Office Action dated May 26, 2016 from the corresponding Chinese Application; Application No./Patent No. 201480004457.8; Applicant: Konica Minolta, Inc.; Total of 16 pages.
(Continued)

*Primary Examiner* — Gregory D Clark
(74) *Attorney, Agent, or Firm* — Lucas & Mercanti, LLP

(57) ABSTRACT

A transparent electrode includes a nitrogen-containing layer constituted by using a compound containing a nitrogen atom (N), an electrode layer containing silver (Ag) as a main component, which is disposed adjacent to the nitrogen-containing layer, and two high-refractive index layers each having a higher refractive index than that of the nitrogen-containing layer, which are disposed so that the electrode layer and the nitrogen-containing layer are sandwiched between the high-refractive index layers.

21 Claims, 6 Drawing Sheets

(52) U.S. Cl.
CPC ...... *H01L 51/0069* (2013.01); *H01L 51/0071* (2013.01); *H01L 51/0074* (2013.01); *H01L 51/0094* (2013.01); *H01L 51/5215* (2013.01); *H01L 51/0067* (2013.01); *H01L 51/0073* (2013.01); *H01L 51/0081* (2013.01); *H01L 51/0085* (2013.01); *Y10T 428/24942* (2015.01)

(56) References Cited

FOREIGN PATENT DOCUMENTS

| JP | 2002-313139 | * | 10/2002 | ............... H01B 5/14 |
| JP | 2002313139 A1 | | 10/2002 | |
| JP | 2005044790 A1 | | 2/2005 | |
| JP | 2006164961 A | | 6/2006 | |
| JP | 2008171637 A | | 7/2008 | |
| JP | 2009151963 A | | 7/2009 | |
| JP | 2010251675 A | | 11/2010 | |
| JP | 2011-077028 | * | 4/2011 | ............ H01L 51/50 |
| JP | 2011077028 A | | 4/2011 | |
| WO | 2009054253 A1 | | 4/2009 | |
| WO | 2011004807 A1 | | 1/2011 | |

OTHER PUBLICATIONS

International Search Report dated Mar. 25, 2014 for PCT/JP2014/050118 and English translation.

Notice of Reasons for Rejection dated Jul. 4, 2017 from corresponding Japanese Patent Application No. JP 2014-557426 and English translation.

* cited by examiner

TBAC

Ir(ppy)₃

TRANSPARENT ELECTRODE, ELECTRONIC DEVICE, AND ORGANIC ELECTROLUMINESCENT ELEMENT

CROSS REFERENCE TO RELATED APPLICATION

This Application is a 371 of PCT/JP2014/050118 filed on Jan. 8, 2014 which, in turn, claimed the priority of Japanese Patent Application No. JP2013-004795 filed on Jan. 15, 2013, both applications are incorporated herein by reference.

TECHNICAL FIELD

The present invention relates to a transparent electrode, an electronic device and an organic electroluminescent element, and specifically relates to a transparent electrode having both electroconductivity and light transmission property, and to an electronic device and an organic electroluminescent element including this transparent electrode.

BACKGROUND ART

Organic electroluminescent elements (so-called organic EL elements) utilizing the electroluminescence (hereinafter described as EL) of organic materials are thin film-type, completely solid elements that are capable of emitting light at low voltages of about several volts to several ten volts, and have many excellent characteristics such as high luminance, high luminescent efficiency, thin-type and light weight. Therefore, the organic electroluminescent elements have gained attentions in recent years as backlights for various displays, display boards such as signboards and emergency lamps, and plane emission bodies such as illumination light sources.

Such organic electroluminescent element has a constitution in which a luminescent layer constituted by using an organic material is sandwiched between two electrodes, and luminescent light generated in the luminescent layer transmits the electrode and is extracted outside of the electrode. Therefore, at least one of the two electrodes is constituted as a transparent electrode.

As the transparent electrode, oxide semiconductor-based materials such as indium tin oxide ($SnO_2$—$In_2O_3$:Indium Tin Oxide:ITO) are generally used, and consideration aiming at decreasing resistance is also made by stacking ITO and silver (for example, see the following Patent Literatures 1 and 2). However, since ITO includes indium, which is a rare metal, the material cost is high, and it is necessary to conduct an annealing treatment at about 300° C. after the film formation so as to decrease the resistance. Therefore, a constitution in which a metal material having a high electroconductivity such as silver has been formed into a thin film, a constitution in which electroconductivity is ensured at a film thickness that is thinner than that of silver alone by mixing silver with aluminum (for example, see the following Patent Literature 3), and a constitution in which a light transmission property is ensured by providing a stacked structure in which a silver thin film layer is disposed on a primer layer formed of a metal other than silver (for example, see the following Patent Literature 4) are suggested.

CITATION LIST

Patent Literatures

Patent Literature 1: JP 2002-15623 A
Patent Literature 2: JP 2006-164961 A
Patent Literature 3: JP 2009-151963 A
Patent Literature 4: JP 2008-171637 A

SUMMARY OF INVENTION

Technical Problem

However, it was difficult to achieve both of sufficient electroconductivity and light transmission even by a transparent electrode constituted by using silver and aluminum, which have a high electroconductivity.

Therefore, objects of the present invention are to provide a transparent electrode having both sufficient electroconductive and light transmission property, and to provide an electronic device and an organic electroluminescent element whose performances have been improved by using this transparent electrode.

Solution to Problem

In order to achieve the objects, a transparent electrode according to the present invention includes: a nitrogen-containing layer constituted by using a compound containing a nitrogen atom (N), an electrode layer containing silver (Ag) as a main component, is the electrode layer being disposed adjacent to the nitrogen-containing layer, and two high-refractive index layers each having a higher refractive index than that of the nitrogen-containing layer, the high-refractive index layers being disposed to sandwich the electrode layer and the nitrogen-containing layer.

Furthermore, the electronic device of the present invention is characterized by having a transparent electrode having the above-mentioned constitution. The electronic device is, for example, an organic electroluminescent element.

The transparent electrode constituted as mentioned above has such a constitution that an electrode layer containing silver as a main component is disposed so as to adjacent to a nitrogen-containing layer constituted by using a compound containing a nitrogen atom. By this way, the electrode layer containing silver as a main component becomes an electrode layer in which the diffusion distance of the silver at the adjacent interface is decreased to avoid flocculation through the interaction with the nitrogen atom that constitutes the nitrogen-containing layer. Therefore, the silver thin film, which is generally easily isolated in an insular form due to film growth in a nucleation type (Volumer-Weber: VW type), is formed by monolayer growth-type (Frank-van der Merwe: FM type) film growth. Accordingly, it becomes possible to obtain an electrode layer having a film thickness that is thin but is even.

Furthermore, since the nitrogen-containing layer and electrode layer are sandwiched by high-refractive index layers each having a higher refractive index than that of the nitrogen-containing layer, light reflection in the transparent electrode is suppressed.

Therefore, in this transparent electrode, an electrode layer in which the light transmission property is ensured by its thin film thickness, and the electroconductivity is ensured by its even film thickness can be surely obtained, and improvement of the light transmission property due to prevention of light reflection can also be expected. By this way, it becomes possible to achieve both improvement of the electroconductivity and improvement of the light transmission property in a transparent electrode including silver.

Advantageous Effects of Invention

As explained above, according to the present invention, it becomes possible to achieve both improvement of the electroconductivity and improvement of the light transmission property in a transparent electrode, and it becomes possible to improve the performances of an electronic device and an organic electroluminescent element including this transparent electrode.

DESCRIPTION OF EMBODIMENTS

The embodiments of the present invention will be explained in the order shown below based on drawings.
1. Transparent electrode
2. Use of transparent electrode
3. Organic electroluminescent element
4. Illumination apparatus <<1. Transparent Electrode>>

Figure 1:
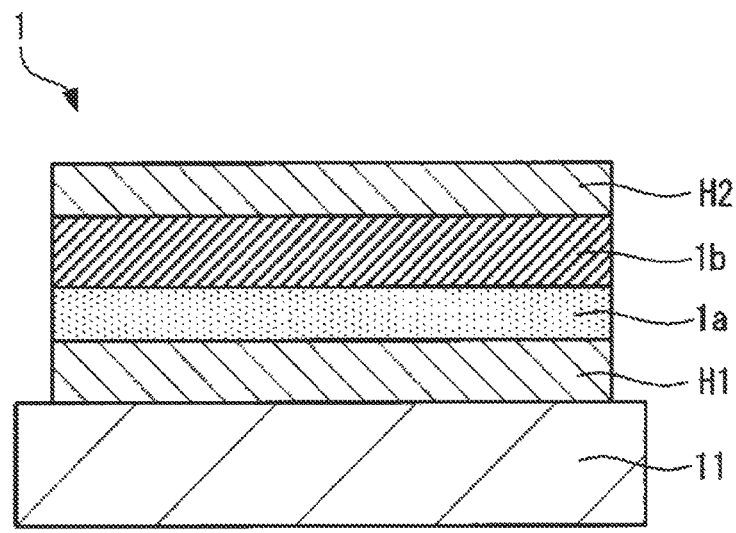
FIG. 1 is a cross-sectional schematic drawing showing the constitution of the transparent electrode of the present invention.

FIG. 1 is a cross-sectional schematic drawing showing the constitution of a transparent electrode of an exemplary embodiment of the present invention. As shown in this drawing, a transparent electrode 1 has a four-layer structure in which a nitrogen-containing layer 1a, an electrode layer 1b disposed adjacent to this, and two high-refractive index layers H1 and H2 sandwiching the layers 1a and 1b are sandwiched are stacked, and for example, the high-refractive index layer H1, the nitrogen-containing layer 1a, the electrode layer 1b and the high-refractive index layer H2 are disposed in this order on the substrate 11. Of these, the electrode layer 1b, which constitutes the electrode part in the transparent electrode 1, is a layer constituted by containing silver (Ag) as a main component. Furthermore, the nitrogen-containing layer 1a with respect to the electrode layer 1b is constituted by using a compound containing a nitrogen atom (N), and is characterized by the use of a compound having a content rate of [effective non-covalent electron pairs] within a predetermined range, given that the non-covalent electron pair of the nitrogen atom, which non-covalent electron pair stably binds specifically to the silver as a main material that constitutes the electrode layer 1b, is [effective non-covalent electron pair]. The high-refractive index layers H1 and H2 are layers each having a higher refractive index than that of the nitrogen-containing layer 1a.

The detailed constitutions will be explained below in the order of the substrate 11 on which the transparent electrode 1 is disposed, and the nitrogen-containing layer 1a, the electrode layer 1b and the high-refractive index layers H1 and H2 that constitute the transparent electrode 1 of such stacking structure. In addition, being transparent in the transparent electrode 1 of the present invention refers to that a light transmittance at a wavelength of 550 nm is 50% or more.

<Substrate 11>

Examples of the substrate 11 on which the transparent electrode 1 of the present invention is formed can include, but are not limited to, glasses, plastics and the like. Furthermore, the substrate 11 may be either transparent or opaque. In the case when the transparent electrode 1 of the present invention is used in an electronic device in which light is extracted from the side of the substrate 11, it is preferable that the substrate 11 is transparent. Examples of the transparent substrate 11 that is preferably used can include glasses, quartz and transparent resin films.

Examples of the glasses include silica glass, soda lime silica glass, lead glass, borosilicate glass, non-alkali glass and the like. Where necessary, a physical treatment such as polishing is conducted, or a coating formed of an inorganic substance or an organic substance, or a hybrid coating in which these coatings are combined is formed on the surfaces of these glass materials from the viewpoints of adhesion to the nitrogen-containing layer 1a, durability and smoothness. An especially preferable substrate 11 is a resin film capable of imparting flexibility to the transparent electrode 1, and electronic devices, such as organic electroluminescent elements, constituted by using the transparent electrode 1.

Examples of the resin films include polyesters and polyethylenes such as polyethylene telephthalate (PET) and polyethylene naphthalate (PEN), polypropylenes, cellulose esters such as cellophane, cellulose diacetate, cellulose triacetate (TAC), cellulose acetate butyrate, cellulose acetate propionate (CAP), cellulose acetate phthalate and cellulose nitrate, or derivatives thereof, polyvinylidene chloride, polyvinyl alcohol, polyethylene vinyl alcohol, syndiotactic polystyrene, polycarbonate, norbornene resins, polymethylpentene, polyether ketone, polyimides, polyether sulfone (PES), polyphenylene sulfide, polysulfones, polyetherimides, polyetherketoneimides, polyamides, fluorine resins, nylons, polymethyl methacrylate, acrylics or polyarylates, cycloolefin-based resins such as ARTON (commercial product name, manufactured by JSR) or APEL (commercial product name, manufactured by Mitsui Chemicals, Inc.), and the like.

A coating formed of an inorganic substance or an organic substance, or a hybrid coating containing these coatings in combination may be formed on the surface of the resin film. Such coating and hybrid coating are preferably barrier films (also referred to as barrier coatings and the like) each having a water vapor permeation degree measured by the method based on JIS-K-7129-1992 (25±0.5° C., relative humidity 90±2% RH) of 0.01 g/(m$^2$·24 h) or less. More preferably, these are high barrier films each having an oxygen permeation degree measured by the method based on JIS-K-7126-1987 of $10^{-3}$ ml/(m$^2$·24 h·atm) or less and a water vapor permeation degree of $10^{-5}$ g/(m$^2$·24 h) or less.

The material for forming the barrier film mentioned above may be any material that has a function to suppress substances that causes deterioration of the elements such as water content and oxygen, and for example, silicon oxide, silicon dioxide, silicon nitride and the like can be used. Furthermore, in order to improve the brittleness of the barrier film, it is more preferable to provide a stacked structure of these inorganic layers and a layer made of an organic material (an organic layer). Although the order of stacking of the inorganic layer and organic layer is not specifically limited, it is preferable to stack these layers plural times in an alternate manner.

The method for forming the barrier film is not specifically limited, and for example, a vacuum deposition process, a sputtering process, a reactive sputtering process, a molecular ray epitaxy process, a cluster ion beam process, an ion plating process, a plasma polymerization process, an atmospheric pressure plasma polymerization process, a plasma CVD process, a laser CVD process, a thermal CVD process, a coating process and the like can be used, and the method by an atmospheric pressure plasma polymerization process described in JP 2004-68143 A is especially preferable.

On the other hand, in the case when the substrate 11 is an opaque substrate, metal substrates such as aluminum and stainless steel, opaque resin substrates, substrates made of ceramics, and the like can be used. These substrates may have a film-like shape that flexibly bends.

<Nitrogen-Containing Layer 1a>

The nitrogen-containing layer 1a is a layer that is disposed adjacent to the electrode layer 1b, and is constituted by using a compound containing nitrogen atoms (N). The nitrogen-containing layer 1a has a film thickness of 1 μm or less, preferably 100 nm or less. Furthermore, this compound is especially characterized by, for example, the content rate of the [effective non-covalent electron pairs] is in a predetermined range, given that the non-covalent electron pairs of the nitrogen atoms that stably bind to silver, which is the main material for constituting the electrode layer 1b, among the nitrogen atoms contained in the compound are [effective non-covalent electron pairs].

The [effective non-covalent electron pairs] herein are non-covalent electron pairs that are neither involved in aromaticity nor coordinated to the metal among the non-covalent electron pairs of the nitrogen atoms contained in the compound. The aromaticity herein refers to an unsaturated cyclic structure in which atoms having π electrons are disposed in a circular pattern, and is so-called aromaticity that follows the "Huckel's rule", and the condition thereof is such that the number of the electrons contained in the π electron systems on the ring is "4n+2" (n=0, or a natural number).

The [effective non-covalent electron pairs] as mentioned above is selected depending on whether or not the non-covalent electron pair of the nitrogen atom is involved in aromaticity, irrespective of whether or not the nitrogen atom having the non-covalent electron pair itself is a hetero atom that constitutes an aromatic ring. For example, even in the case when a certain nitrogen atom is a hetero atom that constitutes an aromatic ring, if the non-covalent electron pair of the nitrogen atom is a non-covalent electron pair that is not directly involved in aromaticity as an essential factor, i.e., a non-covalent electron pair that is not involved as an essential non-covalent electron pair for exhibiting aromaticity in delocalized it electron systems on a conjugated unsaturated ring structure (an aromatic ring), the non-covalent electron pair is counted as one of [effective non-covalent electron pairs]. In response to this, even in the case when a certain nitrogen atom is not a hetero atom that constitutes an aromatic ring, if the non-covalent electron pair of the nitrogen atom is involved in aromaticity, then the non-covalent electron pair of the nitrogen atom is not counted as [effective non-covalent electron pair]. In addition, in each compound, the number n of the above-mentioned [effective non-covalent electron pairs] is identical with the number of the nitrogen atoms having [effective non-covalent electron pairs].

Secondly, the above-mentioned [effective non-covalent electron pairs] will be explained in detail with referring to specific examples.

A nitrogen atom is a Group 15 element, and has five electrons at the outermost shell. Among these, three unpaired electrons are used for covalent bonds with other atoms, and the other two forms a non-covalent electron pair. Therefore, the number of bonding of a nitrogen atom is generally three.

Examples of groups having nitrogen atom(s) include amino groups ($-NR^1R^2$), amide groups ($-C(=O)NR^1R^2$), a nitro group ($-NO_2$), a cyano group ($-CN$), a diazo group ($-N_2$), an azide group ($-N_3$), a urea bond ($-NR^1C=ONR^2-$), an isothiocyanate group ($-N=C=S$), a thioamide group ($-C(=S)NR^1R^2$) and the like. $R^1$ and $R^2$ are each a hydrogen atom (H) or a substituent. Since the non-covalent electron pairs in the nitrogen atoms constituting these groups are neither involved in aromaticity nor coordinated to a metal, they fall within [effective non-covalent electron pairs]. Among these, although the non-covalent electron pair of the nitrogen atom of the nitro group ($-NO_2$) is utilized in the resonance structure with the oxygen atoms, but a fine effect is obtained as shown in the following Examples. Therefore, it is considered that they are present on the nitrogen as [effective non-covalent electron pairs] that are neither involved in aromaticity nor coordinated to a metal.

Figure 2:
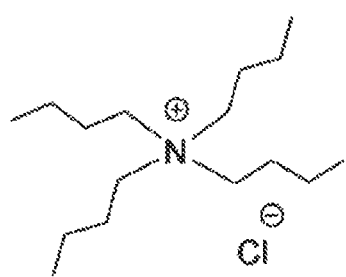
FIG. 2 is a drawing showing the structural formulas of TBAC and Ir(ppy)$_3$ for explaining the ways of bonding of the nitrogen atom.
Figure 2:
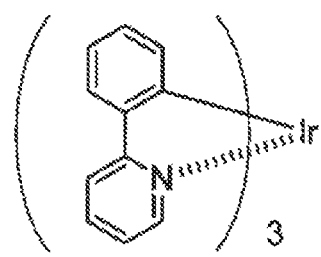

Furthermore, a nitrogen atom can create the fourth bond by utilizing the non-covalent electron pairs. An example of this case will be explained by using FIG. 2. FIG. 2 shows the structural formula of the tetrabutylammoniumchloride (TBAC) and the structural formula of tris(2-phenylpyridine)iridium(III) [Ir(ppy)$_3$].

Of these, TBAC is a quaternary ammonium salt in which one of four butyl groups is ionically bonded to a nitrogen atom, and which has a chloride ion as a counterion. In this case, one of the electrons that constitute the non-covalent electron pair of the nitrogen atom is provided to the ionic bonding with the butyl groups. Therefore, the nitrogen atom of TBAC is equivalent to a state in which the non-covalent electron pair is originally absent. Accordingly, the non-covalent electron pair of the nitrogen atom that constitutes TBAC does not fall within [effective non-covalent electron pair] that is neither involved in aromaticity nor coordinated to a metal.

Furthermore, Ir(ppy)$_3$ is a neutral metal complex in which an iridium atom and a nitrogen atom are bonded through coordinate bonding. The non-covalent electron pair of the nitrogen atom constituting this Ir(ppy)$_3$ is coordinated to the iridium atom, and thus are utilized in the coordinate bonding. Accordingly, the non-covalent electron pair of the nitrogen atom that constitutes Ir(ppy)$_3$ also does not fall within [effective non-covalent electron pair] that is neither involved in aromaticity nor coordinated to a metal.

Furthermore, a nitrogen atom is a common hetero atom that can constitute an aromatic ring, and can contribute to the exhibition of aromaticity. Examples of the "nitrogen-containing aromatic ring" include a pyridine ring, a pyrazine ring, a pyrimidine ring, a triazine ring, a pyrrole ring, an imidazole ring, a pyrazole ring, a triazole ring, a tetrazole ring and the like.

Figure 3:
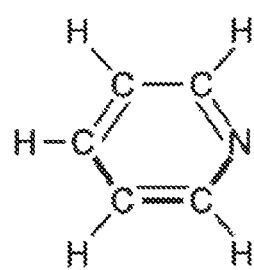
FIG. 3 is a drawing showing the structural formula and molecular orbitals of a pyridine ring.
Figure 3:
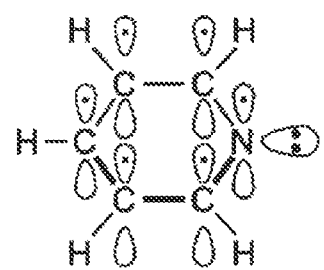

FIG. 3 is a drawing showing the structural formula and molecular orbitals of a pyridine ring, which is one of the groups exemplified above. As shown in FIG. 3, since the pyridine ring has six delocalized π electrons in a conjugated (resonance) unsaturated ring structure disposed in a 6-membered ring form, the pyridine ring satisfies the Huckel's law of 4n+2 (n=0 or a natural number). Since the nitrogen atom in the six-membered ring has replaced —CH=, only one unpaired electron contributes to the 6π electron system, and the non-covalent electron pair is not essential for exhibiting aromaticity.

Accordingly, the non-covalent electron pair of the nitrogen atom that constitutes the pyridine ring falls within [effective non-covalent electron pair] that is neither involved in aromaticity nor coordinated to a metal.

Figure 4:
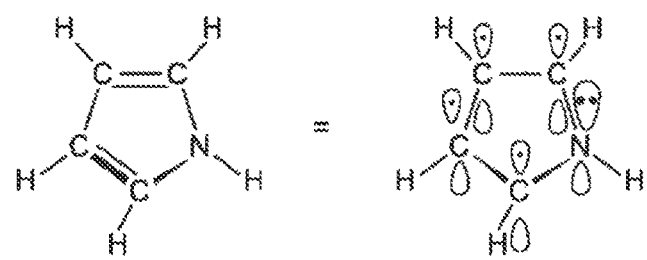
FIG. 4 is a drawing showing the structural formula and molecular orbitals of a pyrrole ring.

FIG. 4 is a drawing showing the structural formula and molecular orbitals of a pyrrole ring. As shown in FIG. 4, the pyrrole ring has a structure in which one of carbon atoms that constitute a five-membered ring is substituted with a nitrogen atom, but the number of the π electrons is still 6, and thus the pyrrole ring is a nitrogen-containing aromatic ring that satisfies the Huckel's law. Since the nitrogen atom in the pyrrole ring is also bonded to a hydrogen atom, the non-covalent electron pairs contribute to the 6π electron system.

Accordingly, although the nitrogen atom of the pyrrole ring has a non-covalent electron pair, this non-covalent electron pair is essentially utilized for exhibiting aromaticity, and thus does not fall within [effective non-covalent electron pair] that is not involved in aromaticity and coordinates to a metal.

Figure 5:
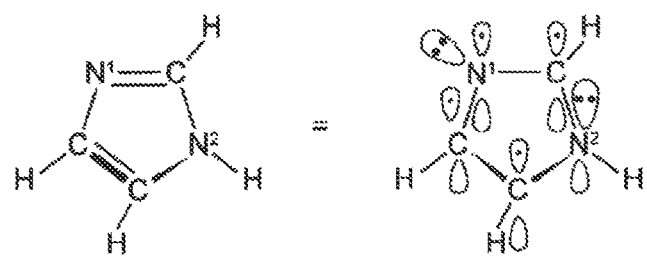
FIG. 5 is a drawing showing the structural formula and molecular orbitals of an imidazole ring.

FIG. 5 is a drawing showing the structural formula and molecular orbitals of an imidazole ring. As shown in FIG. 5, the imidazole ring has a structure in which two nitrogen atoms $N^1$ and $N^2$ replace the 1- and 3-positions in a five-membered ring, and is also a nitrogen-containing aromatic ring having still six π electrons. Of which one nitrogen atom $N^1$ is a pyridine ring-type nitrogen atom in which only one unpaired electron contributes to the 6π electron system and the non-covalent electron pair is not used for expressing aromaticity, and thus the non-covalent electron pair of the nitrogen atom $N^1$ falls within [effective non-covalent electron pair]. In response to this, the other nitrogen atom $N^2$ is a pyrrole ring type nitrogen atom having the non-covalent electron pair contributing to the 6π electron system, and thus the non-covalent electron pair of this nitrogen atom $N^2$ does not fall within [effective non-covalent electron pair].

Accordingly, in an imidazole ring, only one of the nitrogen atom $N^1$ from the two nitrogen atoms $N^1$ and $N^2$ that constitute the imidazole ring falls within [effective non-covalent electron pair].

The selection of the non-covalent electron pair in the nitrogen atom of "nitrogen-containing aromatic ring" as mentioned above is similarly applied to the cases of condensed ring compounds having a nitrogen-containing aromatic ring backbone.

Figure 6:
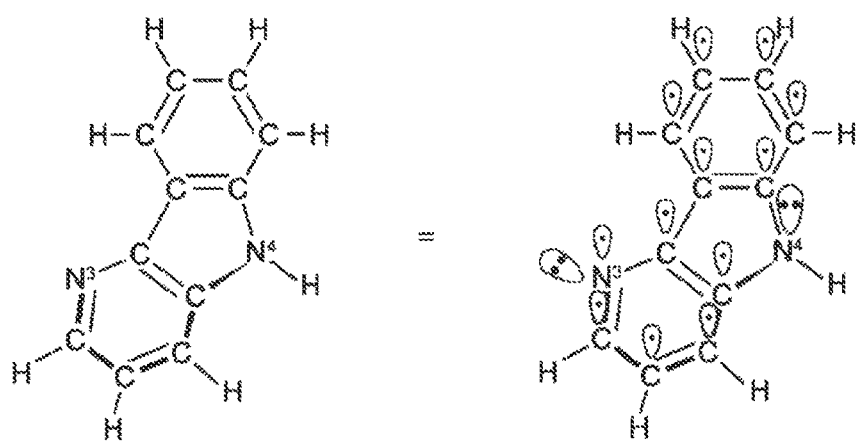
FIG. 6 is a drawing showing the structural formula and molecular orbitals of a δ-carboline ring.

FIG. 6 is a drawing showing the structural formula and molecular orbitals of a δ-carboline ring. As shown in FIG. 6, the δ-carboline ring is a condensed ring compound having a nitrogen-containing aromatic ring backbone, and is azacarbazole compound in which a benzene ring backbone, a pyrrole ring backbone and a pyridine ring backbone are condensed in this order. Of these, the nitrogen atom $N^3$ of the pyridine ring mobilizes only one unpaired electron for the π electron system, the nitrogen atom $N^4$ of the pyrrole ring has a non-covalent electron pair contributing to the π electron system. These three electrons and eleven π electrons from the carbon atom that form the rings constitute total 14π electrons of the aromatic rings.

Accordingly, among the two nitrogen atoms $N^3$ and $N^4$ of the δ-carboline ring, the non-covalent electron pair of the nitrogen atom $N^3$ that constitutes the pyridine ring falls within [effective non-covalent electron pair], whereas the non-covalent electron pair of the nitrogen atom $N^4$ that constitutes the pyrrole ring does not fall within [effective non-covalent electron pair].

By this way, the non-covalent electron pair of the nitrogen atom that constitutes the condensed ring compound is involved in the bonding in the condensed ring compound, in a similar manner to the bonding in monocyclic compounds that constitute a condensed ring compound such as a pyridine ring and a pyrrole ring.

Furthermore, [effective non-covalent electron pair] explained above is important so as to express a strong interaction with silver, which is the main component of the electrode layer 1b. The nitrogen atom having such [effective non-covalent electron pair] is preferably a nitrogen atom in nitrogen-containing aromatic ring from the viewpoints of stability and durability. Accordingly, it is preferable that the compound contained in the nitrogen-containing layer 1a has an aromatic hetero ring containing a nitrogen atom having [effective non-covalent electron pair] as a hetero atom.

Specifically, in the present exemplary embodiment, the number n of [effective non-covalent electron pairs] with respect to the molecular weight M of such a compound is defined as, for example, an effective non-covalent electron pair content rate [n/M]. Furthermore, the nitrogen-containing layer 1a is characterized by being constituted by using a compound that is selected so that this [n/M] is $2.0 \times 10^{-3} \leq$ [n/M]. Furthermore, the nitrogen-containing layer 1a has an effective non-covalent electron pair content rate [n/M] defined as above of, preferably in the range of $3.9 \times 10^{-3} \leq$ [n/M], more preferably in the range of $6.5 \times 10^{-3} \leq$ [n/M].

Furthermore, the nitrogen-containing layer 1a may be constituted by using a compound having an effective non-covalent electron pair content rate [n/M] in the above-mentioned predetermined range, and may be constituted by only such compound, or may be constituted by using such a compound by mixing with other compound. The other compound may be a compound containing or being free from a nitrogen atom, and may have an effective non-covalent electron pair content rate [n/M] that is not in the above-mentioned predetermined range.

In the case when the nitrogen-containing layer 1a is constituted by using plural compounds, it is preferable that, for example, the molecular weight M of mixed compounds formed by mixing these compounds is obtained based on the mixing ratio of the compounds, the number n of the total of [effective non-covalent electron pairs] with respect to the molecular weight M is obtained as an average value of effective non-covalent electron pair content rates [n/M], and this value is in the above-mentioned predetermined range. In other words, it is preferable that the effective non-covalent electron pair content rate [n/M] of the nitrogen-containing layer 1a itself is in a predetermined range.

Meanwhile, in the case when the nitrogen-containing layer 1a is constituted by using plural compounds and has a constitution in which the mixing ratio (incorporation ratio) of the compounds differs in the film thickness direction, it is sufficient that the effective non-covalent electron pair content rate [n/M] at the interface of the nitrogen-containing layer 1a with the side in contact with the electrode layer 1b is in a predetermined range.

[Compound I]

As the compound that constitutes the nitrogen-containing layer 1a, specific examples of compounds (No. 1 to No. 48) in which the above-mentioned effective non-covalent electron pair content rate [n/M] satisfies $2.0\times10^{-3}\leq[n/M]$ will be shown below. In the respective Compounds No. 1 to No. 48, the nitrogen atoms having [effective non-covalent electron pairs] are circled. Furthermore, the following Table 1 shows the molecular weights M, the numbers n of [effective non-covalent electron pairs] and the effective non-covalent electron pair content rates [n/M] of these Compounds Nos. 1 to 48. In the copper phthalocyanine of the following compound 33, the non-covalent electron pairs that are not coordinated to the copper among the non-covalent electron pairs of the nitrogen atoms are counted as [effective non-covalent electron pairs].

[Chemical Formula 14]

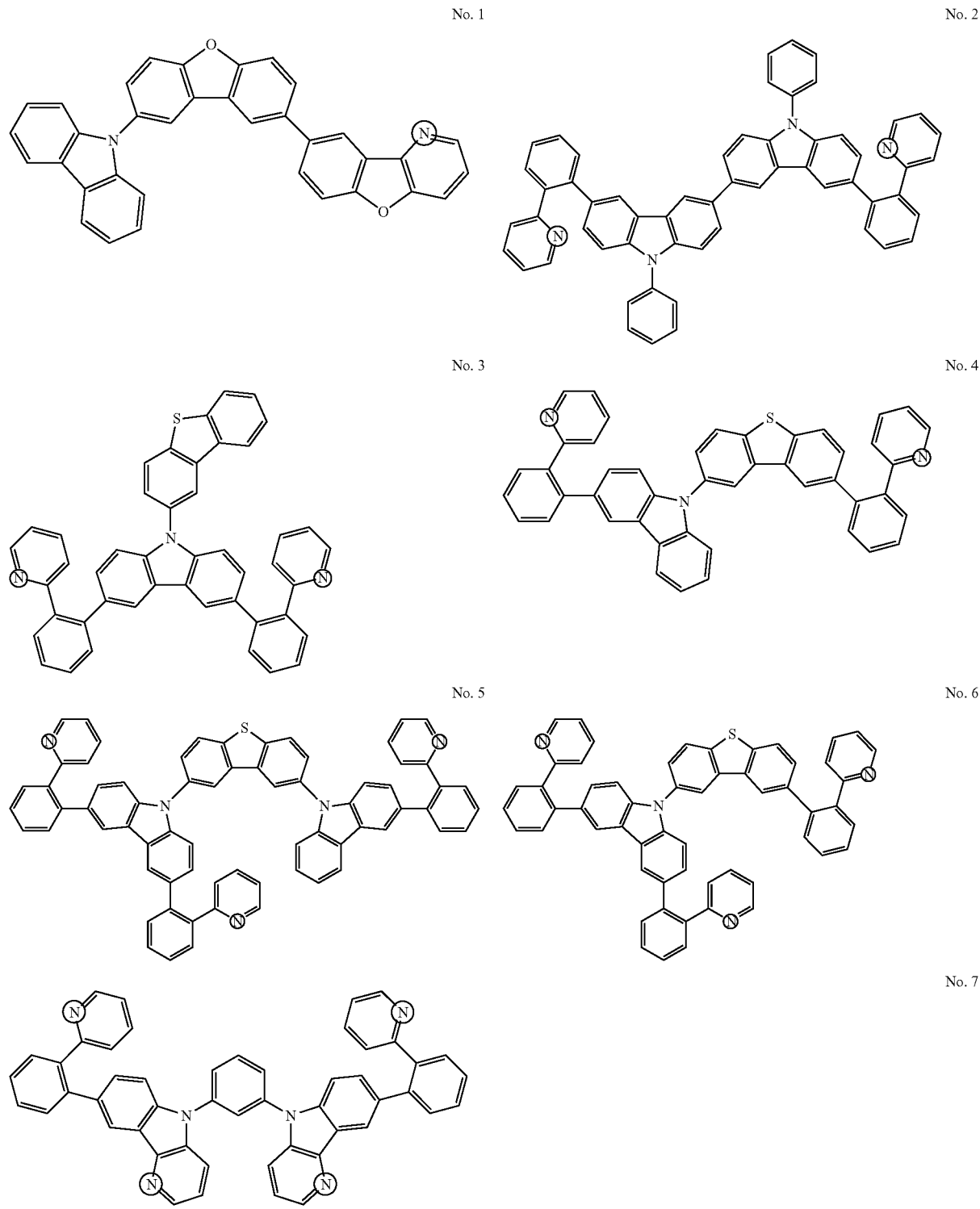

[Chemical Formula 15]
No. 8
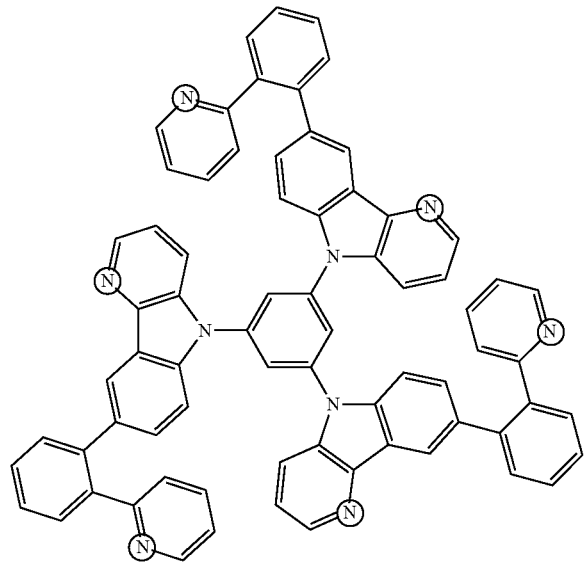
No. 9
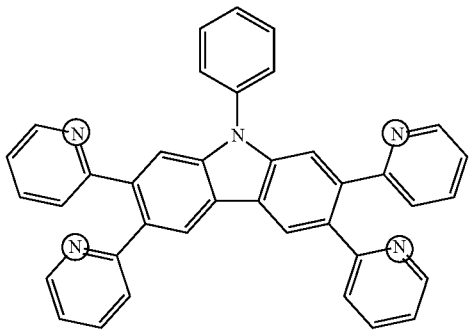
No. 10
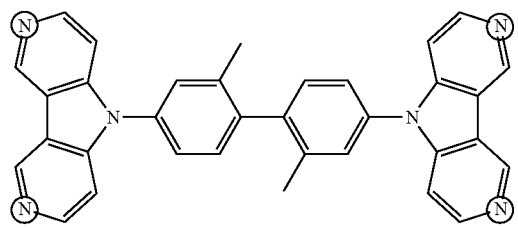
No. 11
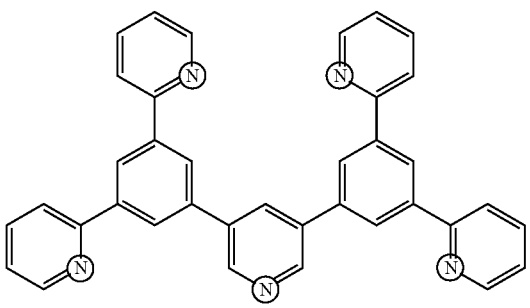
No. 12
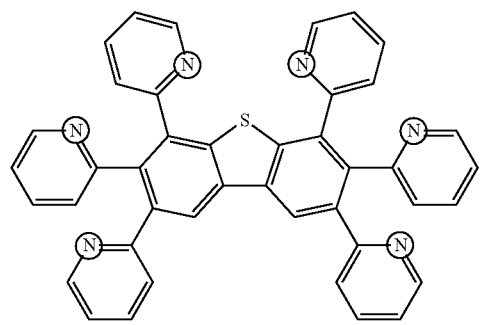
No. 13
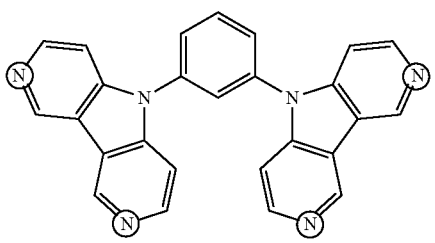
No. 14
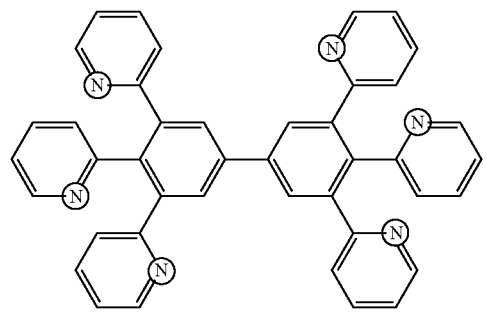
No. 15
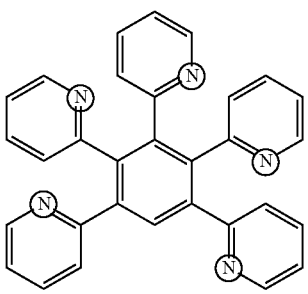

-continued
No. 16
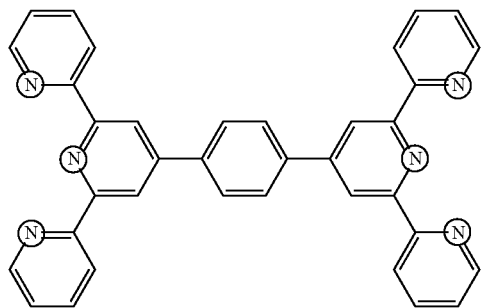
[Chemical Formula 16]
No. 17
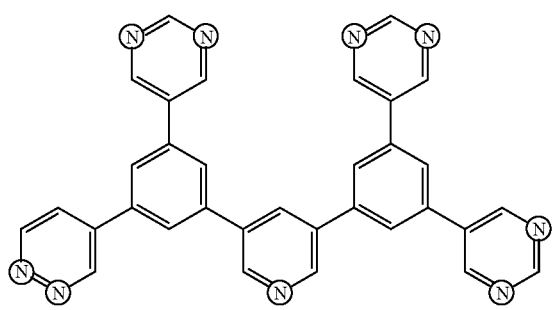
No. 18
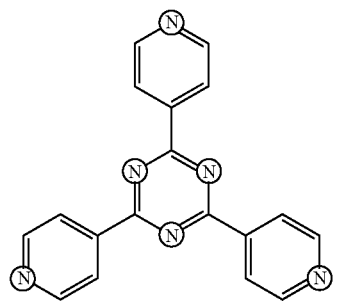
No. 19
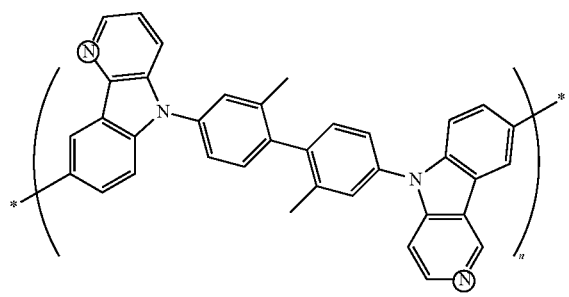
No. 20
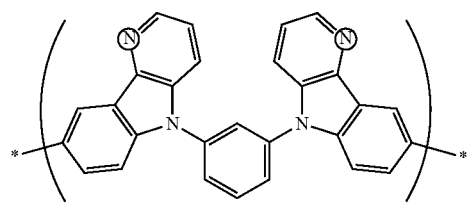
No. 21
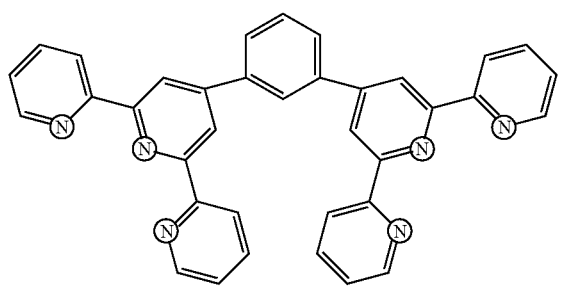
No. 22
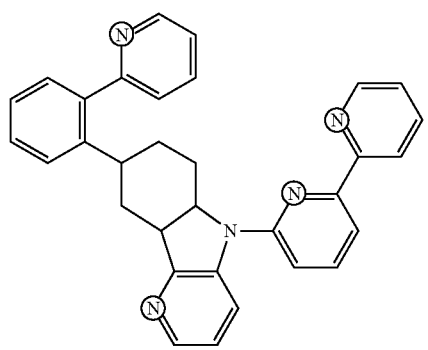
No. 23
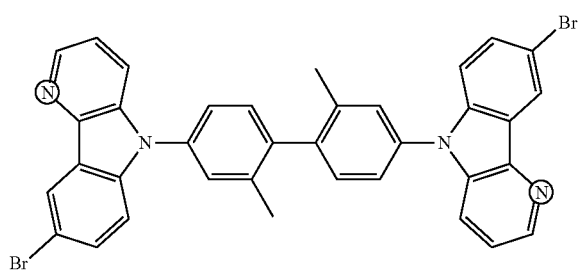

-continued
No. 24
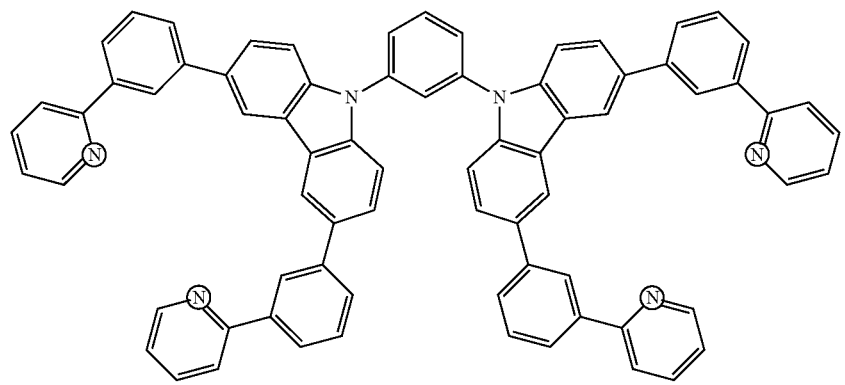
No. 25
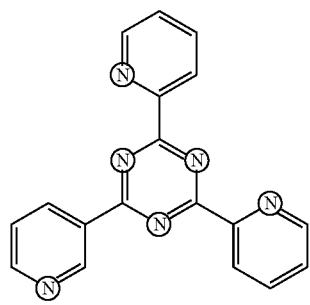
[Chemical Formula 17]
No. 26
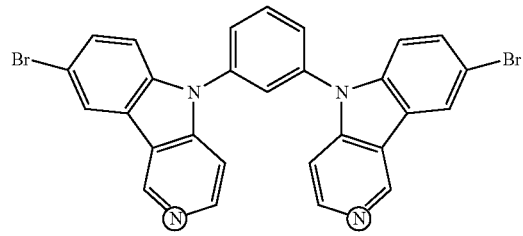
No. 27
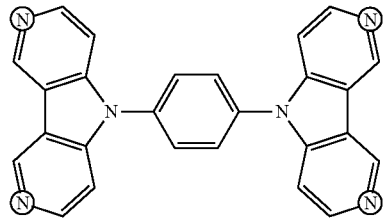
No. 28
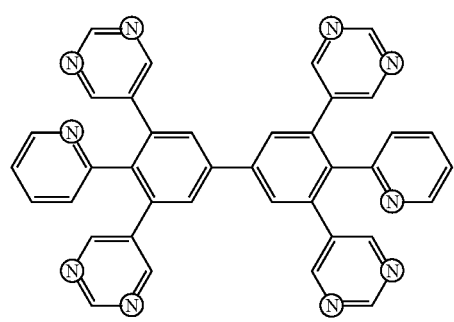
No. 29
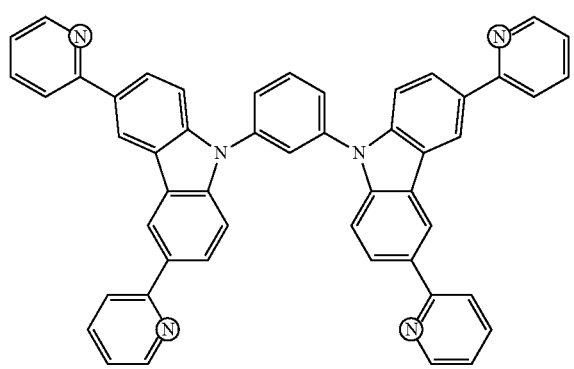
No. 30
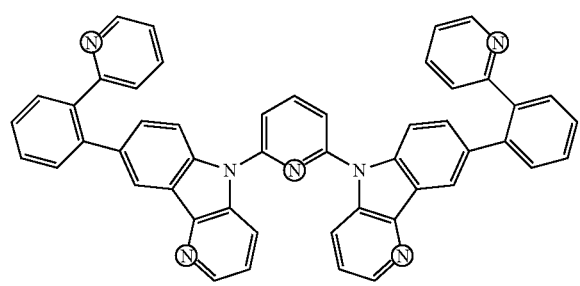
No. 31
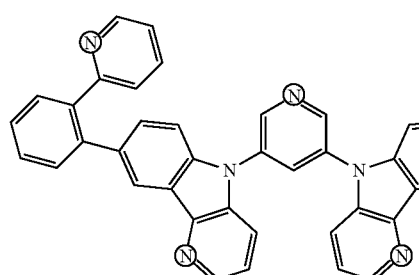

-continued
No. 32
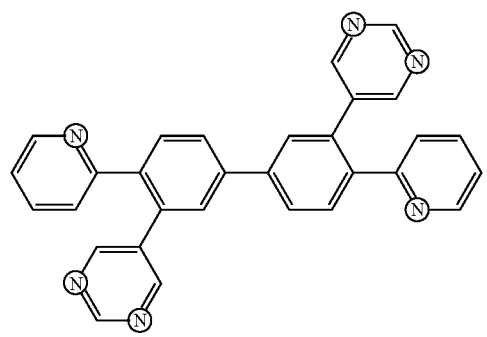
No. 33
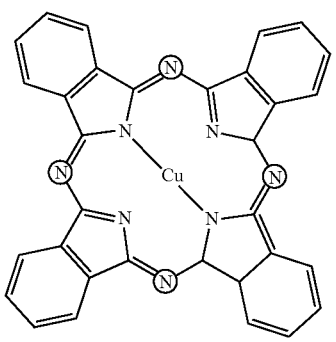
No. 34
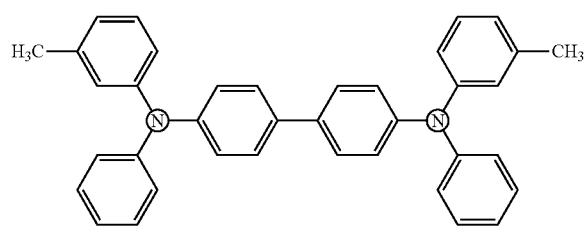
No. 35
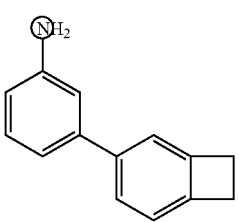
[Chemical Formula 18]
No. 36
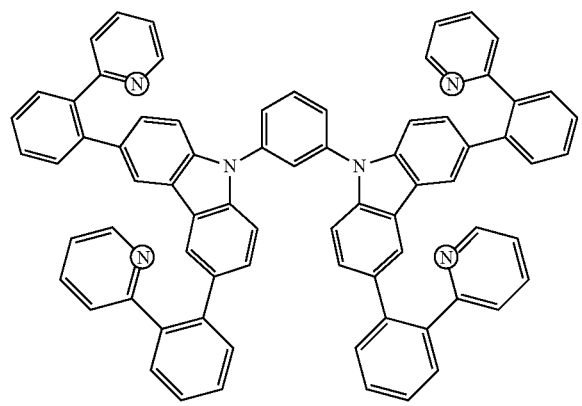
No. 37
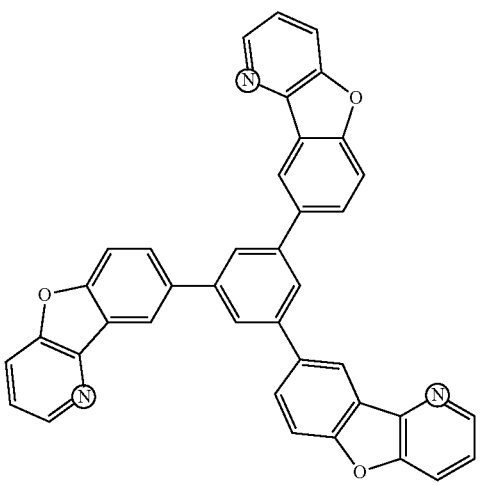
No. 38
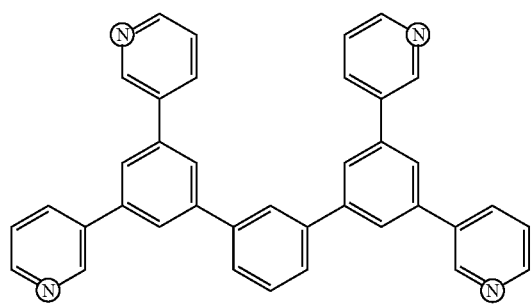
No. 39
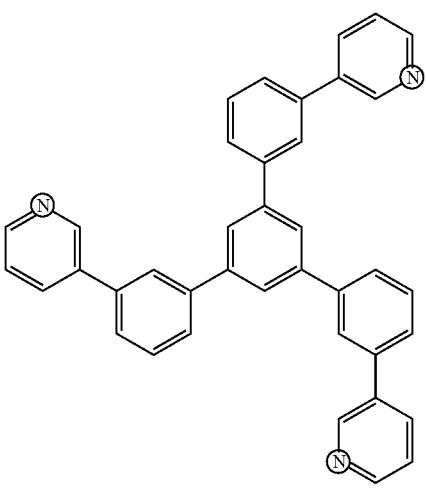

No. 40
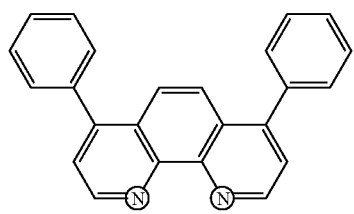
No. 41
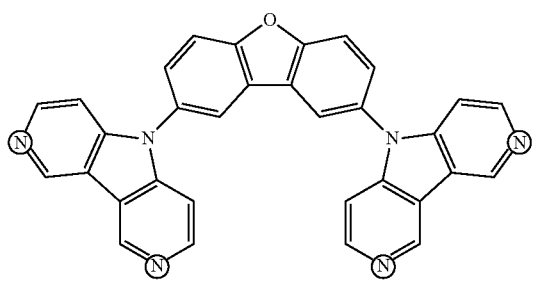
[Chemical Formula 19]
No. 42
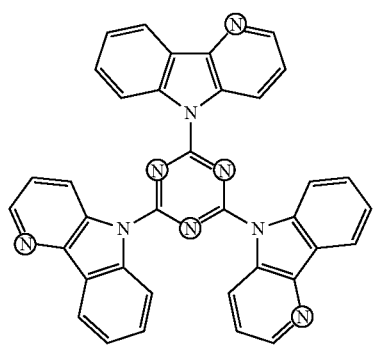
No. 43
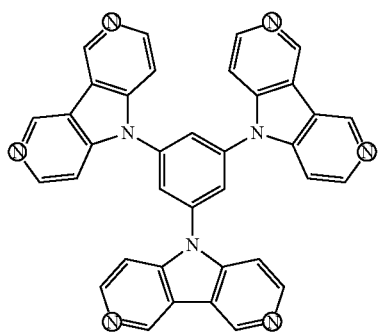
No. 44
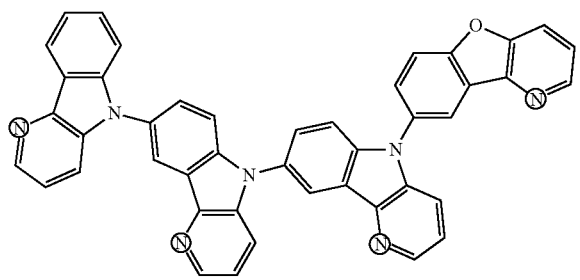
No. 45
No. 46
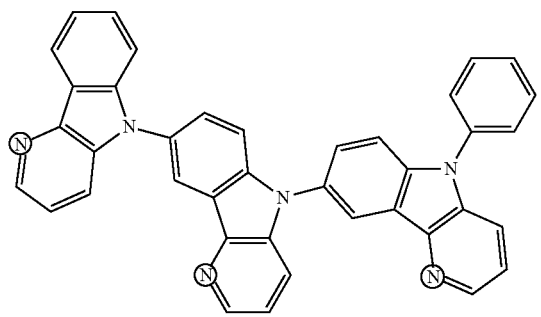
No. 47
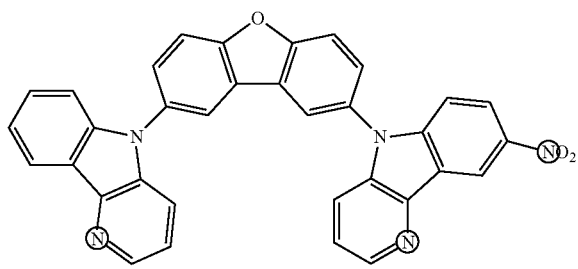

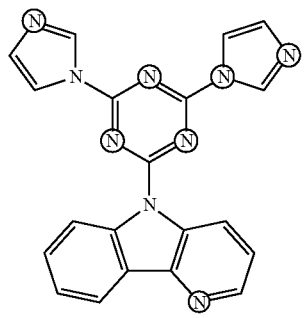

No. 48

TABLE 1

| Compound | Number [n] of effective non-covalent electron pairs | Molecular weight [M] | [n/M] | Corresponding general formula |
|---|---|---|---|---|
| No. 1 | 1 | 500.55 | 2.0E−03 | (1b) |
| No. 2 | 2 | 790.95 | 2.5E−03 | |
| No. 3 | 2 | 655.81 | 3.0E−03 | |
| No. 4 | 2 | 655.81 | 3.0E−03 | |
| No. 5 | 3 | 974.18 | 3.1E−03 | (2) |
| No. 6 | 3 | 808.99 | 3.7E−03 | |
| No. 7 | 4 | 716.83 | 5.6E−03 | (1a-1), (2) |
| No. 8 | 6 | 1036.19 | 5.8E−03 | (1a-1), (4) |
| No. 9 | 4 | 551.64 | 7.3E−03 | |
| No. 10 | 4 | 516.60 | 7.7E−03 | (1a-2), (3) |
| No. 11 | 5 | 539.63 | 9.3E−03 | |
| No. 12 | 6 | 646.76 | 9.3E−03 | (5) |
| No. 13 | 4 | 412.45 | 9.7E−03 | (1a-2), (3) |
| No. 14 | 6 | 616.71 | 9.7E−03 | (5) |
| No. 15 | 5 | 463.53 | 1.1E−02 | (2) |
| No. 16 | 6 | 540.62 | 1.1E−02 | (6) |
| No. 17 | 9 | 543.58 | 1.7E−02 | |
| No. 18 | 6 | 312.33 | 1.9E−02 | |
| No. 19 | 2 | 512.60 | 3.9E−03 | (1a-1) |
| No. 20 | 2 | 408.45 | 4.9E−03 | (1a-1) |
| No. 21 | 6 | 540.62 | 1.1E−02 | (6) |
| No. 22 | 4 | 475.54 | 8.4E−03 | (1a-1) |
| No. 23 | 2 | 672.41 | 3.0E−03 | (1a-1) |
| No. 24 | 4 | 1021.21 | 3.9E−03 | |
| No. 25 | 6 | 312.33 | 1.9E−02 | (6) |
| No. 26 | 2 | 568.26 | 3.5E−03 | (1a) |
| No. 27 | 4 | 412.45 | 9.7E−03 | (1a-2), (3) |
| No. 28 | 10 | 620.66 | 1.6E−02 | (5) |
| No. 29 | 4 | 716.83 | 5.6E−03 | |
| No. 30 | 5 | 717.82 | 7.0E−03 | (1a-1), (2) |
| No. 31 | 5 | 717.82 | 7.0E−03 | (1a-1), (2) |
| No. 32 | 6 | 464.52 | 1.3E−02 | |
| No. 33 | 4 | 576.10 | 6.9E−03 | |
| No. 34 | 2 | 516.67 | 3.9E−03 | |
| No. 35 | 1 | 195.26 | 5.1E−03 | |
| No. 36 | 4 | 1021.21 | 3.9E−03 | (2) |
| No. 37 | 3 | 579.60 | 5.2E−03 | (1b) |
| No. 38 | 4 | 538.64 | 7.4E−03 | |
| No. 39 | 3 | 537.65 | 5.6E−03 | |
| No. 40 | 2 | 332.40 | 6.0E−03 | |
| No. 41 | 4 | 502.15 | 8.0E−03 | (1a-2), (3) |
| No. 42 | 6 | 579.19 | 1.0E−02 | (1a-1) |
| No. 43 | 3 | 653.22 | 4.6E−03 | (1a-1) |
| No. 44 | 4 | 667.21 | 6.0E−03 | (1a-1), (1b) |
| No. 45 | 6 | 579.19 | 1.0E−02 | (1a-2), (3) |
| No. 46 | 3 | 576.65 | 5.2E−03 | (1a-1) |
| No. 47 | 3 | 545.55 | 5.5E−03 | (1a-1) |
| No. 48 | 6 | 379.38 | 1.6E−02 | (1a-2), (7), (8a) |

In addition, the above-mentioned Table 1 shows the corresponding formulas in the cases when these exemplary compounds also belong to the general formulas (1) to (8a), which represent the other compounds that are explained below.

[Compound II]

Furthermore, as the compound that constitutes the nitrogen-containing layer 1a, in addition to the compounds having an effective non-covalent electron pair content rate [n/M] in the above-mentioned predetermined range as mentioned above, other compounds may also be used. As the other compounds used in the nitrogen-containing layer 1a, nitrogen atom-containing compounds are preferably used irrespective of whether or not the effective non-covalent electron pair content rate [n/M] is in the above-mentioned predetermined range. Among these, compounds containing nitrogen atoms having [effective non-covalent electron pairs] are specifically preferably used. Furthermore, as the other compound used in the nitrogen-containing layer 1a, a compound having a property that is required for each electronic device to which the transparent electrode 1 having this nitrogen-containing layer 1a is applied is used. For example, in the case when this transparent electrode 1 is used as an electrode for an organic electroluminescent element, as the compound for constituting the nitrogen-containing layer 1a, compounds having the structures represented by the general formulas (1) to (8a) explained below are preferably used from the viewpoints of their film formability and electron transporting property.

These compounds having the structures represented by the general formulas (1) to (8a) also include compounds that fall within the above-mentioned range of the effective non-covalent electron pair content rate [n/M], and any of such compounds can be used singly as the compound for constituting the nitrogen-containing layer 1a (see the above-mentioned Table 1). On the other hand, if the compounds having the structures represented by the following general formulas (1) to (8a) are compounds that do not fall within the above-mentioned range of the effective non-covalent electron pair content rate [n/M], they can be used as the compounds for constituting the nitrogen-containing layer 1a by being mixed with a compound having an effective non-covalent electron pair content rate [n/M] in the above-mentioned range.

[Chemical Formula 20]

General formula (1)

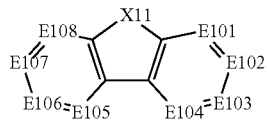

X11 in the above-mentioned general formula (1) represents —N(R11)- or —O—. Furthermore, E101 to E108 in the general formula (1) each represent —C(R12)= or —N=. At least one of E101 to E108 is —N=. The above-mentioned R11 and R12 each represent a hydrogen atom (H) or a substituent.

Examples of this substituent include alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group and the like), cycloalkyl groups (for example, a cyclopentyl group, a cyclohexyl group and the like), alkenyl groups (for example, a vinyl group, an allyl group and the like), alkynyl groups (for example, an ethynyl group, a propargyl group and the like), aromatic hydrocarbon groups (also referred to as aromatic carbon ring groups, aryl groups and the like, and examples include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group), aromatic hetero ring groups (for example, a furyl group, a thienyl group, a pyridyl group, a pyridadinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (this shows a group in which any one carbon atom of the carbon atoms constituting the carboline ring in the above-mentioned carbolinyl group is replaced with a nitrogen atom), a phthalazinyl group and the like), hetero ring groups (for example, a pyrrolidyl group, an imidazolidyl group, a morpholyl group, an oxazolidyl group and the like), alkoxy groups (for example, a methoxy group, an ethoxy group, a propyloxy group, a pentyloxy group, a hexyloxy group, an octyloxy group, a dodecyloxy group and the like), cycloalkoxy groups (for example, a cyclopentyloxy group, a cyclohexyloxy group and the like), aryloxy groups (for example, a phenoxy group, a naphthyloxy group and the like), alkylthio groups (for example, a methylthio group, an ethylthio group, a propylthio group, a pentylthio group, a hexylthio group, an octylthio group, a dodecylthio group and the like), cycloalkylthio groups (for example, a cyclopentylthio group, a cyclohexylthio group and the like), arylthio groups (for example, a phenylthio group, a naphthylthio group and the like), alkoxycarbonyl groups (for example, a methyloxycarbonyl group, an ethyloxycarbonyl group, a butyloxycarbonyl group, an octyloxycarbonyl group, a dodecyloxycarbonyl group and the like), aryloxycarbonyl groups (for example, a phenyloxycarbonyl group, a naphthyloxycarbonyl group and the like), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group and the like), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group and the like), acyloxy groups (for example, an acetyloxy group, an ethylcarbonyloxy group, a butylcarbonyloxy group, an octylcarbonyloxy group, a dodecylcarbonyloxy group, a phenylcarbonyloxy group and the like), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group and the like), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group and the like), ureido groups (for example, a methylureido group, an ethylureido group, a pentylureido group, a cyclohexylureido group, an octylureido group, a dodecylureido group, a phenylureido group, a naphthylureido group, a 2-pyridylaminoureido group and the like), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group and the like), alkylsulfonyl groups (for example, a methylsulfonyl group, an ethylsulfonyl group, a butylsulfonyl group, a cyclohexylsulfonyl group, a 2-ethylhexylsulfonyl group, a dodecylsulfonyl group and the like), arylsulfonyl groups or heteroarylsulfonyl groups (for example, a phenylsulfonyl group, a naphthylsulfonyl group, a 2-pyridylsulfonyl group and the like), amino groups (for example, an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a piperidyl group (also referred to as a piperidinyl group), a 2,2,6,6-tetramethylpiperidinyl group and the like), halogen atoms (for example, a fluorine atom, a chlorine atom, a bromine atom and the like), fluorohydrocarbon groups (for example, a fluoromethyl group, a trifluoromethyl group, a pentafluoroethyl group, a pentafluorophenyl group and the like), a cyano group, a nitro group, a hydroxy group, a mercapto group, a silyl group (for example, a trimethylsilyl group, a triisopropylsilyl group, a triphenylsilyl group, a phenyldiethylsilyl group and the like), phosphate ester group (for example, a dihexylphospholyl group and the like), phosphite ester groups (for example, a diphenylphosphinyl group and the like), phosphono groups and the like.

A part of these substituents may further be substituted with the above-mentioned substituents. Furthermore, a plurality of these substituents may bind to one another to form a ring. As these substituents, substituents that do not inhibit the interaction between the compound and silver (Ag) are preferably used, and substituents having nitrogen atom(s) having the above-mentioned effective non-covalent electron pair(s) are especially preferably applied. The above-mentioned descriptions relating to the substituents are also similarly applied to the substituents shown in the explanations of the general formulas (2) to (8a), which will be explained below.

The compound having a structure represented by the general formula (1) mentioned above is preferable since it can express a strong interaction between the nitrogen atom in the compound and the silver that constitutes the electrode layer 1b.

[Chemical Formula 21]

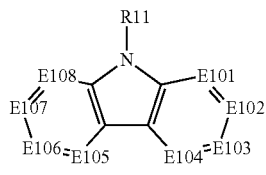

General formula (1a)

The compound having a structure represented by the above-mentioned general formula (1a) is an embodiment of the compound having a structure represented by the above-mentioned general formula (1), and is a compound wherein X11 in the general formula (1) is —N(R11)-. Such a compound is preferable since it can express the above-mentioned interaction more strongly.

[Chemical Formula 22]

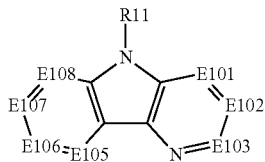

General formula (1a-1)

The compound having a structure represented by the above-mentioned general formula (1a-1) is an embodiment of compound having a structure represented by the above-mentioned general formula (1a), and is a compound wherein E104 in the general formula (1a) is —N═. Such a compound is preferable since it can express the above-mentioned interaction more effectively.

[Chemical Formula 23]

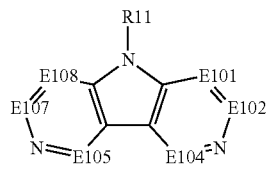

General formula (1a-2)

The compound having a structure represented by the above-mentioned general formula (1a-2) is another embodiment of the compound having a structure represented by the above-mentioned general formula (1a), and is a compound wherein E103 and E106 in the general formula (1a) are each —N═. Since such a compound has a larger number of nitrogen atoms, the compound can express the above-mentioned interaction more strongly, and thus is preferable.

[Chemical Formula 24]

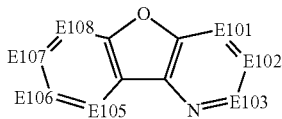

General Formula (1b)

The compound having a structure represented by the above-mentioned general formula (1b) is another embodiment of the compound having a structure represented by the above-mentioned general formula (1), and is a compound wherein X11 is —O— and E104 is —N═ in the general formula (1). Such a compound is preferable since it can express the above-mentioned interaction more effectively.

Furthermore, the compounds having structures represented by the general formulas (2) to (8a) are preferable since they can express the above-mentioned interaction more effectively.

[Chemical Formula 25]

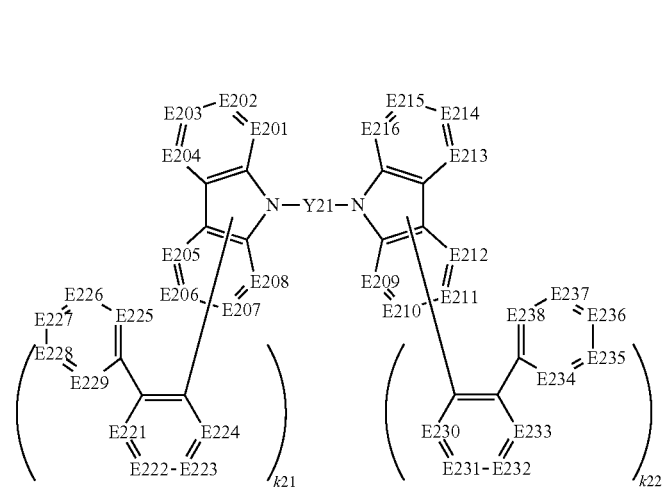

General Formula (2)

The above-mentioned general formula (2) is also an embodiment of the general formula (1). In the formula of the above-mentioned general formula (2), Y21 represents an arylene group, a heteroarylene group or a bivalent linking group formed of the combination thereof. E201 to E216 and E221 to E238 each represent —C(R21)= or —N=. R21 represents a hydrogen atom (H) or a substituent. However, at least one of E221 to E229 and at least one of E230 to E238 represent —N=. k21 and k22 each represent an integer of 0 to 4, wherein k21+k22 is an integer of 2 or more.

In the general formula (2), as the arylene group represented by Y21, for example, an o-phenylene group, a p-phenylene group, a naphthalenediyl group, an anthracenediyl group, a naphthacenediyl group, a pyrenediyl group, a naphthylnaphthalenediyl group, a biphenyldiyl group (for example, a [1,1'-biphenyl]-4,4'-diyl group, a 3,3'-biphenyldiyl group, a 3,6-biphenyldiyl group and the like), a terphenyldiyl group, a quaterphenyldiyl group, a quinquephenyldiyl group, a sexiphenyldiyl group, a septiphenyldiyl group, an octiphenyldiyl group, a nobiphenyldiyl group, a deciphenyldiyl group and the like are exemplified.

Furthermore, in the general formula (2), as the heteroarylene group represented by Y21, for example, bivalent groups derived from the group consisting of a carbazole ring, a carboline ring, a diazacarbazole ring (this is also referred to as a monoazacarboline ring, and shows a ring constitution in which one of the carbon atoms that constitute a carboline ring is replaced with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring and an indole ring, and the like.

As a preferable embodiment of the arylene group, the heteroarylene group or the bivalent linking group formed of a combination thereof represented by Y21, the heteroarylene group preferably includes a group derived from a condensed aromatic hetero ring in which the three or more rings are condensed. Furthermore, as the group derived from a condensed aromatic hetero ring in which three or more rings are condensed, a group derived from a dibenzofuran ring or a group derived from a dibenzothiophene ring is preferable.

In the general formula (2), it is preferable that 6 or more of E201 to E208, and 6 or more of E209 to E216 are each represented by —C(R21)=.

In the general formula (2), it is preferable that at least one of E225 to E229, and at least one of E234 to E238 each represent —N=.

Furthermore, in the general formula (2), it is preferable that any one of E225 to E229, and any one of E234 to E238 each represent —N=.

Furthermore, in the general formula (2), a preferable embodiment is such that E221 to E224 and E230 to E233 are each represented by —C(R21)=.

Furthermore, in the compound having a structure represented by the general formula (2), it is preferable that E203 is represented by —C(R21)=, wherein R21 represents a linking site, and it is further preferable that E211 is simultaneously represented by —C(R21)=, wherein R21 represents a linking site.

In addition, it is preferable that E225 and E234 are each represented by —N=, and it is preferable that E221 to E224 and E230 to E233 are each represented by —C(R21)=.

[Chemical Formula 26]

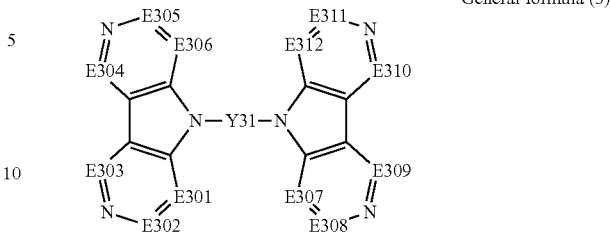

General formula (3)

The above-mentioned general formula (3) is also an embodiment of the general formula (1a-2). In the formula of the above-mentioned general formula (3), E301 to E312 each represent —C(R31)=, and R31 represents a hydrogen atom (H) or a substituent. Furthermore, Y31 represents an arylene group, a heteroarylene group or a bivalent linking group formed of the combination thereof.

Furthermore, in the general formula (3), preferable embodiments of the arylene group, the heteroarylene group or the bivalent linking group formed of the combination thereof represented by Y31 include those similar to Y21 in the general formula (2).

[Chemical Formula 27]

General formula (4)

The above-mentioned general formula (4) is also an embodiment of the general formula (1a-1). In the formula of the above-mentioned general formula (4), E401 to E414 each represent —C(R41)=, and R41 represents a hydrogen atom (H) or a substituent. Furthermore, Ar41 represents a substituted or unsubstituted aromatic hydrocarbon ring or aromatic hetero ring. Furthermore, k41 represents an integer of 3 or more.

Furthermore, in the case when Ar41 represents an aromatic hydrocarbon ring in the general formula (4), examples of the aromatic hydrocarbon ring include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthraanthrene ring and the like. These rings may further have substituents exemplified by R11 and R12 in the general formula (1).

Furthermore, in the case when Ar41 represents an aromatic hetero ring in the general formula (4), examples of the aromatic hetero ring include a furan ring, a thiophene ring, oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, a benzimidazole ring, a benzothiazole ring, a benzoxazole ring, a quinoxaline ring, a quinazoline ring, a phthalazine ring, a carbazole ring, an azacarbazole ring and the like. The azacarbazole ring means a group in which one or more of the carbon atom (s) of the benzene ring that constitutes a carbazole ring has/have been replaced with nitrogen atom (s). These rings may further have substituents exemplified by R11 and R12 in the general formula (1).

[Chemical Formula 28]

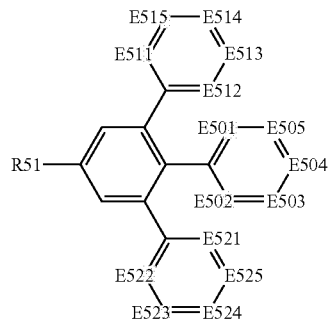

General formula (5)

In the formula of the above-mentioned general formula (5), R51 represents a substituent. E501, E502, E511 to E515, and E521 to E525 each represent —C(R52)= or —N=. E503 to E505 each represent —C(R52)=. R52 represents a hydrogen atom (H) or a substituent. At least one of E501 and E502 is —N=, at least one of E511 to E515 is —N=, and at least one of E521 to E525 is —N=.

[Chemical Formula 29]

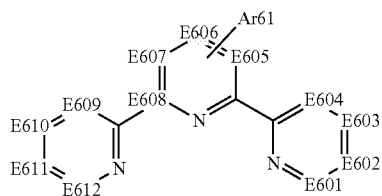

General formula (6)

In the formula of the above-mentioned general formula (6), E601 to E612 each represent —C(R61)= or —N=, and R61 represents a hydrogen atom (H) or a substituent. Furthermore, Ar61 represents a substituted or unsubstituted aromatic hydrocarbon ring or aromatic hetero ring.

Furthermore, in the general formula (6), the substituted or unsubstituted aromatic hydrocarbon ring or aromatic hetero ring represented by Ar61 includes those similar to Ar41 in the general formula (4).

[Chemical Formula 30]

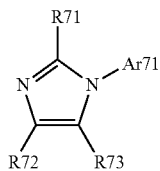

General Formula (7)

In the formula of the above-mentioned general formula (7), R71 to R73 each represent a hydrogen atom (H) or a substituent, and Ar71 represents an aromatic hydrocarbon ring group or an aromatic hetero ring group.

Furthermore, in the general formula (7), the aromatic hydrocarbon ring or aromatic hetero ring represented by Ar71 includes those similar to Ar41 in the general formula (4).

[Chemical Formula 31]

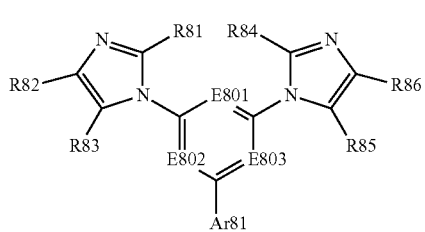

General formula (8)

The above-mentioned general formula (8) is also an embodiment of the general formula (7). In the formula of the above-mentioned general formula (8), R81 to R86 each represent a hydrogen atom (H) or a substituent. E801 to E803 each represent —C(R87)= or —N=, and R87 represents a hydrogen atom (H) or a substituent. Ar81 represents an aromatic hydrocarbon ring group or an aromatic hetero ring group.

Furthermore, in the general formula (8), the aromatic hydrocarbon ring or aromatic hetero ring represented by Ar81 includes those similar to Ar41 in the general formula (4).

[Chemical Formula 32]

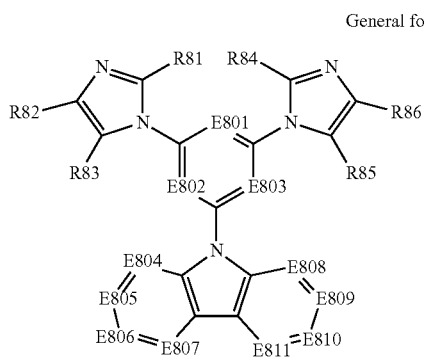

General formula (8a)

The compound having a structure represented by the above-mentioned general formula (8a) is an embodiment of the compound having a structure represented by the above-mentioned general formula (8), and Ar81 in the general formula (8) is a carbazole derivative. In the formula of the above-mentioned general formula (8a), E804 to E811 each represent —C(R88)= or —N=, and R88 represents a hydrogen atom (H) or a substituent. At least one of E808 to E811 is —N=, and each of E804 to E807 and E808 to E811 may bind to one another to form a new ring.

[Compound III]

Furthermore, as other compounds that constitute the nitrogen-containing layer 1a, in addition to the compounds having structures represented by the general formulas (1) to (8a) mentioned above, compounds 1 to 166, for which specific examples will be shown below, are exemplified. These compounds are compounds each containing nitrogen atom(s) that interact(s) with the silver that constitutes the electrode layer 1b. Furthermore, these compounds are materials having an electron transportability or electron injection property. Therefore, the transparent electrode 1 in which the nitrogen-containing layer 1a is constituted by using these compounds are preferable as transparent electrodes in organic electroluminescent elements, and the nitrogen-containing layer 1a can be used as an electron transport layer or an electron injection layer in an organic electroluminescent element. In addition, these compounds 1 to 166 also include compounds that fall within the above-mentioned range of the effective non-covalent electron pair content rate [n/M], and such compounds can be used singly as a compound for constituting the nitrogen-containing layer 1a. Furthermore, these Compounds 1 to 166 also include compounds that fall within the above-mentioned general formulas (1) to (8a).

[Chemical 33]

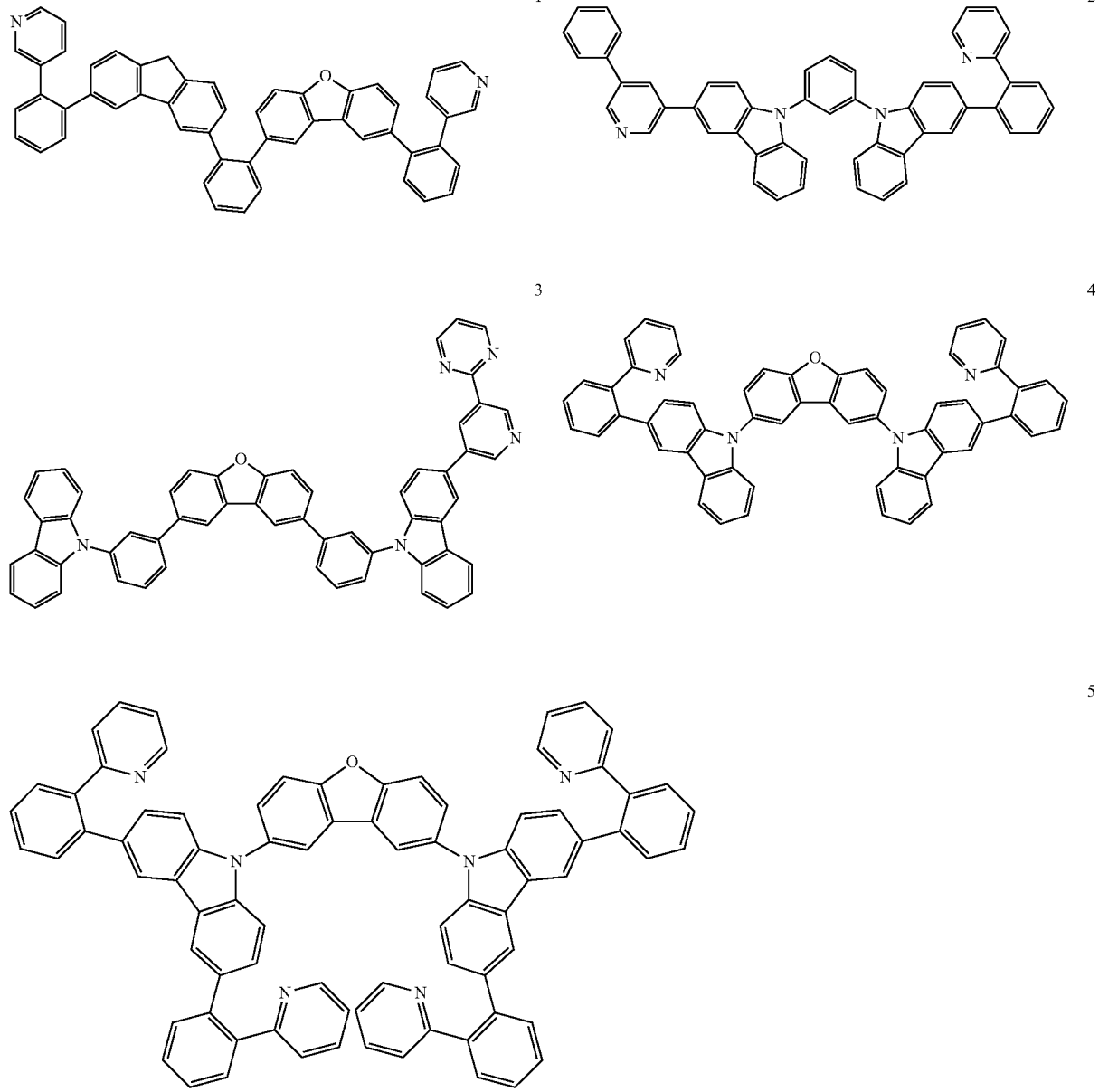

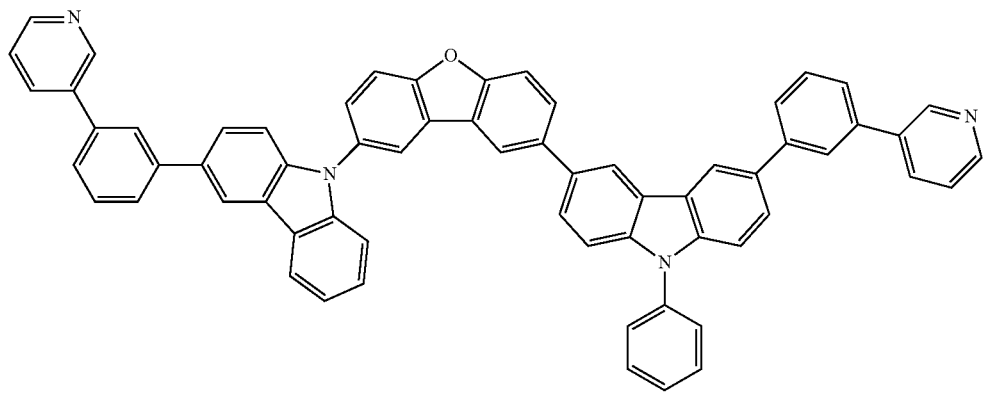
[Chemical Formula 34]
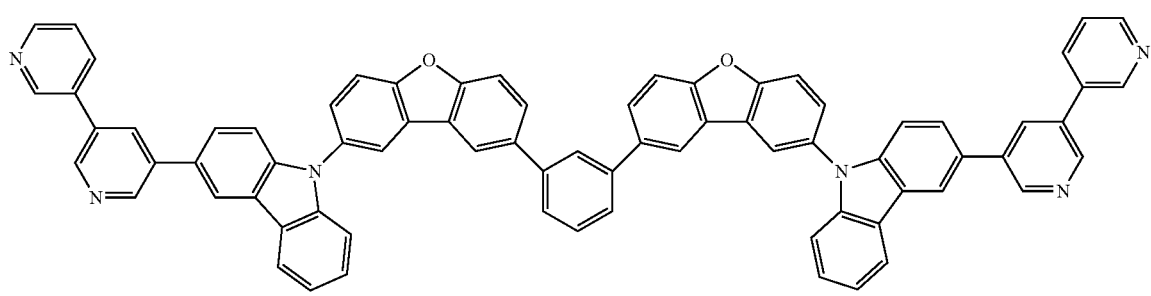
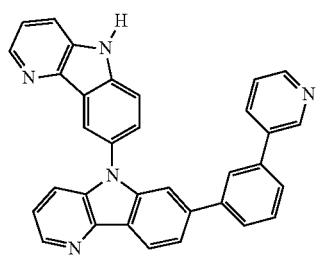
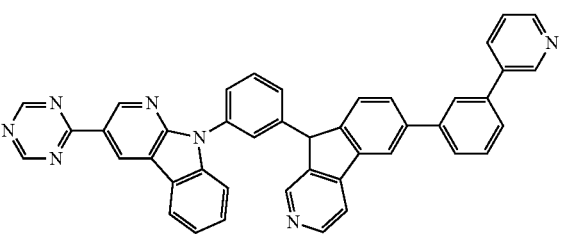
[Chemical Formula 35]
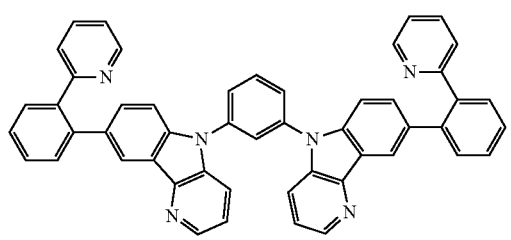
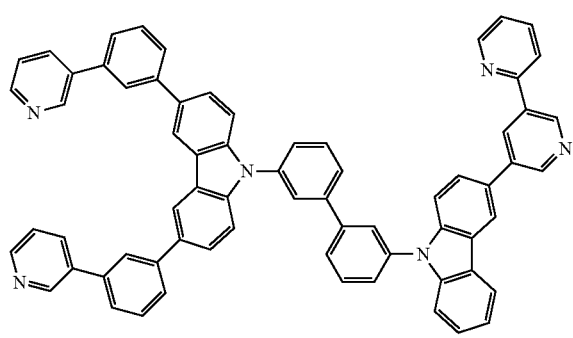
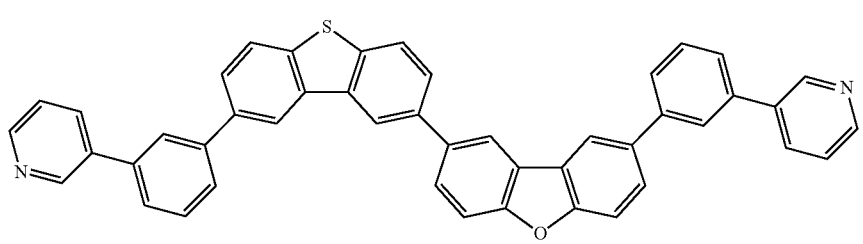

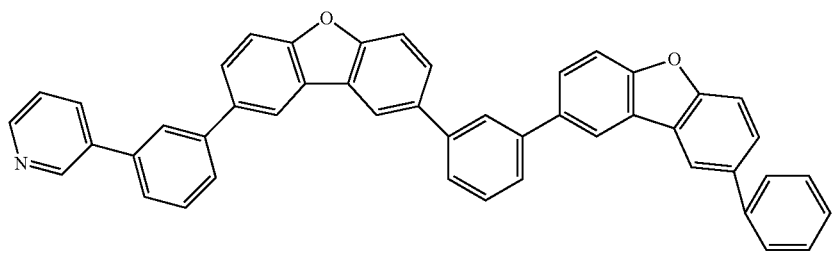
13
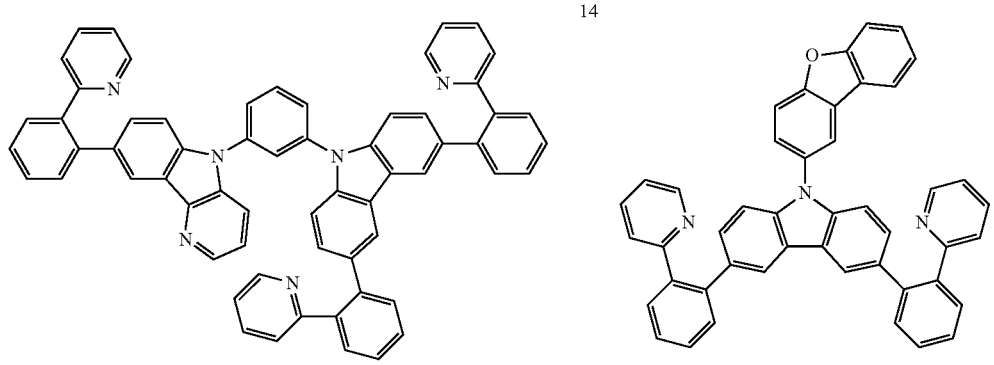
14
15
[Chemical Formula 36]
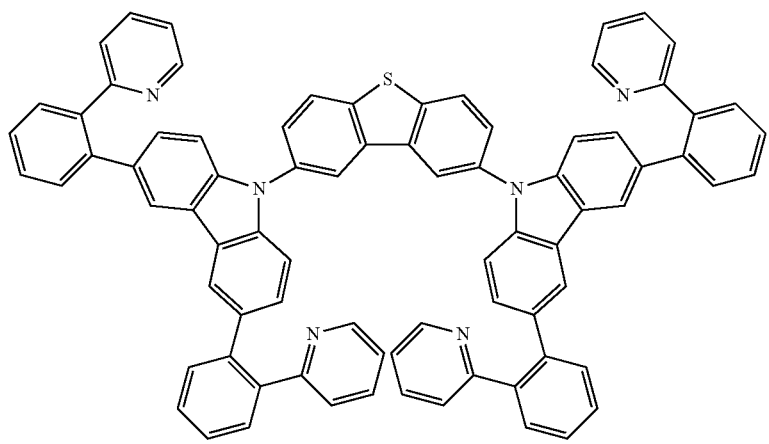
16
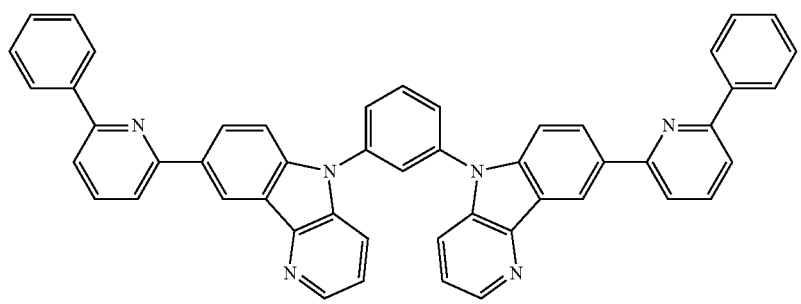
17

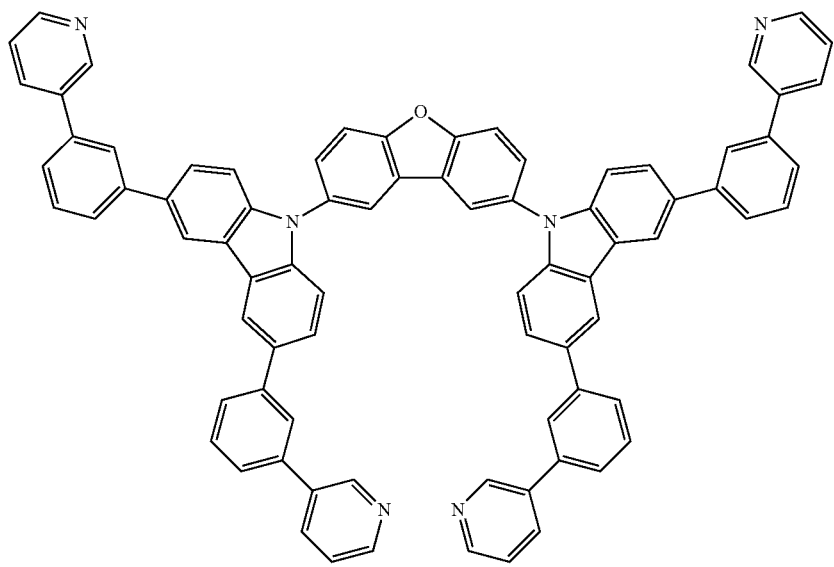
18
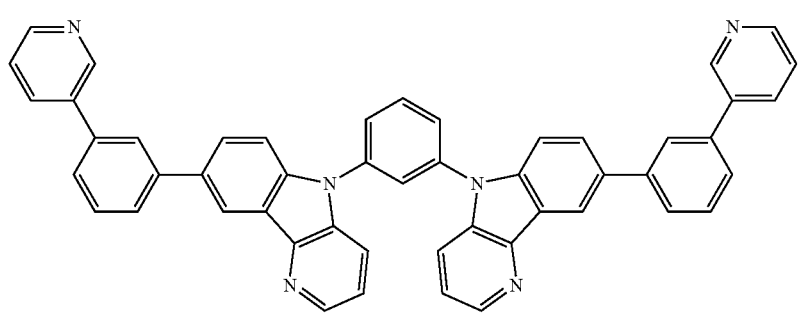
19
[Chemical Formula 37]
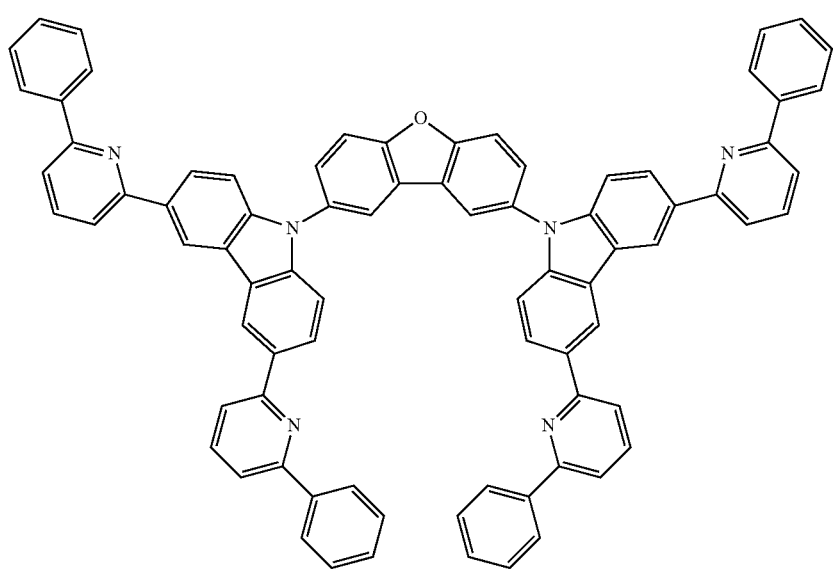
20

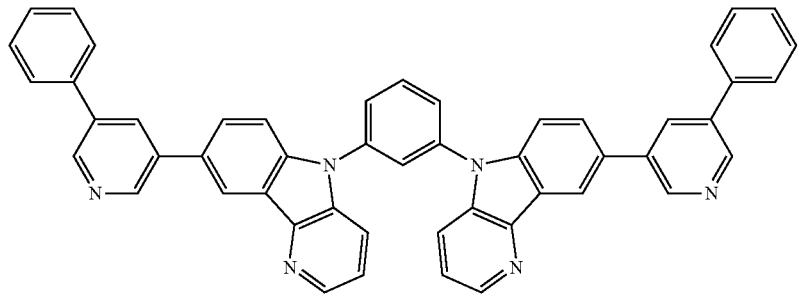
21
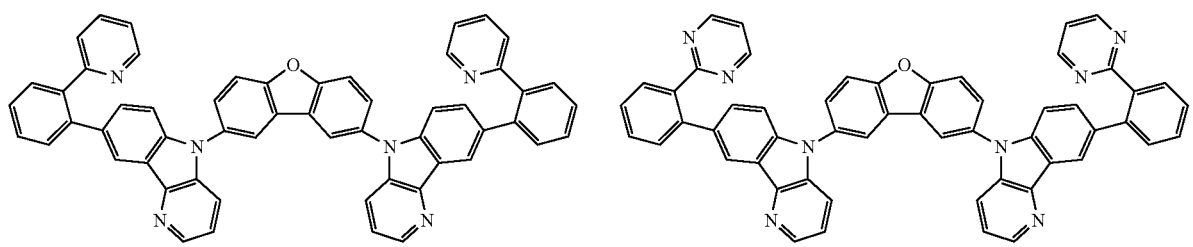
22 23
[Chemical Formula 38]
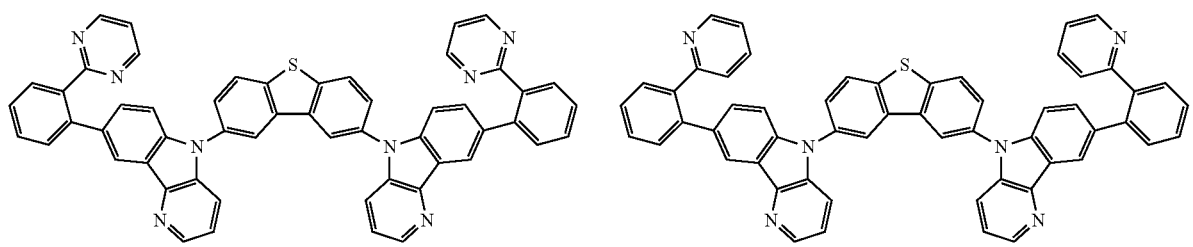
24 25
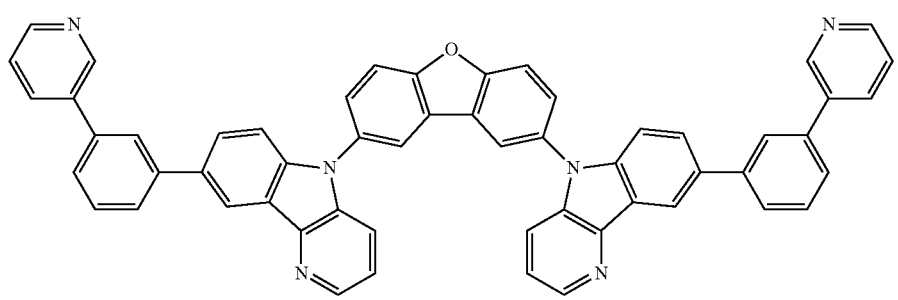
26
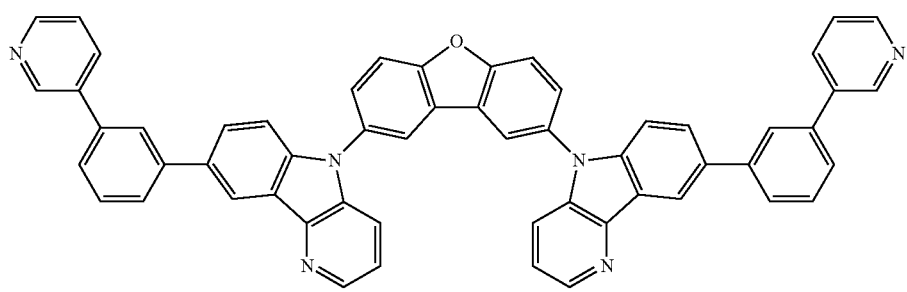
27

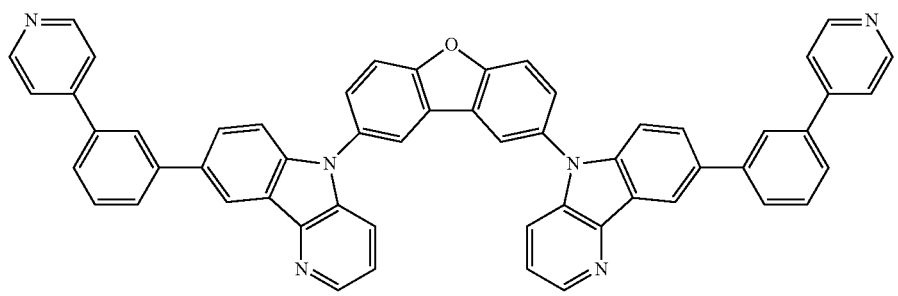
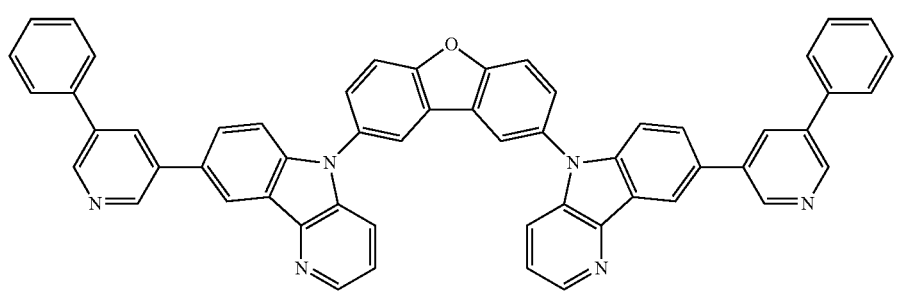
[Chemical Formula 39]
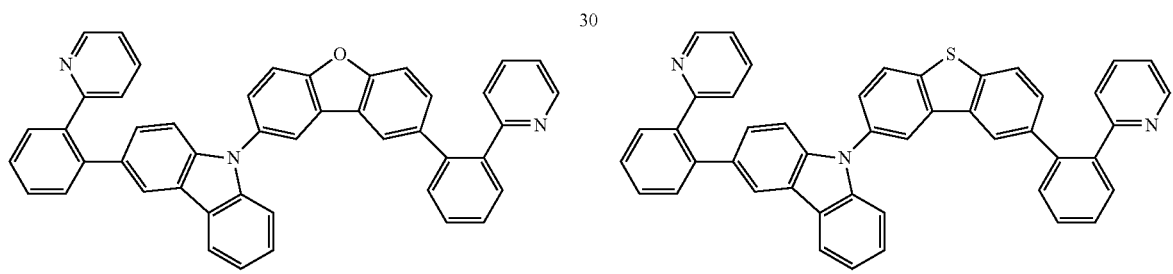
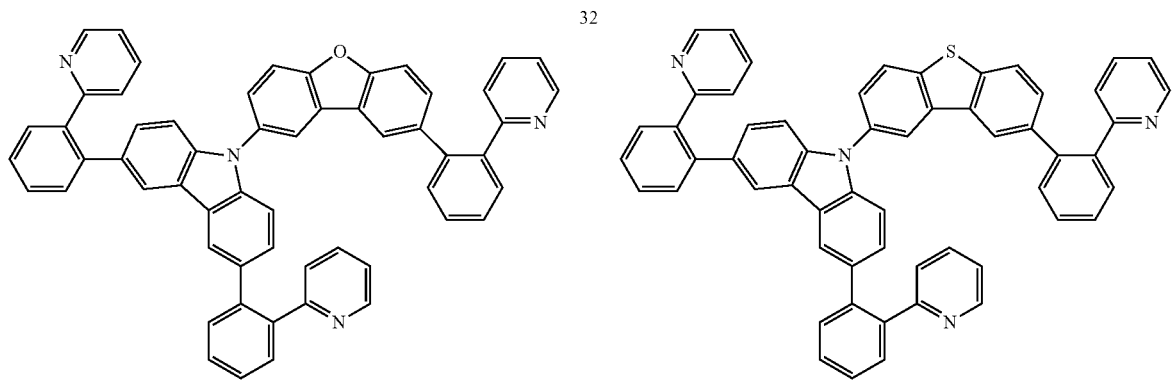
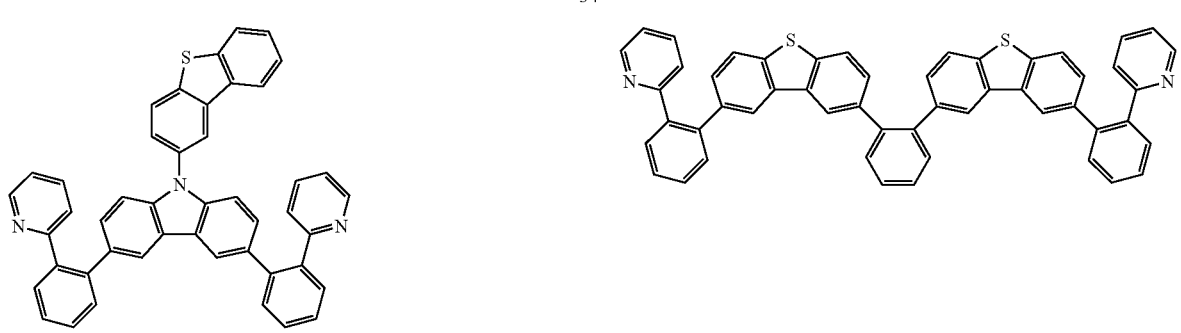

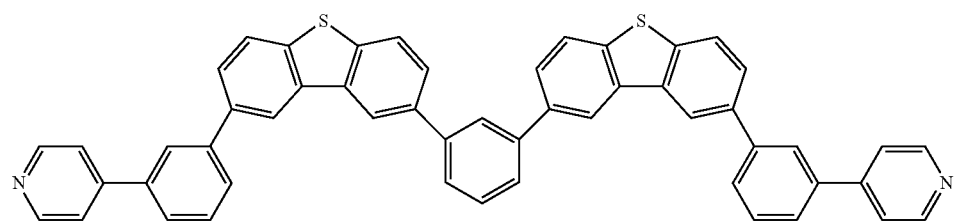
36
[Chemical Formula 40]
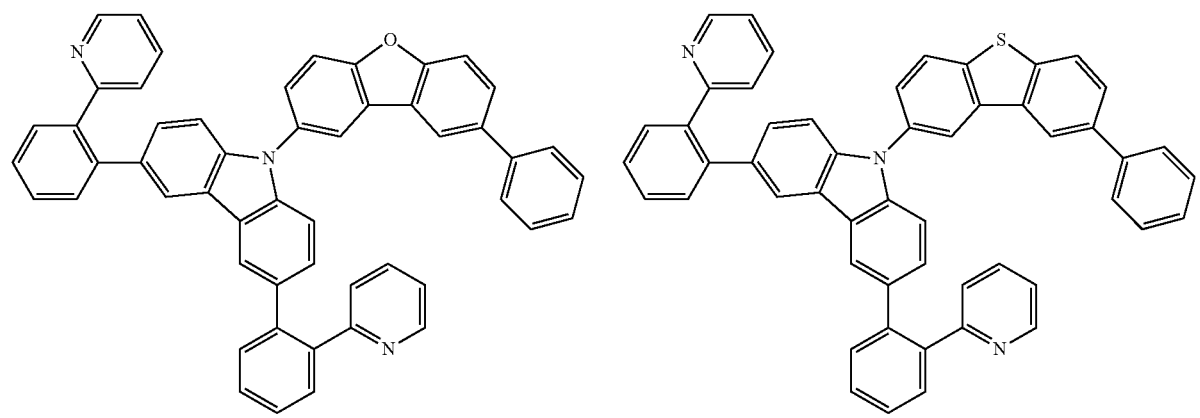
37
38
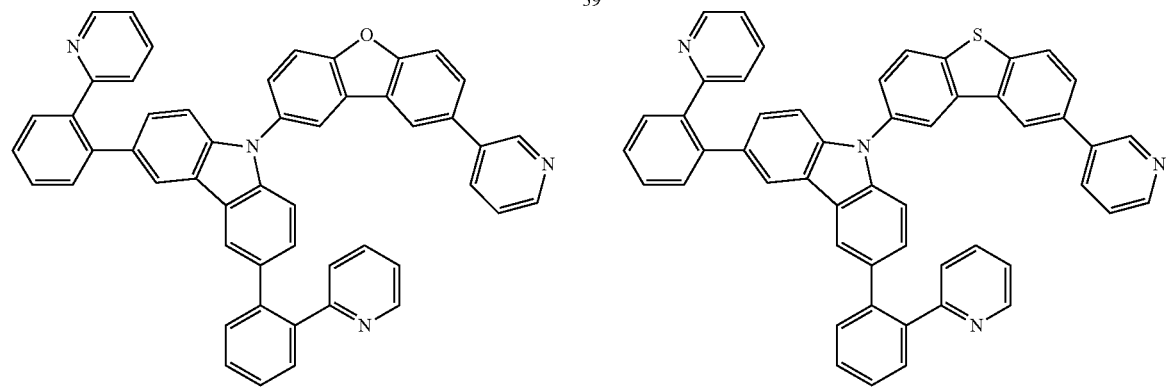
39
40
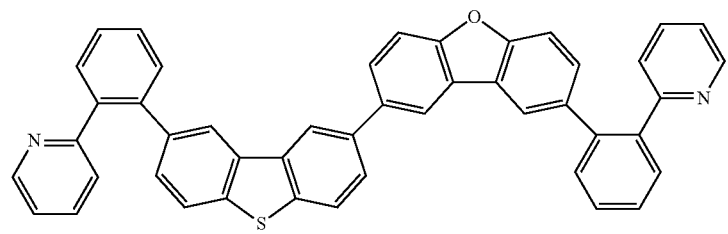
41

-continued
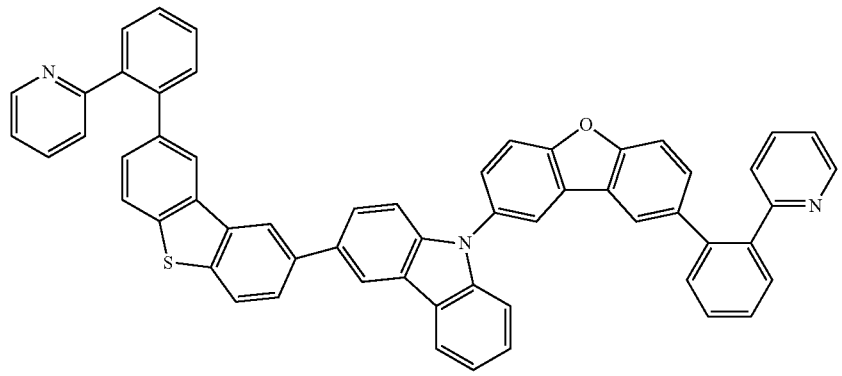
42
[Chemical Formula 41]
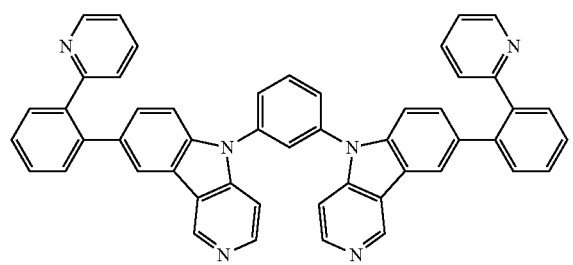
43
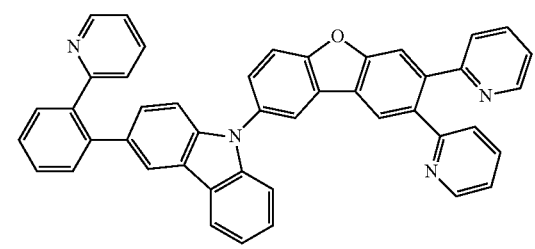
44
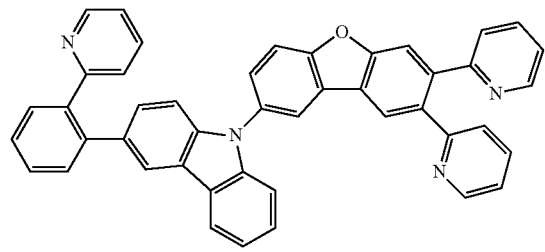
45
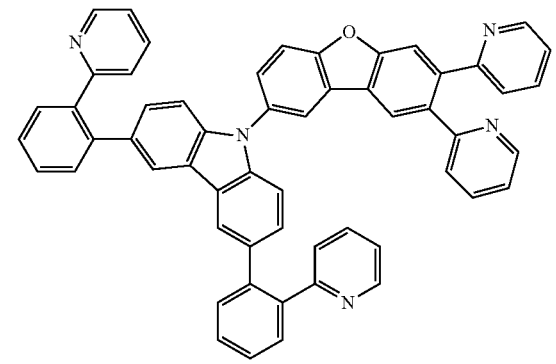
46
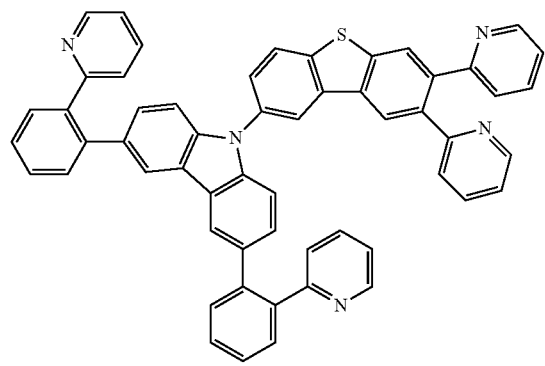
47

[Chemical Formula 42]
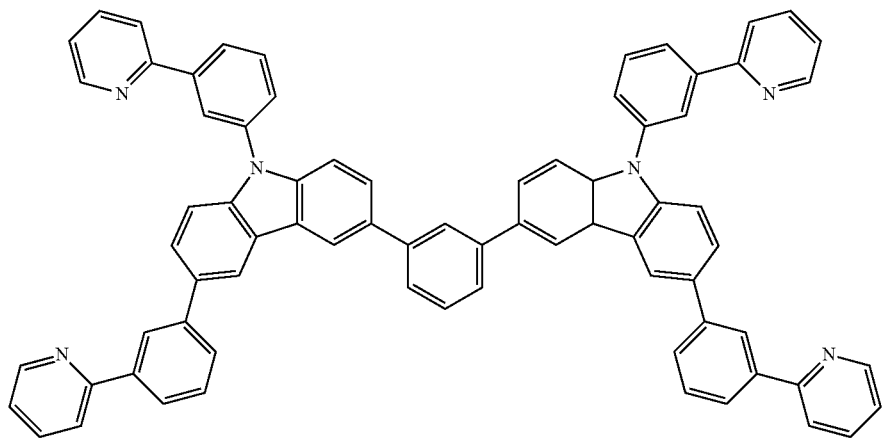
48
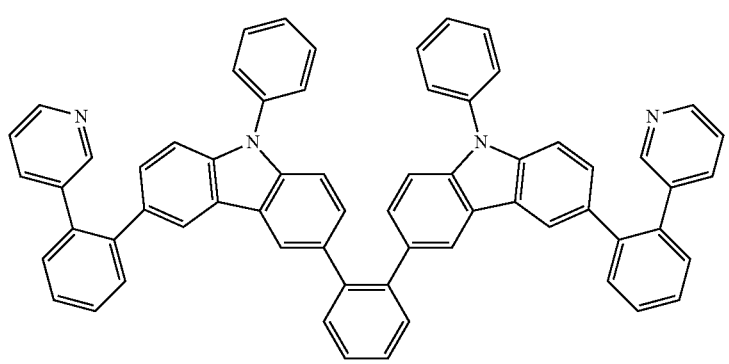
49
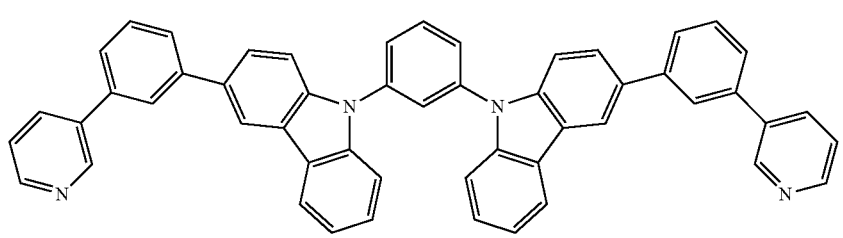
50
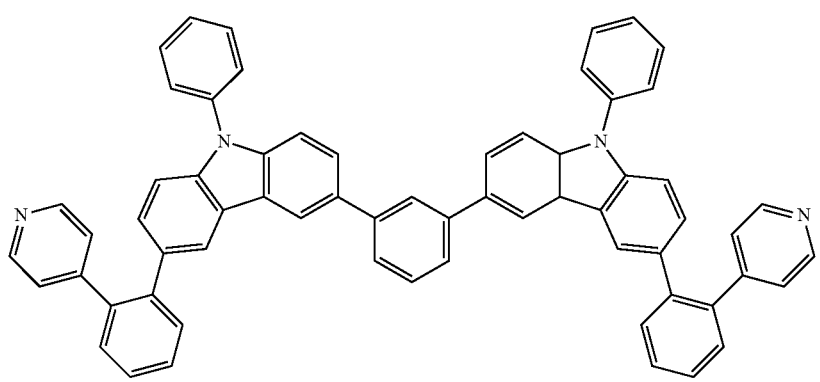
51

52
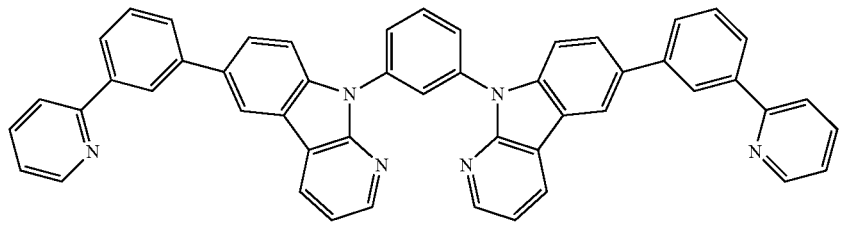
[Chemical Formula 43]
53
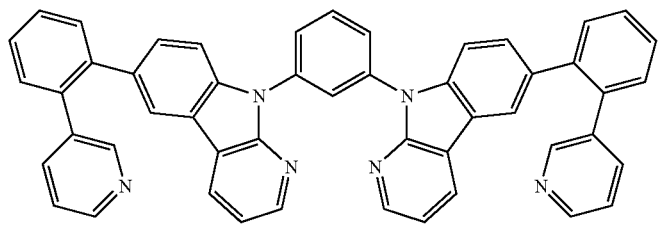
54
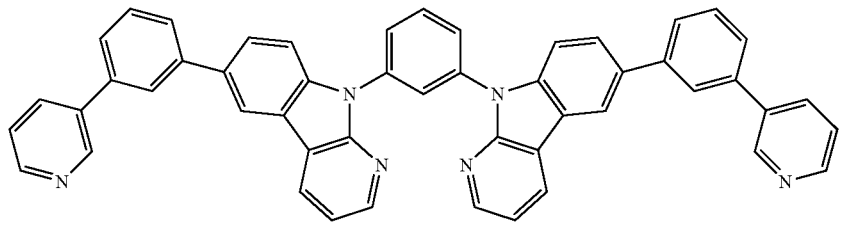
55
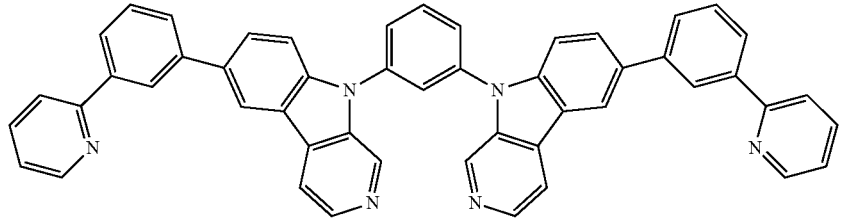
56
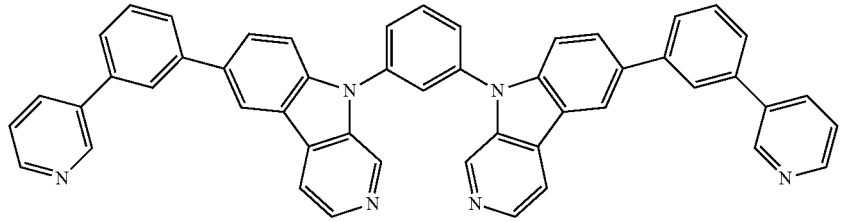
57
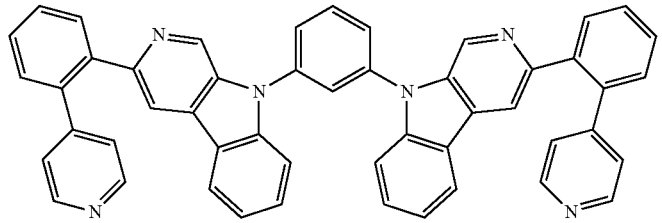

-continued
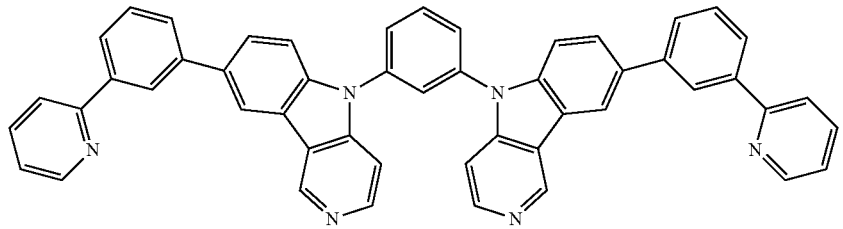
58
[Chemical Formula 44]
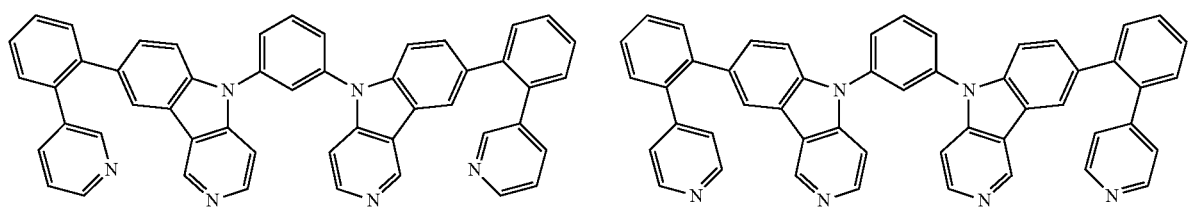
59 60
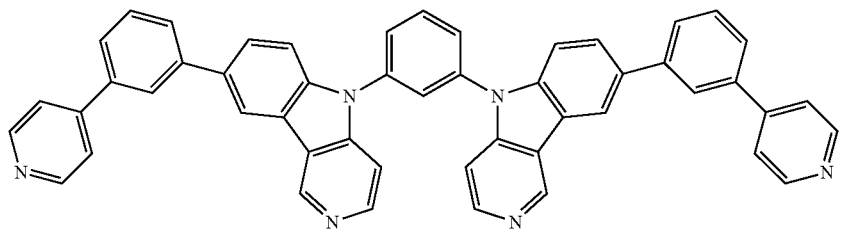
61
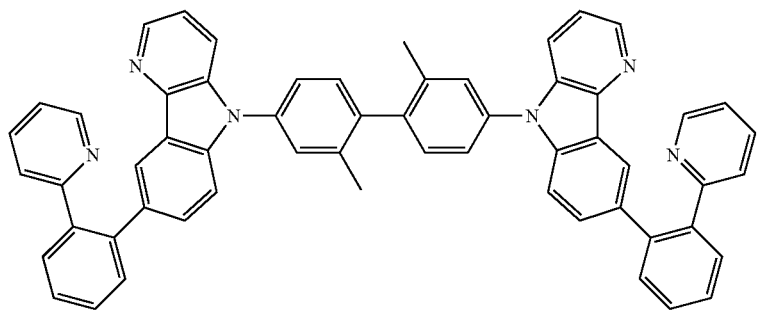
62
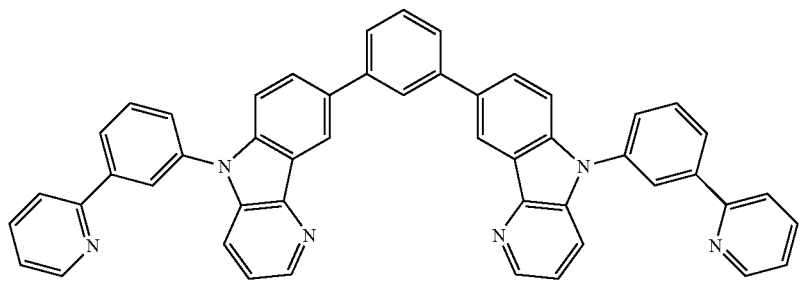
63
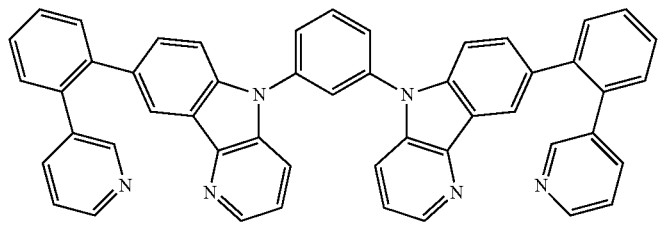
64

[Chemical Formula 45]
65
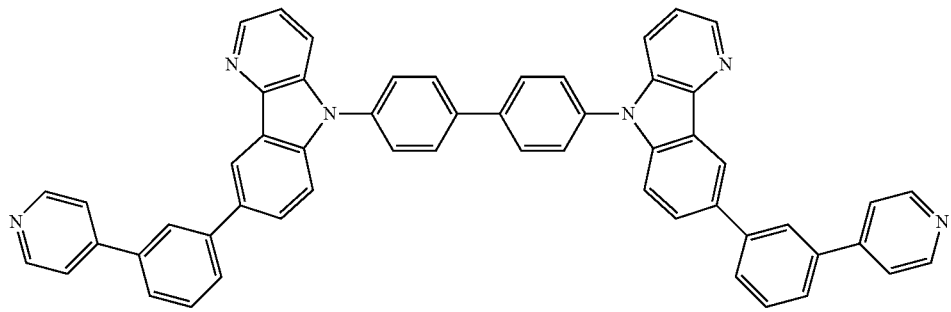
66
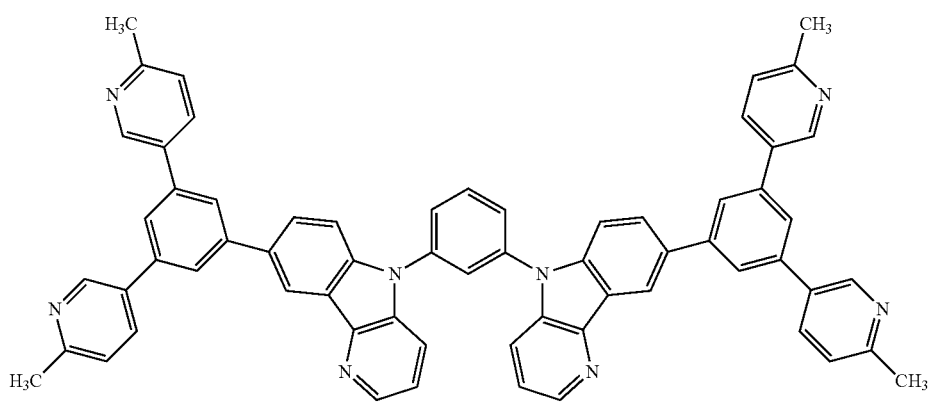
67
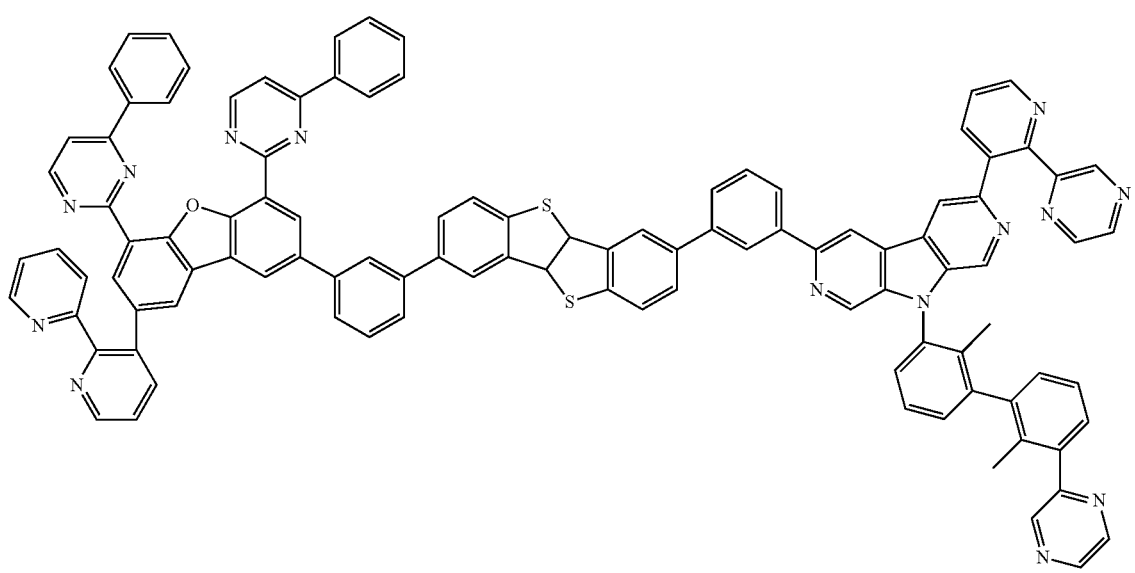

[Chemical Formula 46]
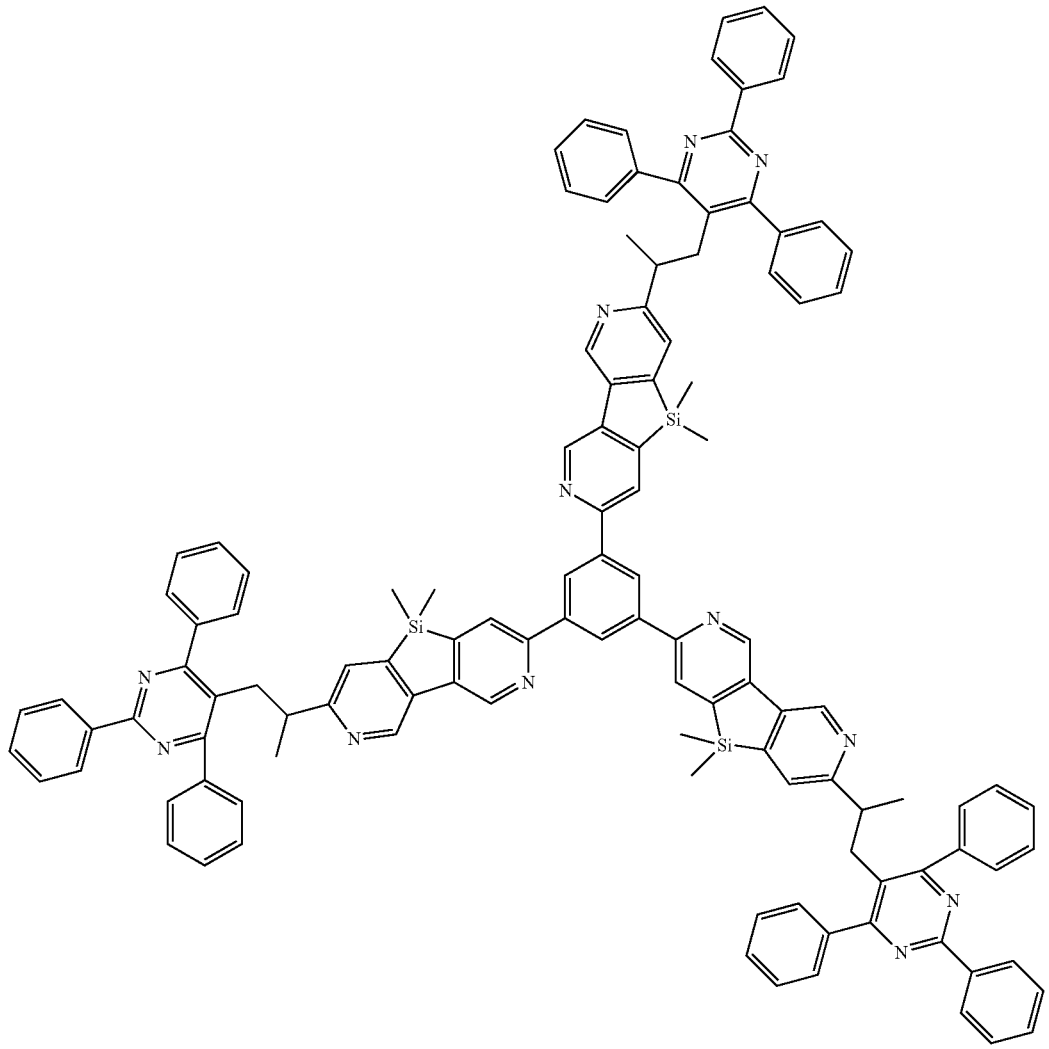
68
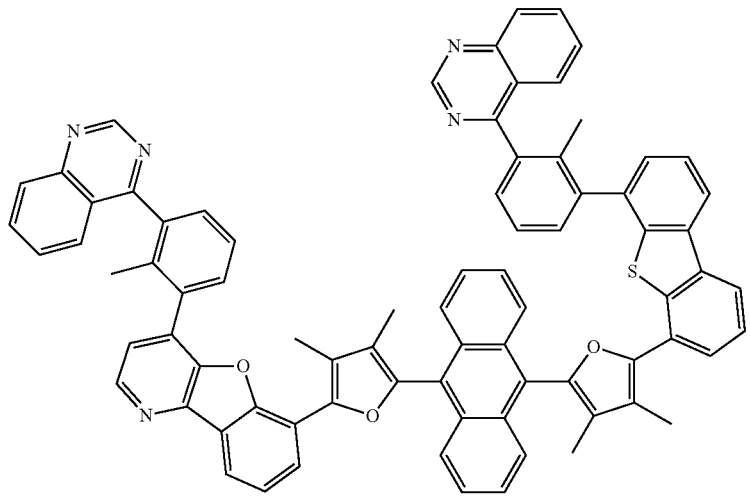
69

-continued
[Chemical Formula 47]
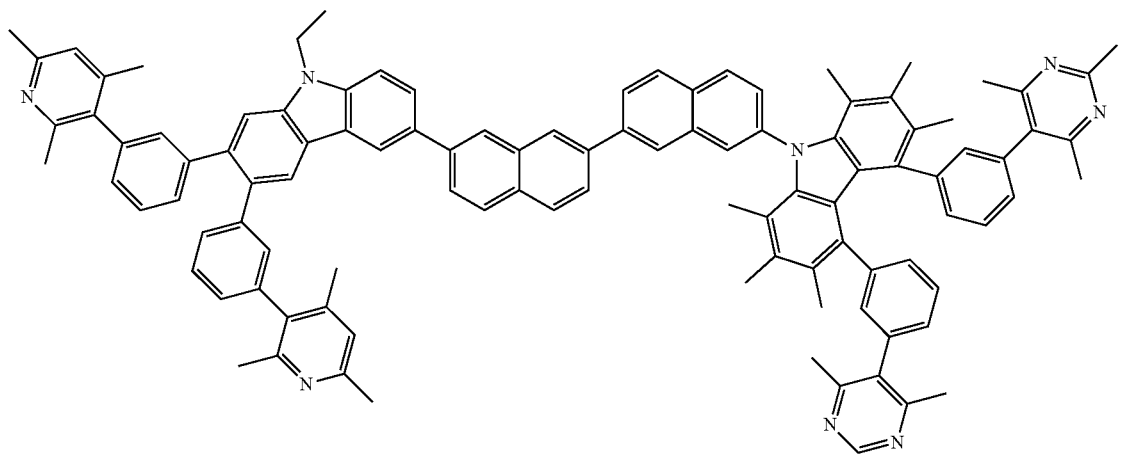
70
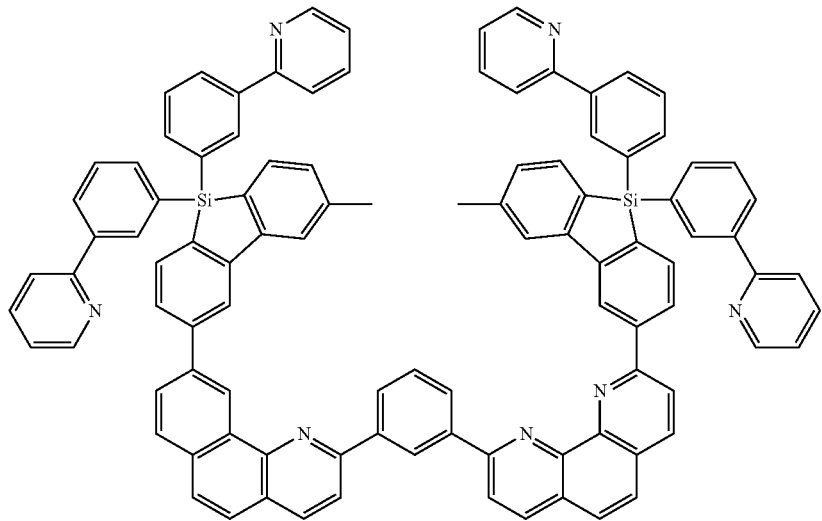
71
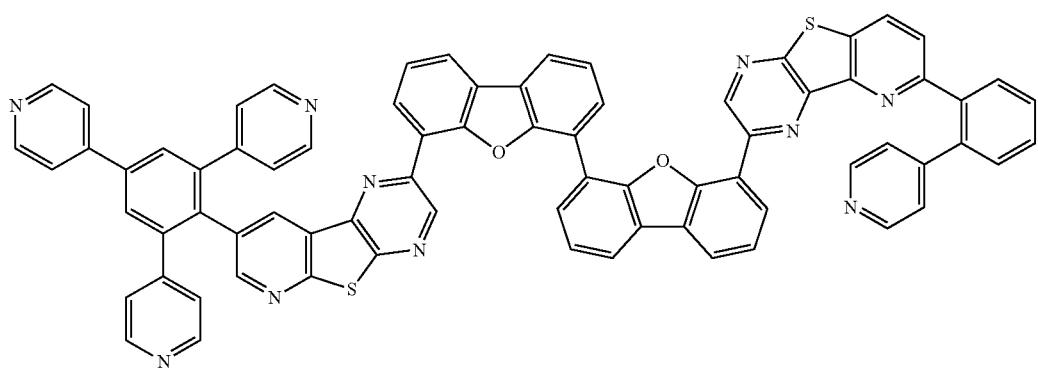
72

[Chemical Formula 48]
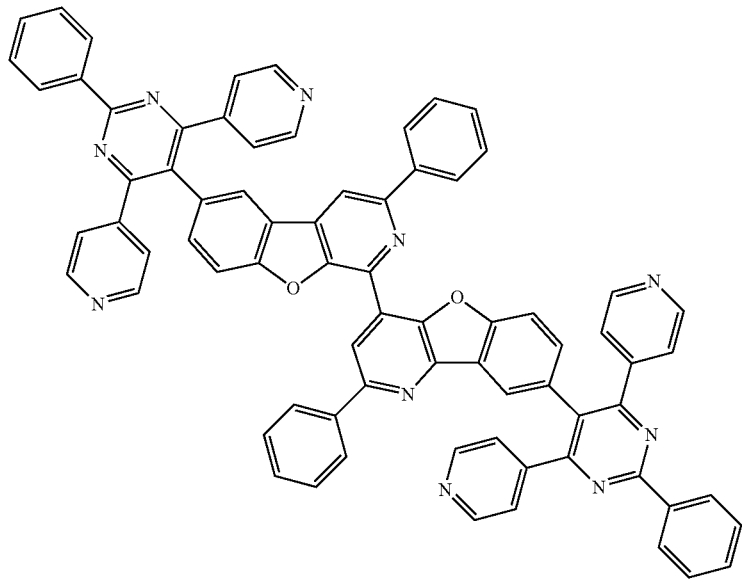
73
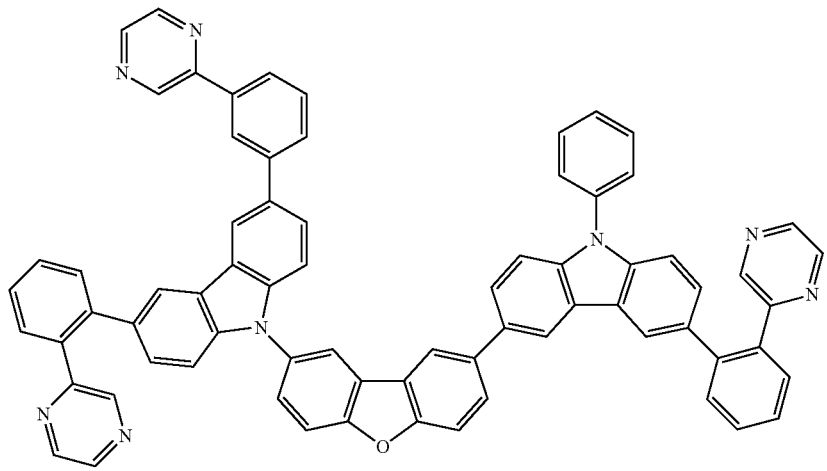
74

-continued
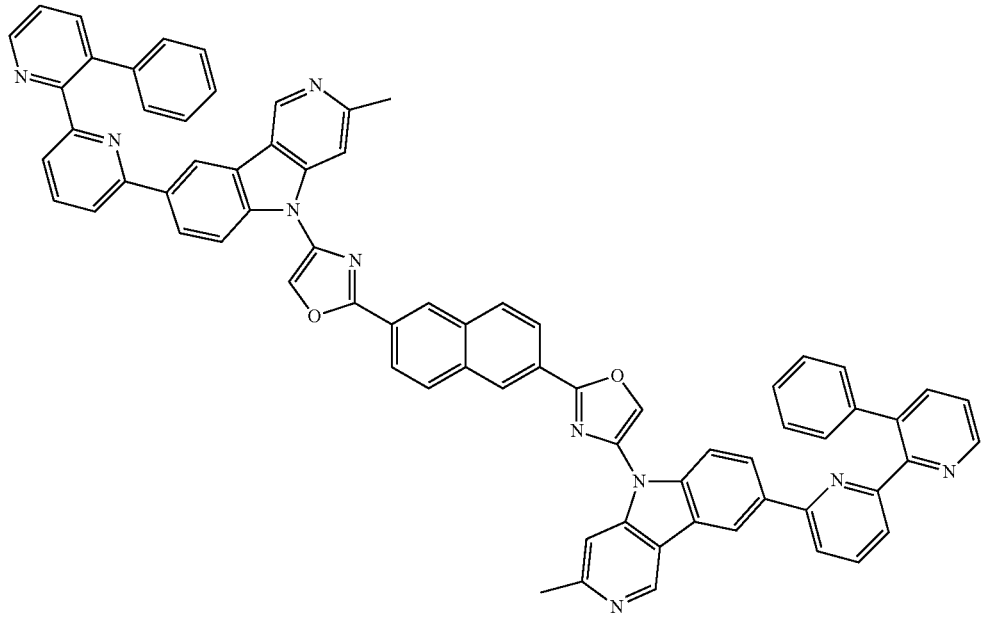
75
[Chemical Formula 49]
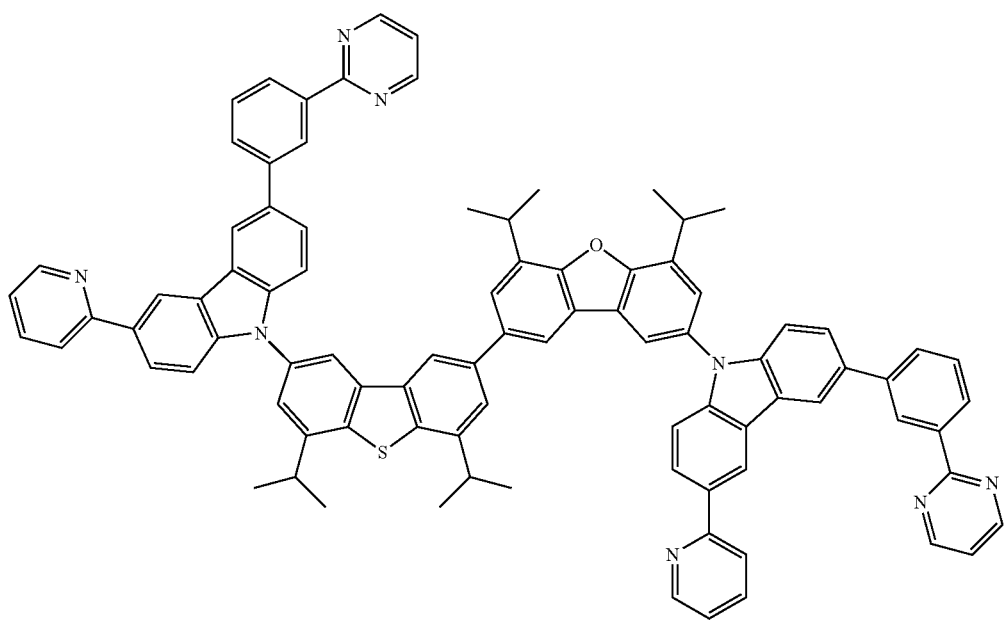
76

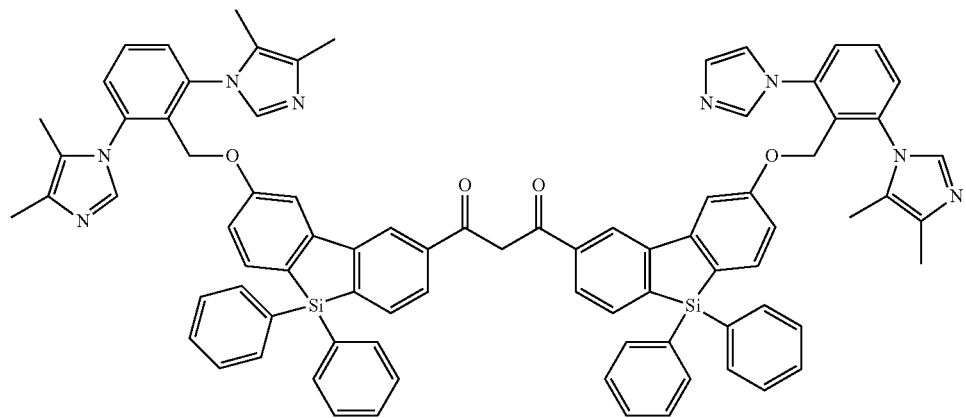
77
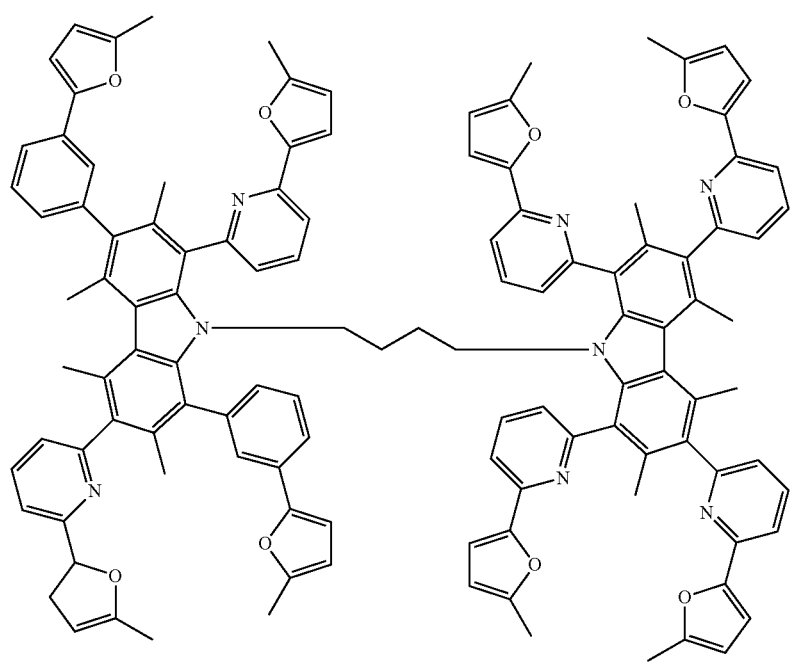
78

[Chemical Formula 50]
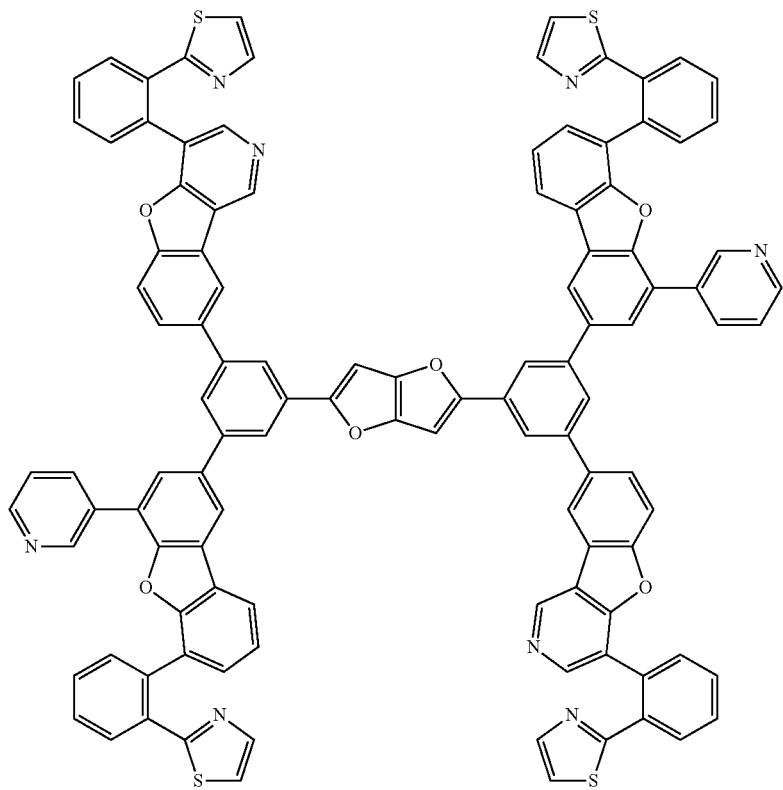
79
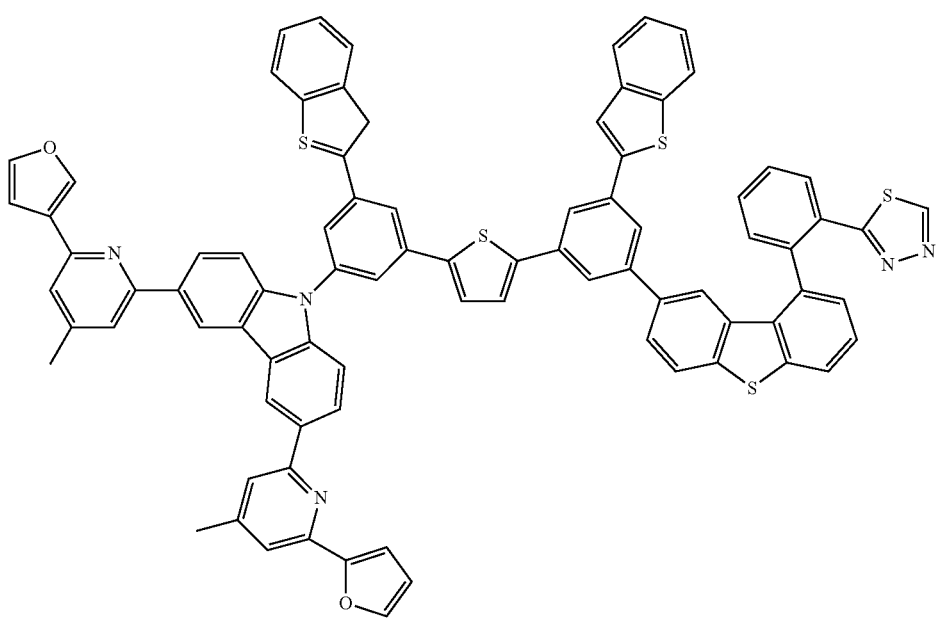
80

[Chemical Formula 51]
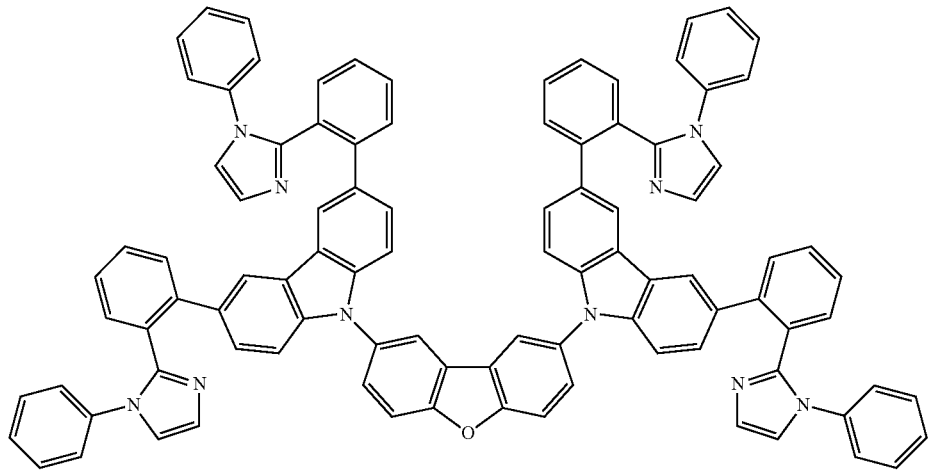
81
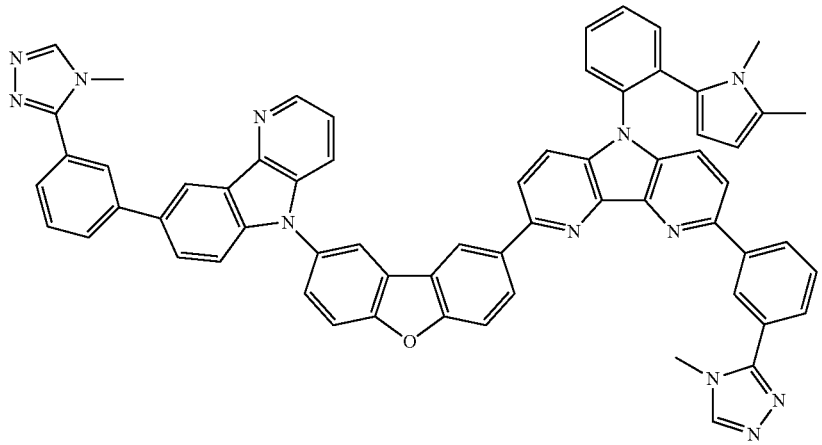
82

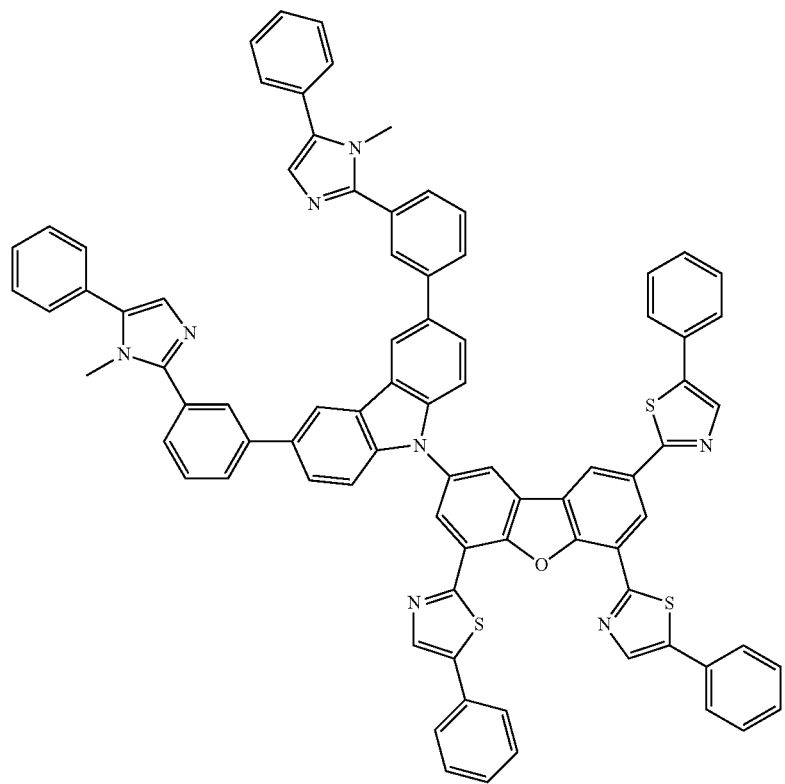
83
[Chemical Formula 52]
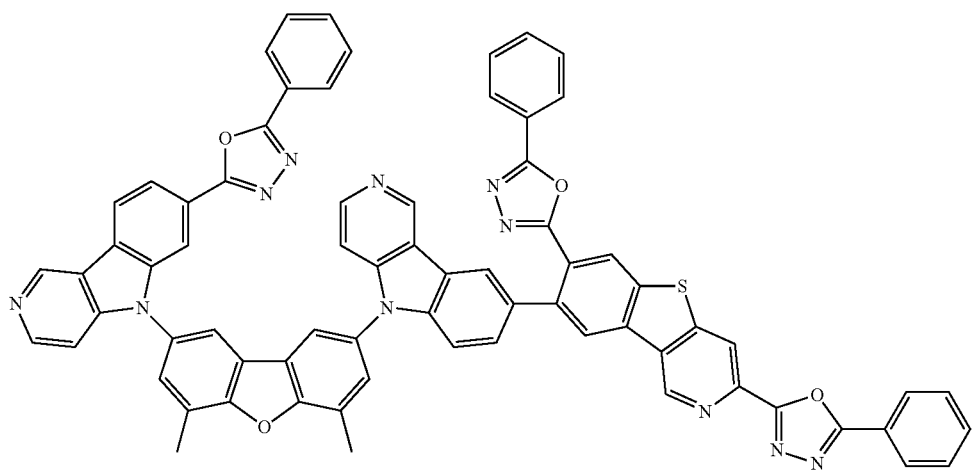
84

85
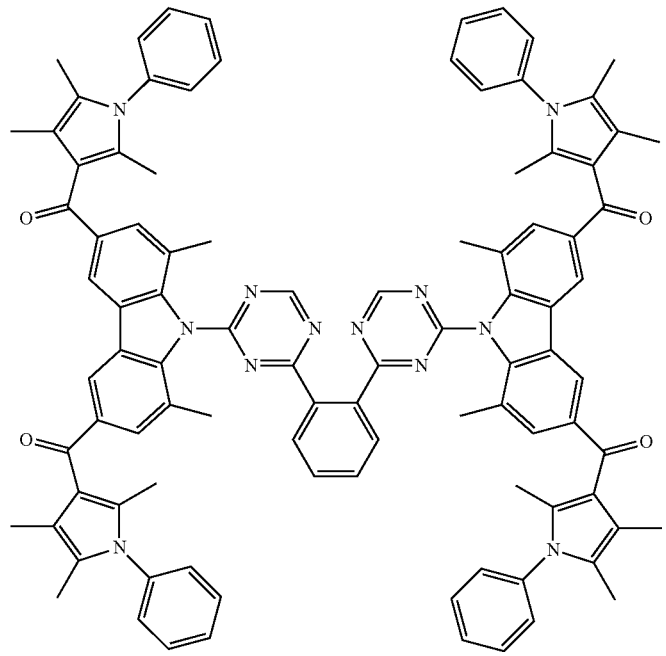
[Chemical Formula 53]
86
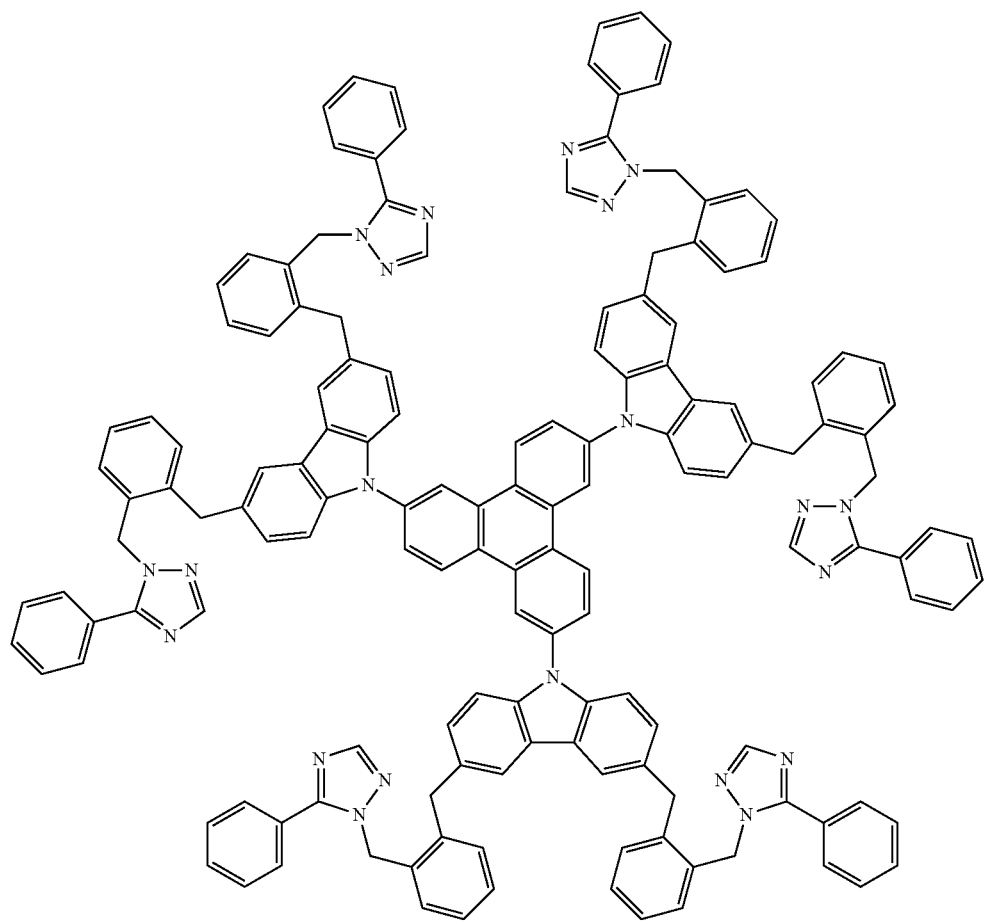

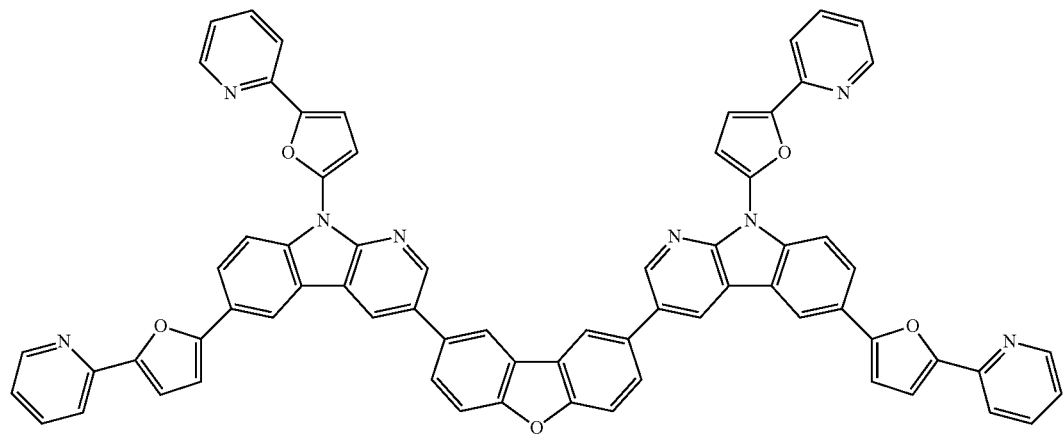
87
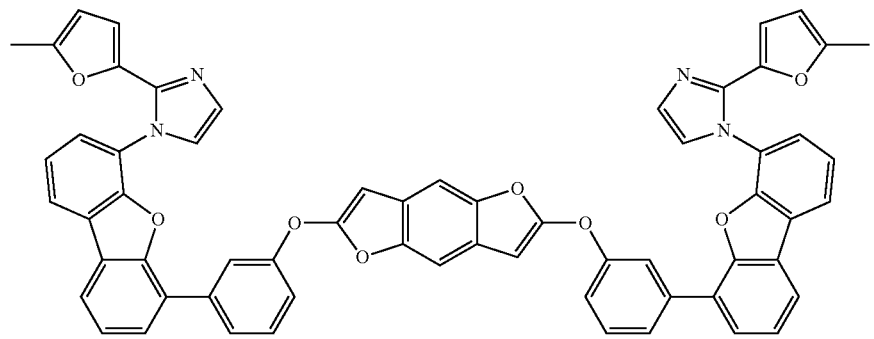
88
[Chemical Formula 54]
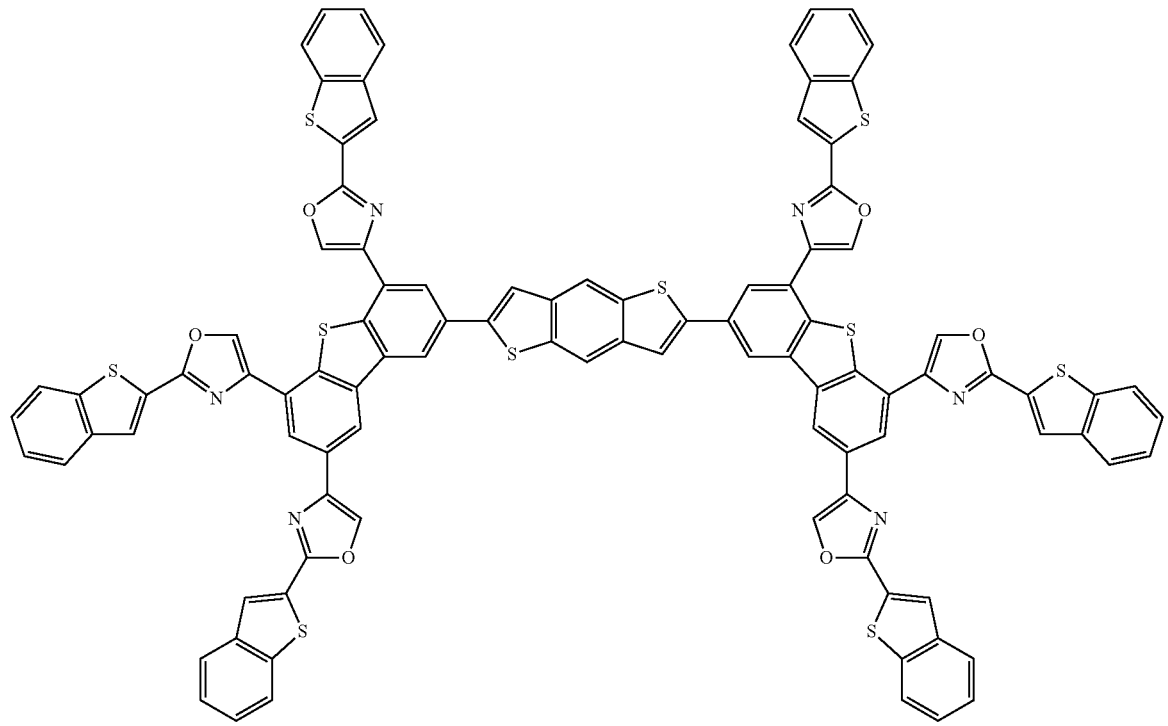
89

-continued
90
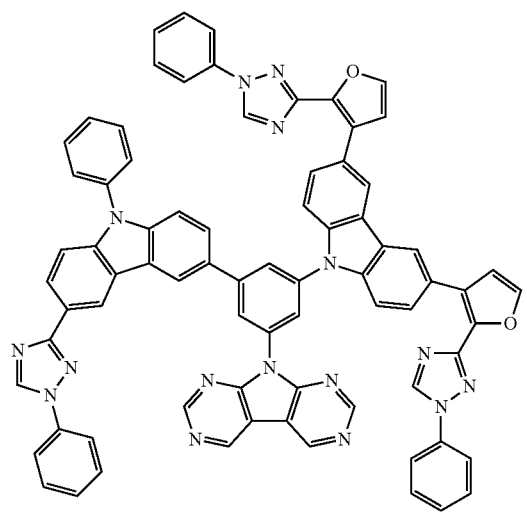
91
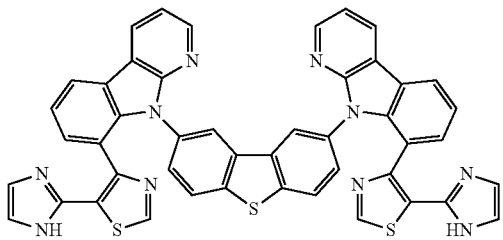
[Chemical Formula 55]
92
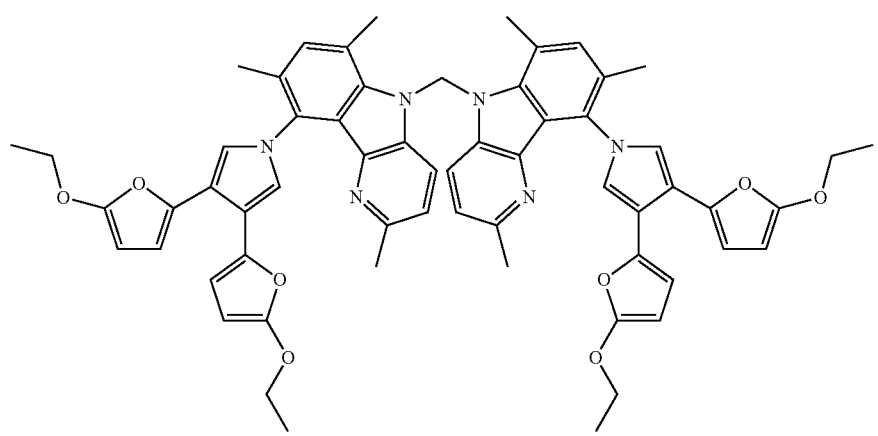
93
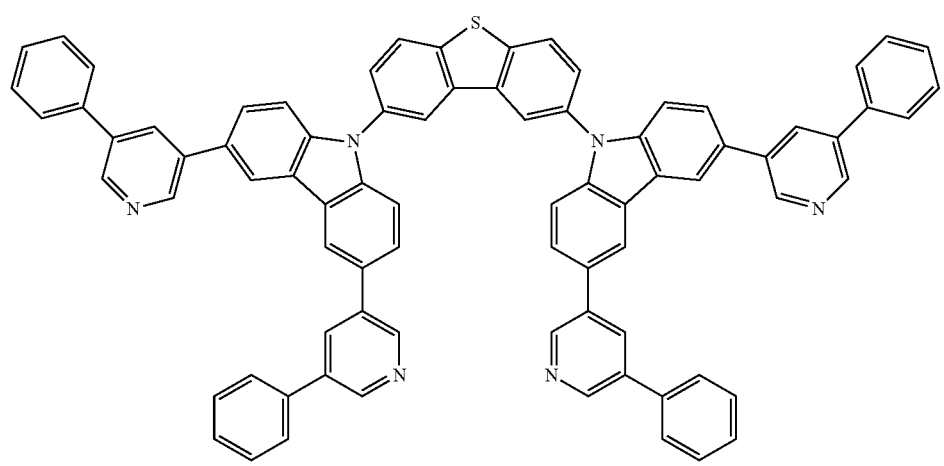

-continued
94
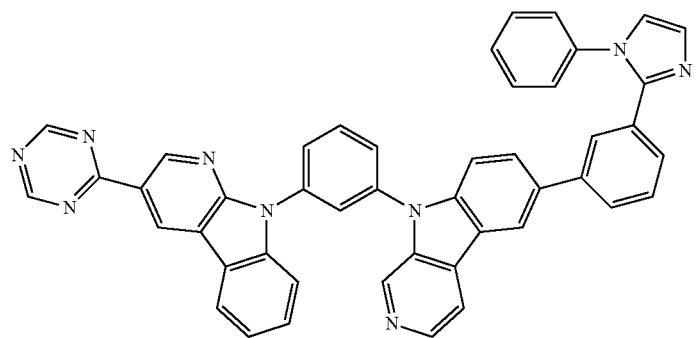
95
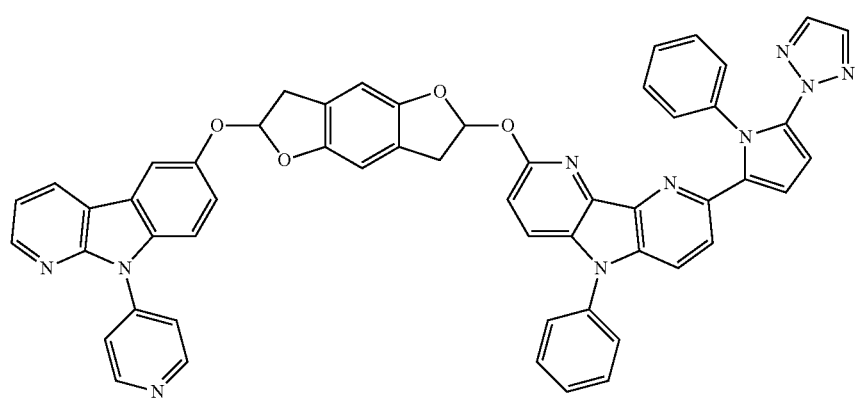
[Chemical Formula 56]
96
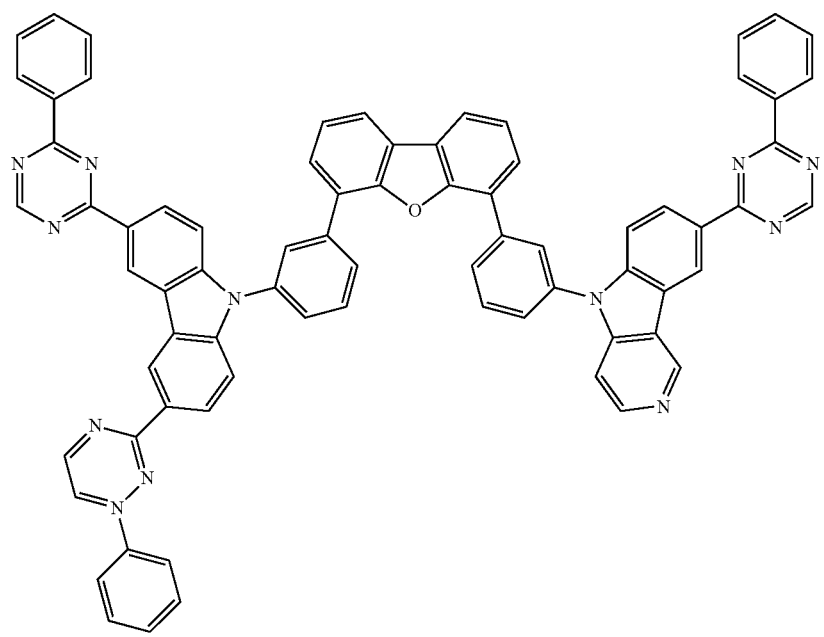

-continued
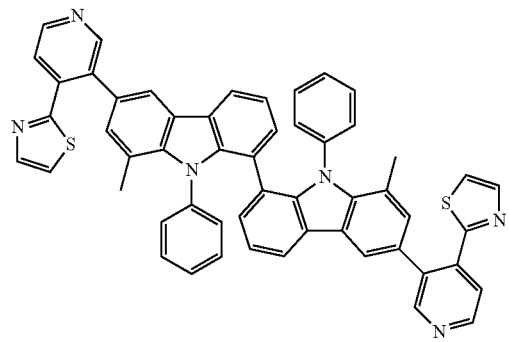
97
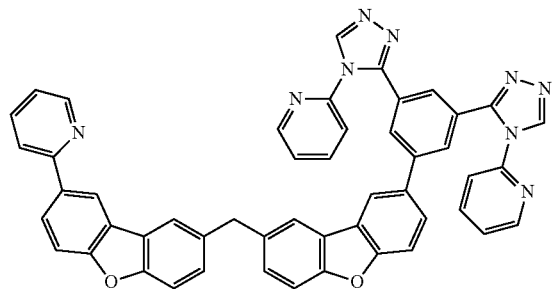
98
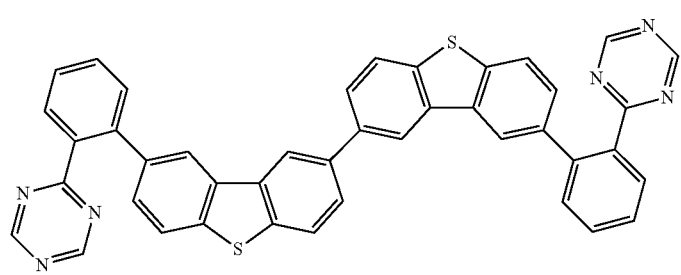
99
[Chemical Formula 57]
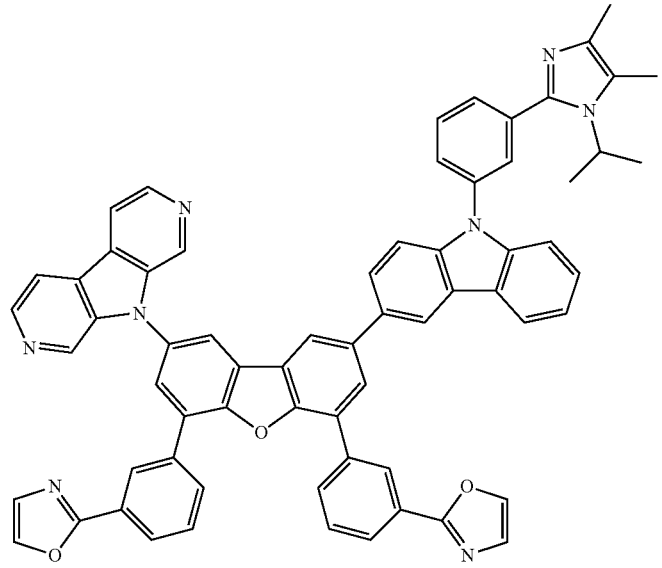
100

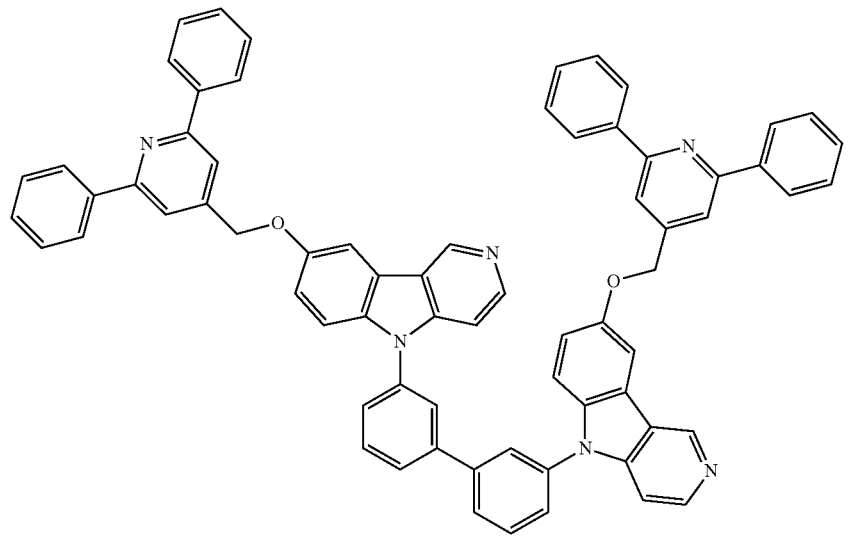
101
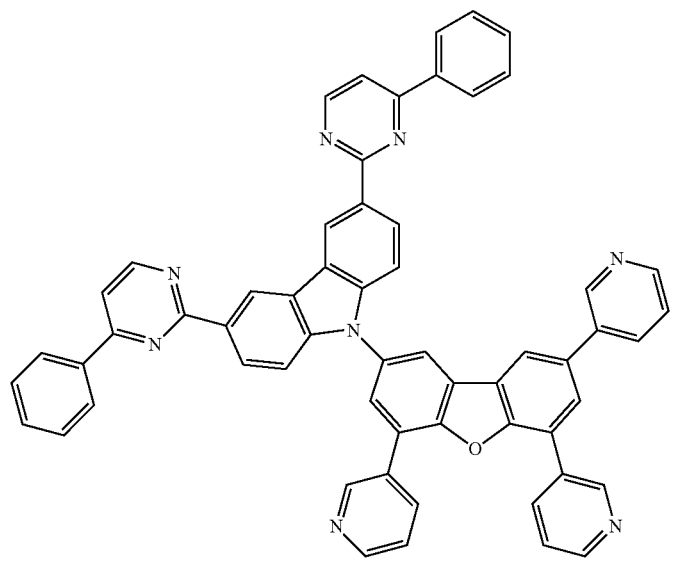
102
[Chemical Formula 58]
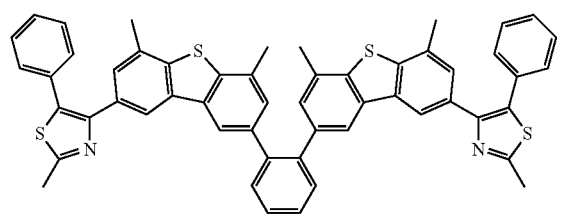
103
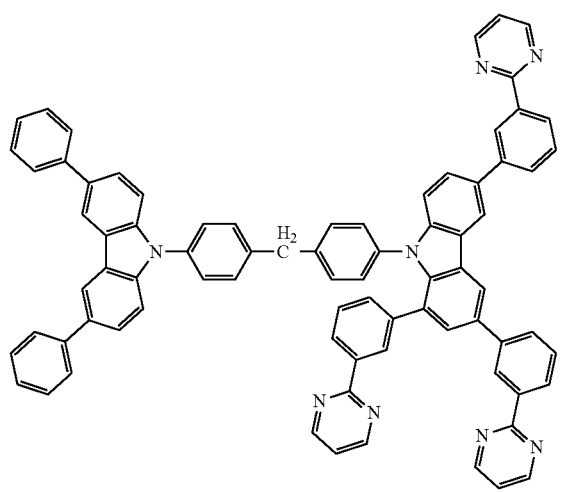
104

105
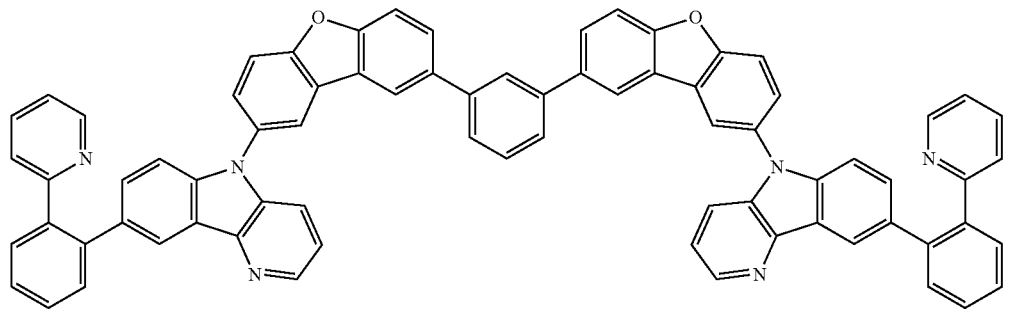
106
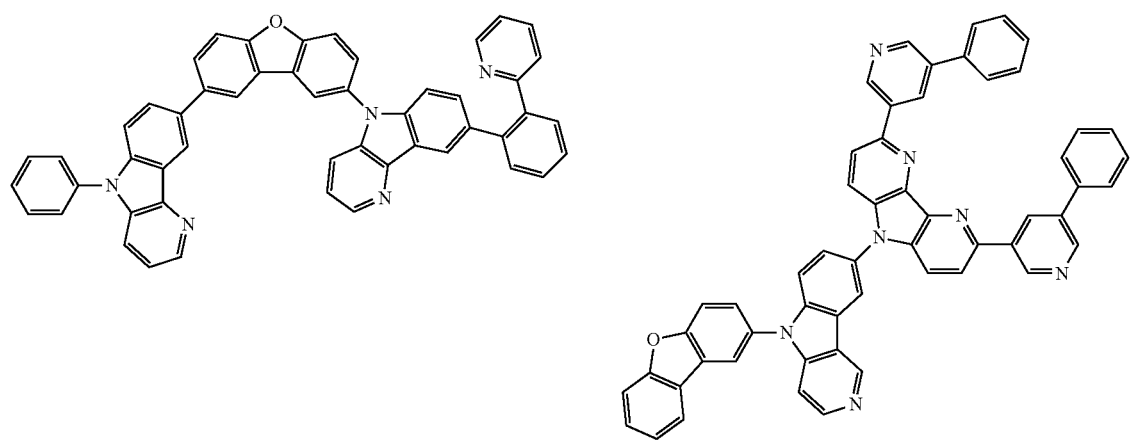
107
108
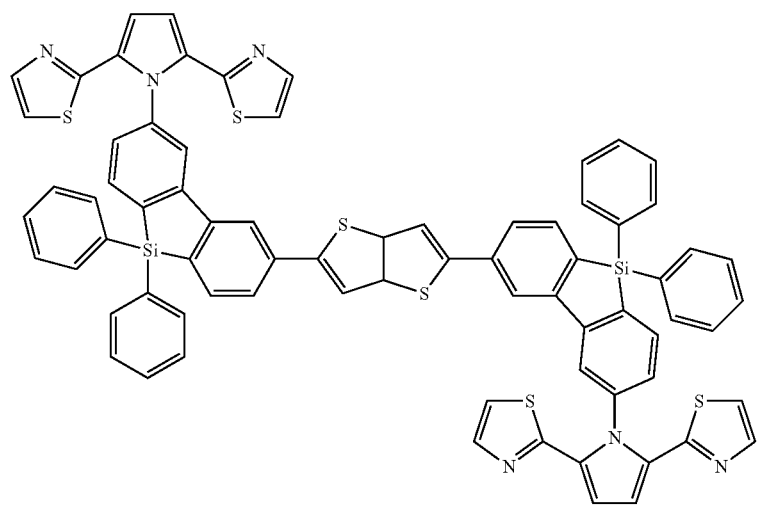
109
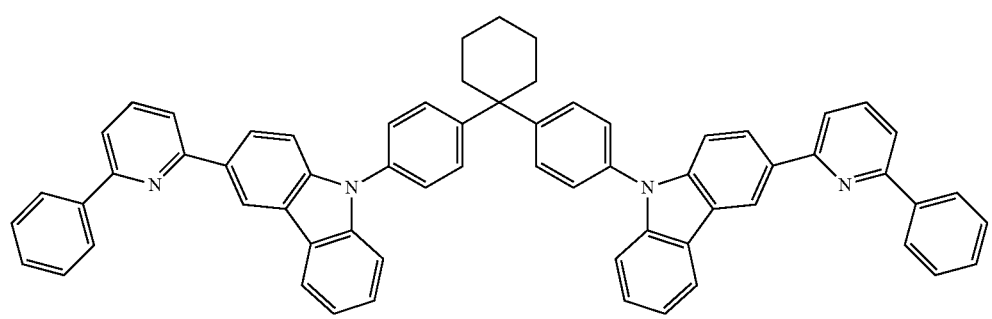

-continued
[Chemical Formula 60]
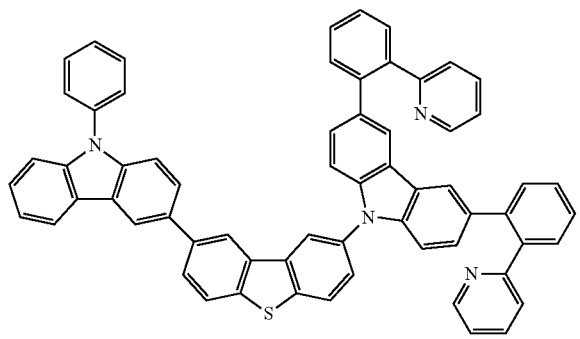
110
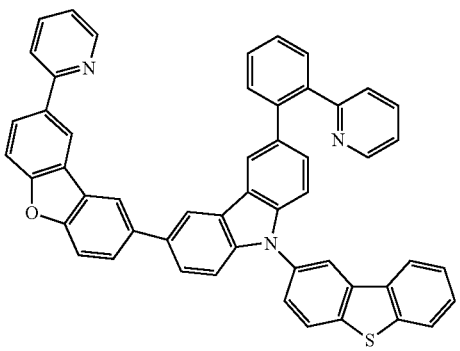
111
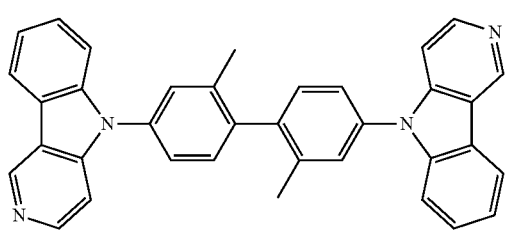
112
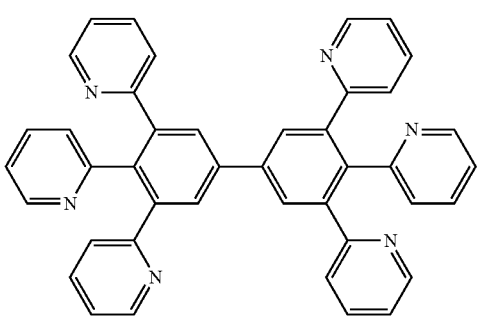
113
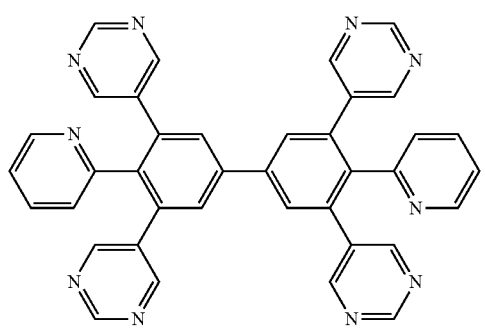
114
[Chemical Formula 61]
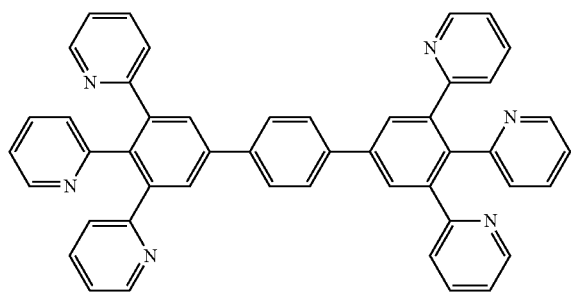
115
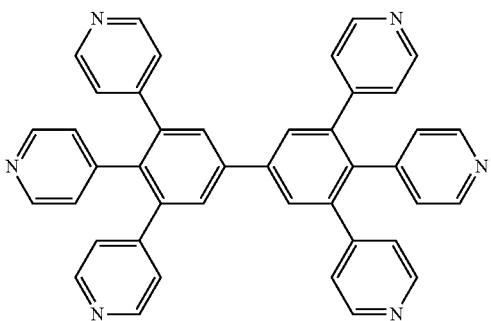
116

-continued
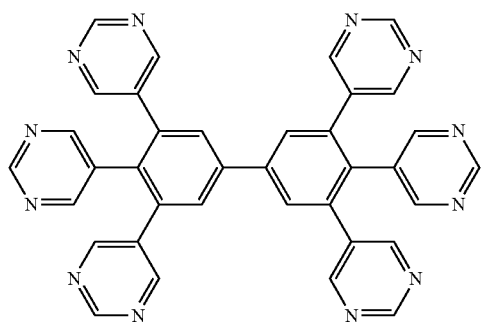
87
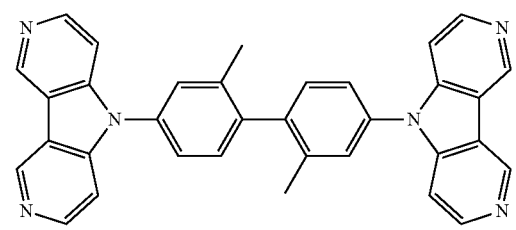
117
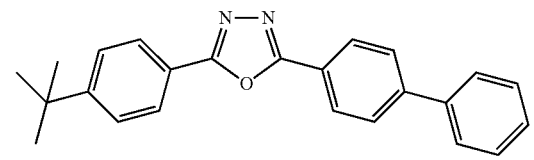
118
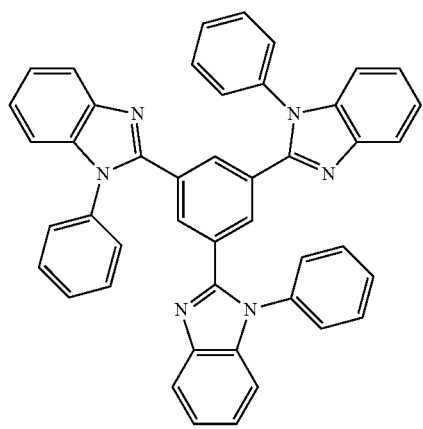
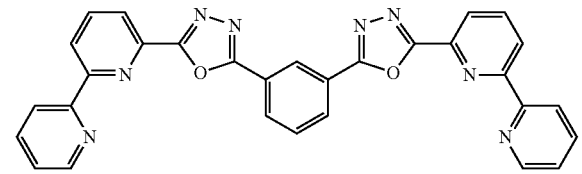
119
120
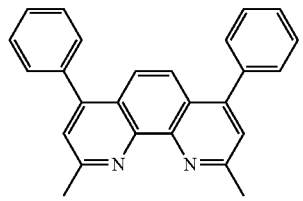
121
122
[Chemical Formula 62]
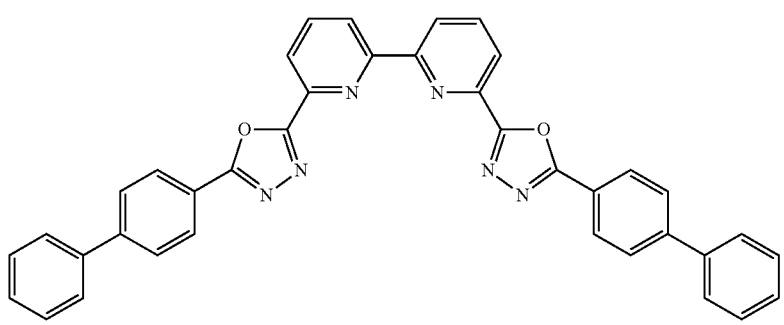
123
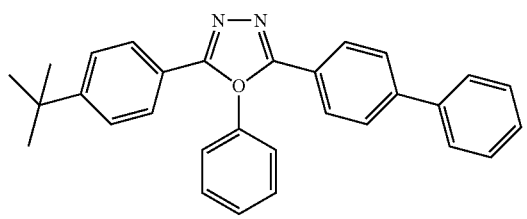
124
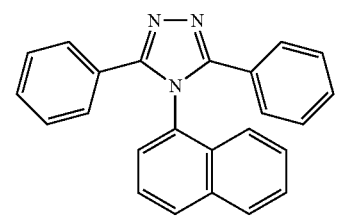
125

-continued
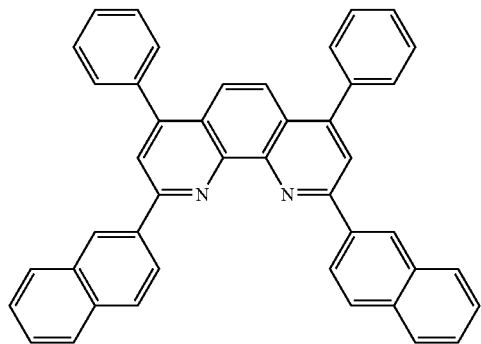
126
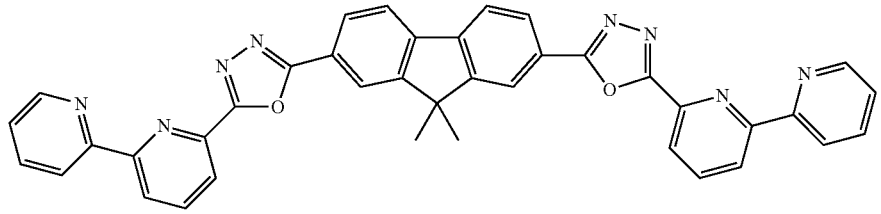
127
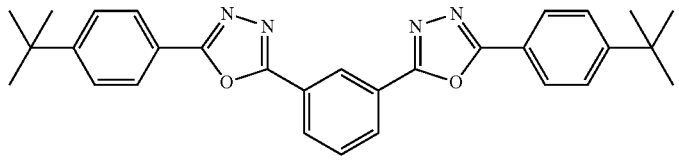
128
[Chemical Formula 63]
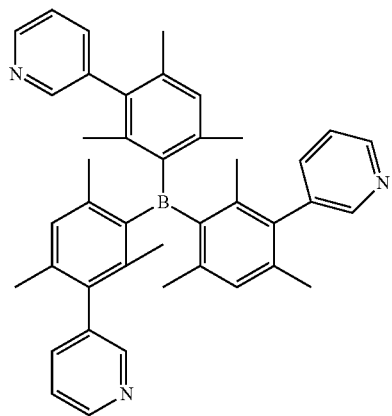
129
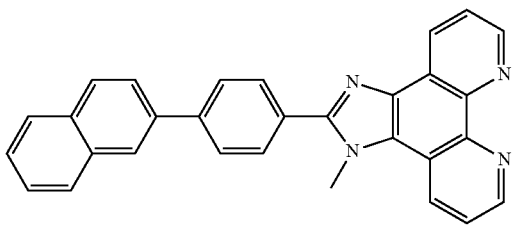
130

-continued
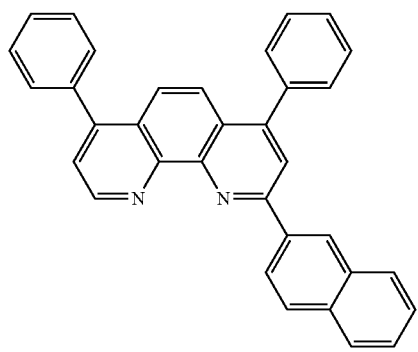
131
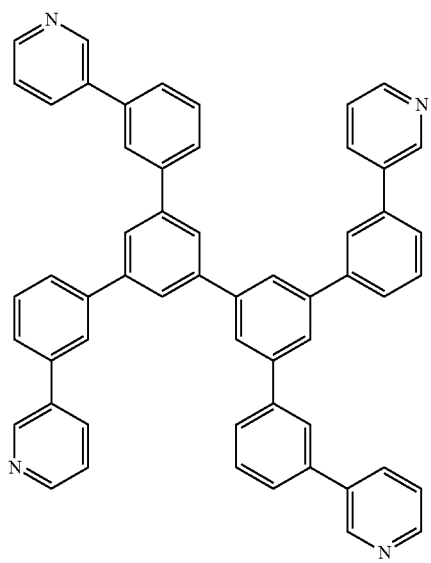
132
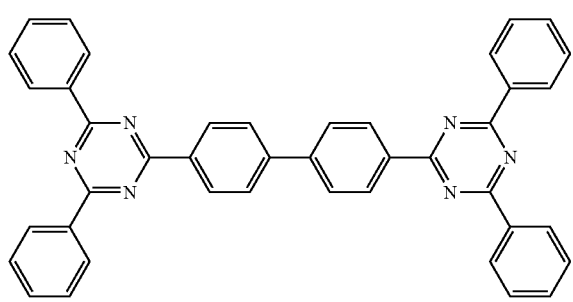
133
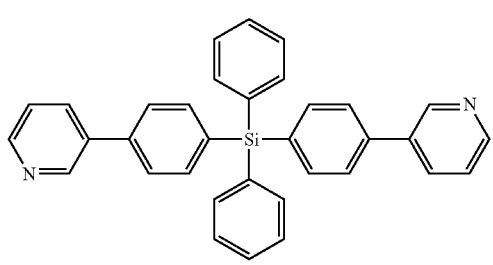
134
[Chemical Formula 64]
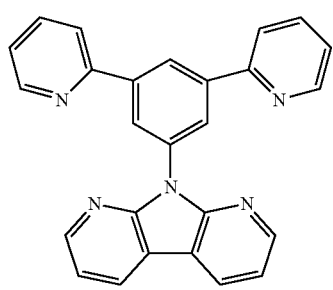
135
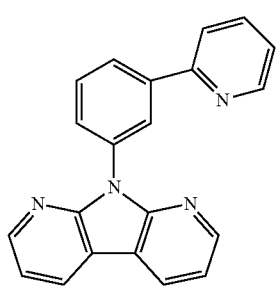
136
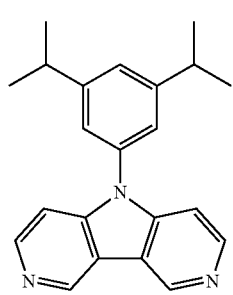
137
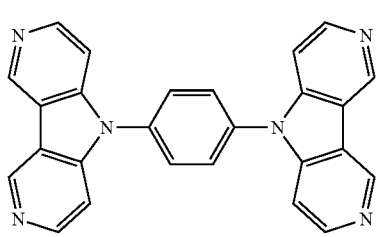
138

-continued
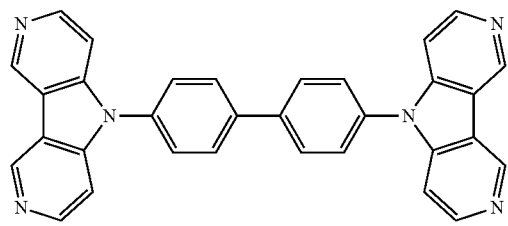
139
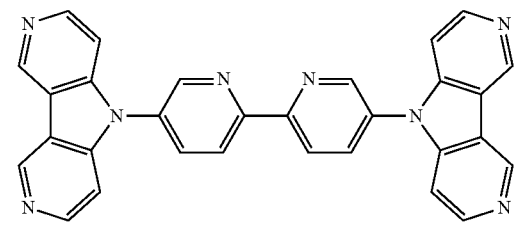
140
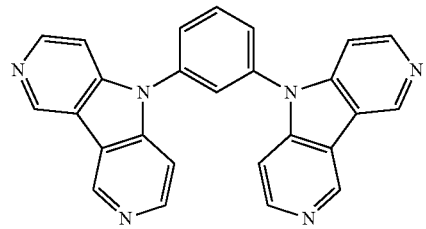
141
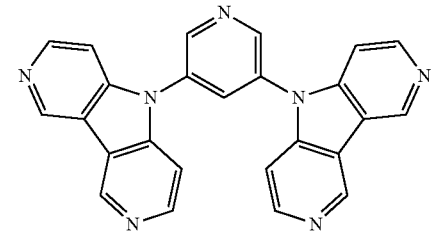
142
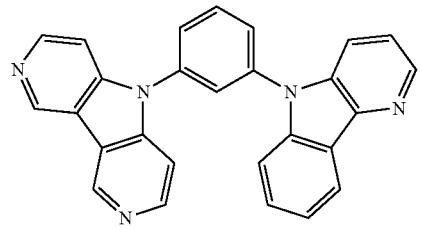
143
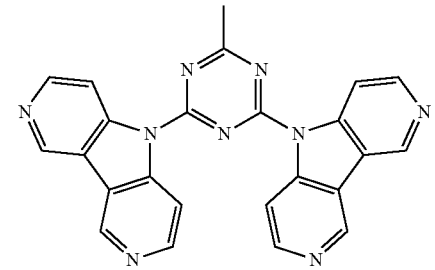
144
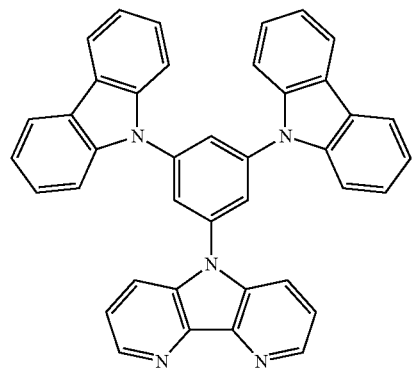
145
[Chemical Formula 65]
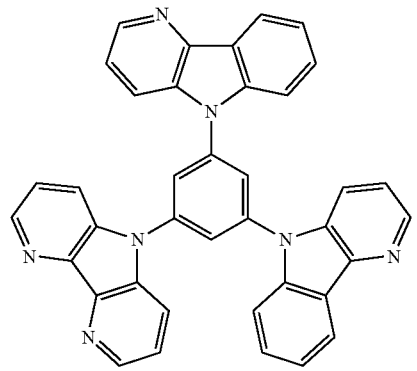
146
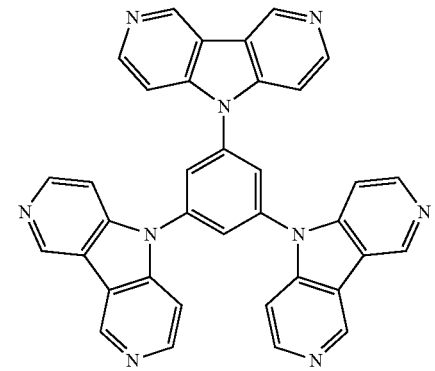
147

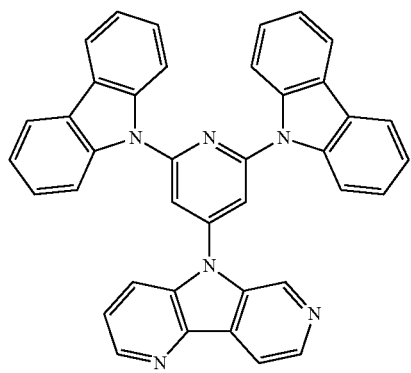
148
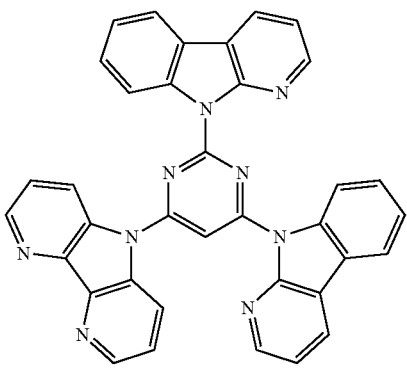
149
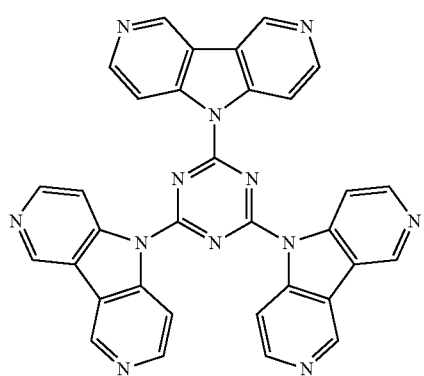
150
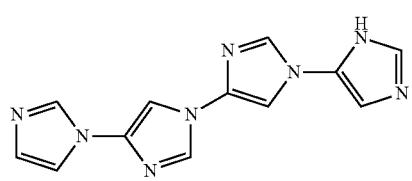
151
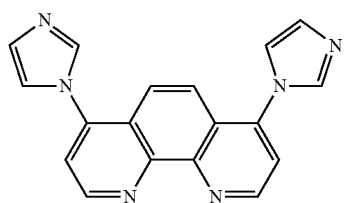
152
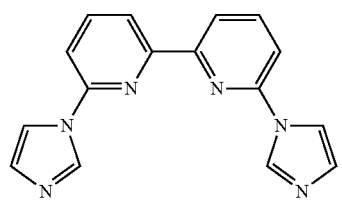
153
[Chemical Formula 66]
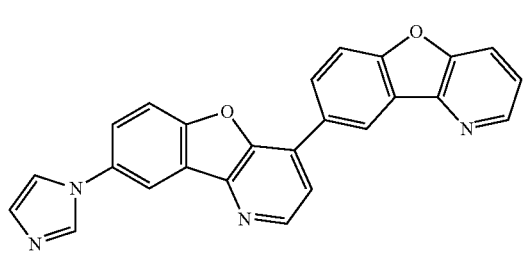
154
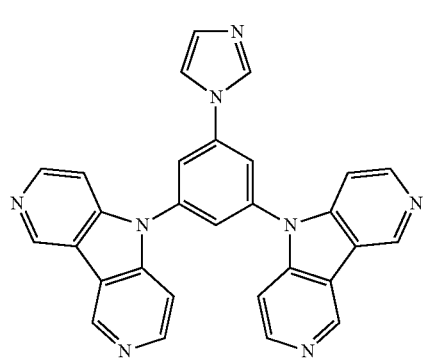
155

156
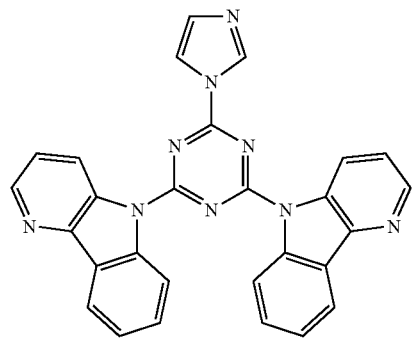
157
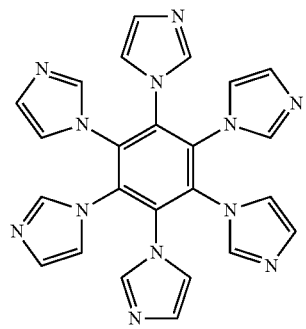
158
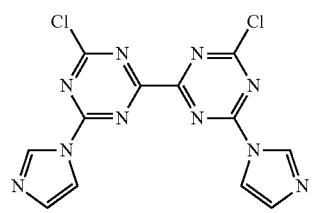
159
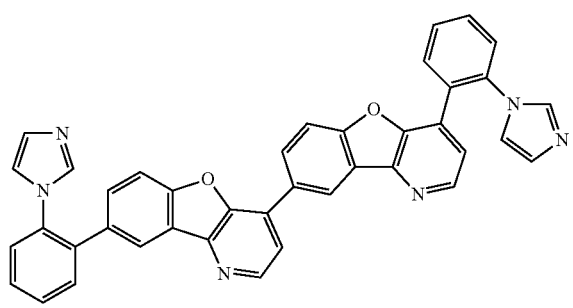
160
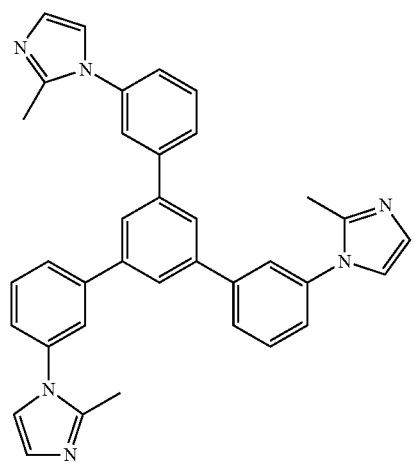
161
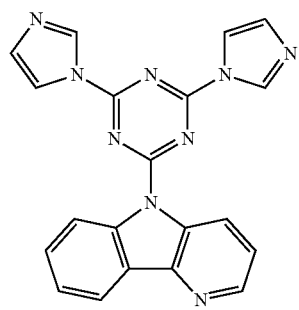
[Chemical Formula 67]
162
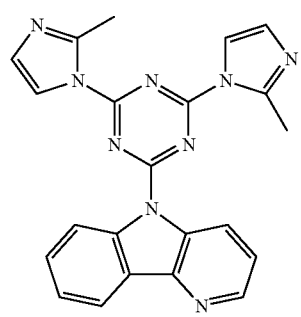
163
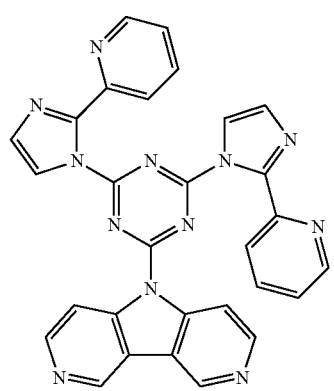

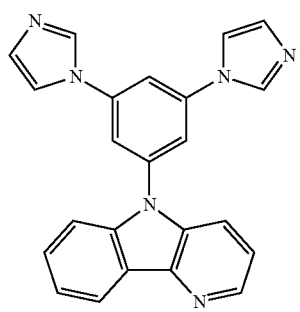
164
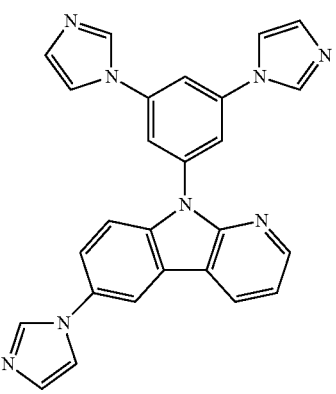
165
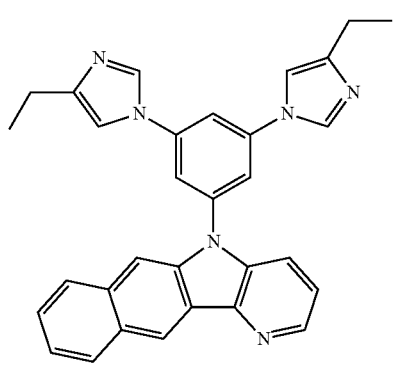
166
Example of Synthesis of Compound
A specific synthesis example of compound 5 will be shown below as a synthesis example of a typical compound, but the synthesis example is not limited to this.
Synthesis of Compound 5
[Chemical Formula 68]
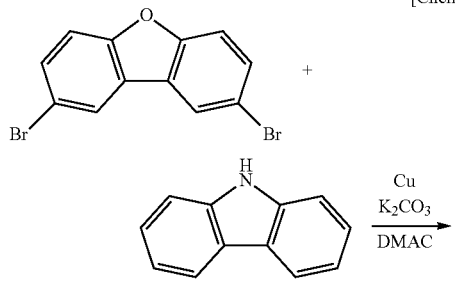
Intermediate 1
-continued
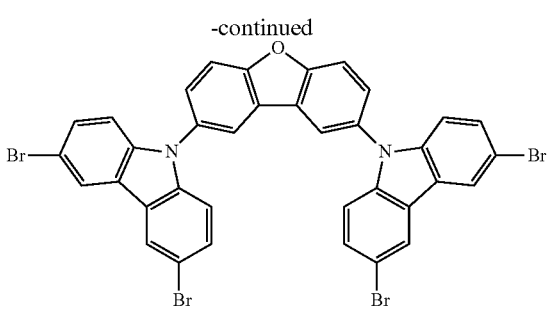
Intermediate 2
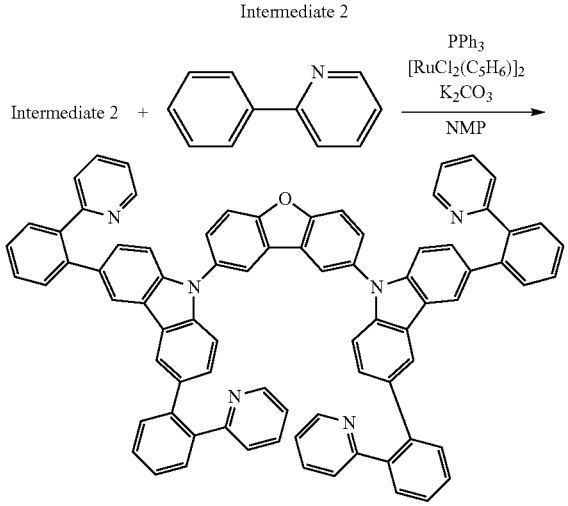
Compound 5

Step 1: (Synthesis of Intermediate 1)

Under a nitrogen atmosphere, 2,8-dibromodibenzofuran (1.0 mol), carbazole (2.0 mol), a copper powder (3.0 mol) and potassium carbonate (1.5 mol) were mixed in 300 ml of DMAc (dimethylacetamide), and the mixture was stirred at 130° C. for 24 hours. The reaction liquid obtained in this way was cooled to room temperature, 1 L of toluene was added, and the mixture was washed three times with distilled water, the solvent was distilled off from the washed product under a reduced pressure atmosphere, and the residue was purified by silica gel flash chromatography (n-heptane: toluene=4:1 to 3:1), whereby Intermediate 1 was obtained at a yield of 85%.

Step 2: (Synthesis of Intermediate 2)

Intermediate 1 (0.5 mol) was dissolved in 100 ml of DMF (dimethylformamide) at room temperature under atmosphere, NBS (N-bromosuccinic acid imide) (2.0 mol) was added thereto, and the mixture was stirred at room temperature overnight. The obtained precipitate was filtered and washed with methanol, whereby Intermediate 2 was obtained at a yield of 92%.

Step 3: (Synthesis of Compound 5)

Under a nitrogen atmosphere, Intermediate 2 (0.25 mol), 2-phenylpyridine (1.0 mol), a ruthenium complex [($\eta_6$-$C_6B_6$)$RuCl_2$]$_2$ (0.05 mol), triphenylphosphine (0.2 mol) and potassium carbonate (12 mol) were mixed in 3 L of NMP (N-methyl-2-pyrrolidone), and the mixture was stirred at 140° C. overnight.

The reaction liquid was cooled to room temperature, 5 L of dichloromethane was added thereto, and the reaction liquid was filtered. The solvent was then distilled off from the filtrate under a reduced pressure atmosphere (800 Pa, 80° C.), and the residue thereof was purified by silica gel flush chromatography ($CH_2Cl_2$:$Et_3N$=20:1 to 10:1).

Under a reduced pressure atmosphere, the solvent was distilled off from the purified product, and the residue thereof was dissolved again in dichloromethane and washed with water three times. The substance obtained by the washing was dried over anhydrous magnesium sulfate, and the solvent was distilled off from the substance after the drying under a reduced pressure atmosphere, whereby compound 5 was obtained at a yield of 68%.

[Film Formation Method for Nitrogen-Containing Layer 1a]

In the case when the nitrogen-containing layer 1a as mentioned above is formed on the substrate 11 by film formation, examples of the film formation method include methods using wet processes such as an application process, an inkjet process, a coating process and a dipping process, and methods using dry processes such as deposition processes (resistance heating, an EB process and the like), a sputtering process and a CVD process, and the like. Among these, a deposition process is preferably used.

Specifically, in the case when the nitrogen-containing layer 1a is formed by film formation by using plural compounds, co-deposition in which plural compounds are simultaneously fed from plural deposition sources are used. Alternatively, in the case when a polymer material is used as the compound, an application process is preferably used. In this case, an application liquid in which the compound is dissolved in a solvent is used. The solvent for dissolving the compound is not limited. Furthermore, in the case when the nitrogen-containing layer 1a is formed by film formation by using plural compounds, the application liquid may be prepared by using a solvent that can solve the plural compounds.

<Electrode Layer 1b>

The electrode layer 1b is a layer constituted by using silver as a main component, and is a layer that is constituted by using silver or an alloy containing silver as a main component and formed by film formation adjacent to the nitrogen-containing layer 1a.

Examples of the alloy containing silver (Ag) as a main component for constituting the electrode layer 1b include silver magnesium (AgMg), silver copper (AgCu), silver palladium (AgPd), silver palladium copper (AgPdCu), silver indium (AgIn), silver aluminum (AgAl) and the like.

In the electrode layer 1b as mentioned above, plural layers of silver or an alloy containing silver as a main component may be stacked where necessary.

Furthermore, it is preferable that the electrode layer 1b has a film thickness in the range of from 4 to 12 nm. The film thickness of 12 nm or less is preferable since the absorbed component or reflected component into/on the layer is reduced to maintain the light transmittance of the transparent electrode. Furthermore, the film thickness of 4 nm or more also ensures the electroconductivity of the layer.

[Method for Film Formation of Electrode Layer 1b]

Examples of the film formation method for the electrode layer 1b mentioned above include methods using wet processes such as an application process, an inkjet process, a coating process and a dipping process, methods using dry processes such as a deposition process (resistance heating, an EB process and the like), a sputtering process and a CVD process, and the like.

For example, in the film formation for the electrode layer 1b using a sputtering process, a sputter target of an alloy containing silver as a main component is provided, and sputter film formation using this sputter target is conducted. The film formation for the electrode layer 1b using a sputtering process is conducted in all cases for the above-mentioned alloys, and specifically in the case when silver copper (AgCu), silver palladium (AgPd) or silver palladium copper (AgPdCu) is formed into a film, film formation for the electrode layer 1b using a sputtering process is conducted.

Furthermore, specifically in the case when silver aluminum (AgAl), silver magnesium (AgMg) or silver indium (AgIn) is formed into a film, film formation of the electrode layer 1b using a deposition process is also conducted. In the case of a deposition process, an alloy component and silver (Ag) are co-deposited. At this time, deposition film formation in which the concentration of the alloy component added to the silver (Ag) as a main material is adjusted by adjusting the deposition velocity of the alloy component and the deposition velocity of the silver (Ag) is conducted.

Furthermore, although the electrode layer 1b is characterized by having a sufficient electroconductivity by being formed into a film on the nitrogen-containing layer 1a, even without a high temperature annealing treatment and the like after the film formation of the electrode layer 1b. However, where necessary, the high temperature annealing treatment and the like may be conducted after the film formation.

<High-Refractive Index Layers H1 and H2>

The high-refractive index layers H1 and H2 are layers each having a higher refractive index than that of the nitrogen-containing layer 1a. The high-refractive index layers H1 and H2 have such a refractive index that a refractive index (n) at a wavelength of 550 nm is preferably 0.1 or more higher, more preferably 0.3 or more higher than the refractive index of the nitrogen-containing layer 1a (n=1.6 to 1.8). Typically, high-refractive index layers are preferably layers each having a refractive index (n) at a wavelength of 550 nm of 2.0 or more.

Examples of such high-refractive index layers H1 and H2 include high-refractive index materials and materials that are generally used in optical films, and for example, the layers are constituted by an oxide containing indium oxide ($In_2O_3$), zinc oxide (ZnO), titanium oxide ($TiO_2$) or niobium oxide ($Nb_2O_5$) as a main component. Examples of such oxides include titanium oxide ($TiO_2$:n=2.3 to 2.4), indium tin oxide (ITO: n=2.1 to 2.2), indium zinc oxide ($In_2O_3$+ZnO:n=2.0 to 2.4, for example, IZO), zinc oxide (ZnO:n=1.9 to 2.0), niobium oxide ($Nb_2O_5$:n=2.2 to 2.4) and the like. Such high-refractive index materials are preferable since they suppress the reflection of the transparent electrode.

In addition to the material mentioned above, hafnium oxide ($HfO_2$:n=1.9 to 2.1), tantalum pentoxide ($Ta_2O_5$: n=2.16), cerium oxide ($CeO_2$:n=2.2), cadmium oxide (CdO: n=2.49), zirconium oxide (ZrO:n=2.4) and the like are used as the high-refractive index layers H1 and H2.

Furthermore, in the case when the respective high-refractive index layers H1 and H2 are constituted by an electroconductive material, these are not used as main electrodes. Therefore, it is not necessary that the respective high-refractive index layers H1 and H2 have film thicknesses required for electrodes, and it is sufficient that the high-refractive index layers have film thicknesses that are suitably preset according to the state of disposition of the transparent electrode 1 having these high-refractive index layers H1 and H2 in the electronic device in which the transparent electrode 1 is used.

The two high-refractive index layers H1 and H2 as mentioned above may be constituted by an identical material, or may be constituted by different materials. Furthermore, the high-refractive index layers may have an identical film thickness, or may have different film thicknesses.

[Film Formation Method for High-Refractive Index Layers H1 and H2]

In the case when the high-refractive index layers H1 and H2 as mentioned above are formed by film formation on the substrate 11, the film formation method therefor may be a deposition process (resistance heating, an EB process or the like) or a sputtering process. Specifically, in the case of EB deposition, a method using ion assist is preferable. For such film formation method for the high-refractive index layers H1 and H2, a suitable method is selected depending on the material that constitutes these layers. For example, in the film formation for the high-refractive index layers H1 and H2 using zinc oxide (ZnO) or titanium oxide ($TiO_2$), a deposition process is used. Alternatively, in the film formation for the high-refractive index layers H1 and H2 using indium oxide ($In_2O_3$), indium tin oxide (ITO) or niobium oxide ($Nb_2O_5$), a sputtering process is used.

Although illustration herein is omitted, the transparent electrode 1 may further have low-refractive index layers that are in contact with the outer sides of the high-refractive index layers H1 and H2, for the purpose of improving the light transmission property. Such low-refractive index layers are layers each having a lower refractive index than that of the high-refractive index layers H1 and H2. Specifically, the low-refractive index layers each have a refractive index at a wavelength of 550 nm of preferably 0.1 or more lower than that of the high-refractive index layers H1 and H2, more preferably 0.3 or more lower than that of the high-refractive index layers H1 and H2. Such low-refractive index layers are constituted by a material having a low refractive index and a light transmission property. Examples include low-refractive index materials such as magnesium fluoride ($MgF_2$), lithium fluoride (LiF), calcium fluoride ($CaF_2$) and aluminum fluoride ($AlF_3$), and materials that are generally used in optical films.

Furthermore, the transparent electrode 1 as mentioned above may be covered with a protective film, or another electroconductive layer may be stacked thereon, in the state that the transparent electrode 1 is sandwiched between the protective film or electroconductive layer and the substrate 11. In this case, it is preferable that the protective film and electroconductive layer have a light transmission property so that the light transmission property of the transparent electrode 1 is not deteriorated. Alternatively, a constitution in which an optional layer is disposed also between the transparent electrode 1 and the substrate 11 may be also formed.

<Effect of Transparent Electrode 1>

The transparent electrode 1 constituted as above has a constitution in which the electrode layer 1b containing silver as a main component is disposed adjacent to the nitrogen-containing layer 1a constituted by the compound containing a nitrogen atom. By this way, in the film formation of the electrode layer 1b adjacent to the nitrogen-containing layer 1a, the silver atoms that constitute the electrode layer 1b interact with the compound containing a nitrogen atom which constitutes the nitrogen-containing layer 1a, whereby the diffusion distance of the silver atoms on the surface of the nitrogen-containing layer 1a is decreased, and thus the flocculation of the silver is suppressed. Therefore, a silver thin film, which is generally easily isolated in an insular form by the film growth in a nucleartion type (Volumer-Weber: VW type), is formed by monolayer growth-type (Frank-van der Merwe: FM type) film growth. Accordingly, it becomes possible to obtain the electrode layer 1b that has an even film thickness despite its thin film thickness.

Furthermore, specifically, by applying the above-mentioned effective non-covalent electron pair content rate [n/M] as an index of the bonding stability of the silver that constitutes the electrode layer 1b against the nitrogen-containing layer 1a, and by constituting the nitrogen-containing layer 1a using a compound having a value of this ratio of $2.0\times10^{-3} \leq [n/M]$, it becomes possible to dispose the nitrogen-containing layer 1a by which the effect of "suppressing the flocculation of silver" as mentioned above can be surely obtained. This is also confirmed from that the electrode layer 1b for which the sheet resistance can be measured despite that the electrode layer is an extremely thin film of 6 nm is formed on such nitrogen-containing layer 1a, as is explained in detail in the Examples mentioned below.

Furthermore, by forming a four-layer structure in which the nitrogen-containing layer 1a and the electrode layer 1b are sandwiched by the high-refractive index layers H1 and H2 each having a higher refractive index than that of the nitrogen-containing layer 1a, light reflection in the transparent electrode 1 is prevented, and improvement of the light transmission property by this way can also be expected. Furthermore, since the material that constitutes the high-refractive index layers H1 and H2 generally has a dense film property, the migration of the silver (Ag) that constitutes the electrode layer 1b can be prevented also by disposing high-refractive index layer H2 having a dense film property adjacent to the electrode layer 1b.

Therefore, in this transparent electrode 1, the electrode layer 1b in which the light transmission property is ensured by its thin film thickness and the electroconductivity is ensured by its even film thickness can be surely obtained, and improvement of the light transmission property by the prevention of the light reflection can be expected. By this way, it is possible to improve both the electroconductivity the light transmission property at the same time in the transparent electrode 1 using silver, and to improve the reliability of the electrode layer 1*b* by maintaining the film property.

Furthermore, since the cost for such transparent electrode 1 is low since indium (In), which is a rare metal, is not used, and the transparent electrode 1 is excellent in long-term reliability since chemically unstable materials such as ZnO are not used.

<<2. Use of Transparent Electrode>>

The transparent electrode 1 having the above-mentioned constitution can be used for various electronic devices. Examples of the electronic devices include organic electroluminescent elements, LEDs (light Emitting Diodes), liquid crystal elements, solar batteries, touch panels and the like, and the above-mentioned transparent electrode 1 can be used as an electrode element requiring a light transmission property in these electronic devices.

An embodiment of an organic electroluminescent element including transparent electrodes as a cathode and an anode will be explained below as an example of use.

<<3. Organic Electroluminescent Element>>

<Constitution of Organic Electroluminescent Element Including Transparent Electrodes>

Figure 7:
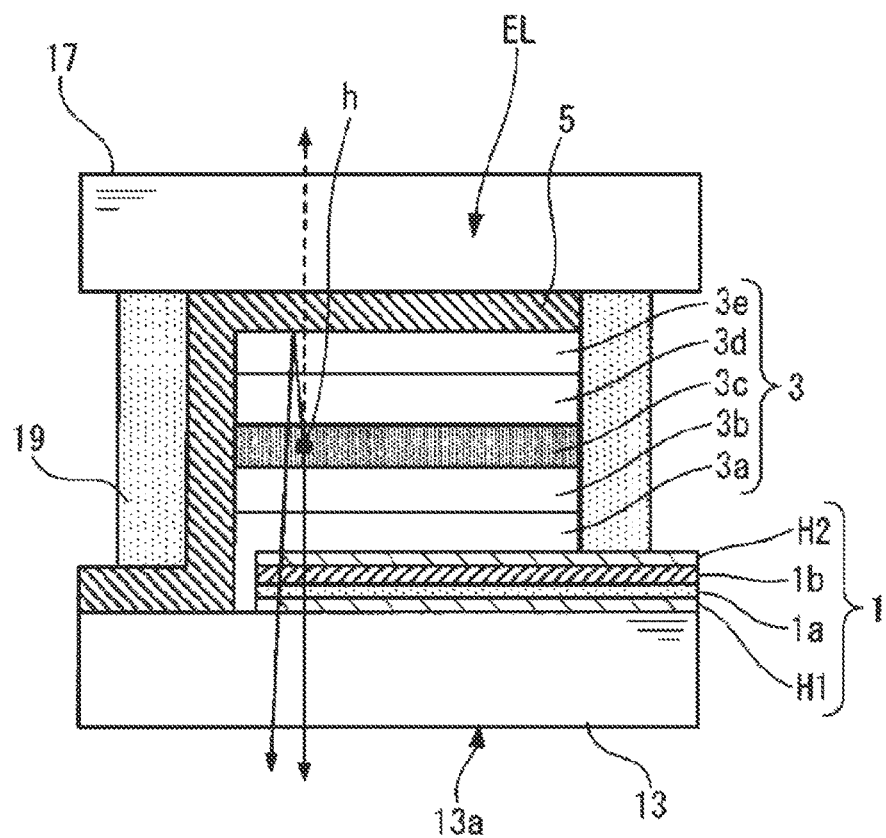
FIG. 7 is a cross-sectional constitutional drawing showing an example of an organic electroluminescent element including the transparent electrode of the present invention.

FIG. 7 is a cross-sectional constitutional drawing showing a constitutional example of an organic electroluminescent element including the above-mentioned transparent electrode 1 as an example of the electronic device of the present invention. The constitution of the organic electroluminescent element will be explained below based on this drawing.

An organic electroluminescent element EL shown in FIG. 7 is disposed on a transparent substrate 13, and a transparent electrode 1, a luminescent functional layer 3 (a hole injection layer 3*a*/a hole transport layer 3*b*/a luminescent layer 3*c*/an electron transport layer 3*d*/an electron injection layer 3*e*) and a counter electrode 5 are stacked in this order from the side of the transparent substrate 13. Specifically, the organic electroluminescent element EL is characterized by including the transparent electrode 1 of the present invention explained above as the transparent electrode 1. Accordingly, the organic electroluminescent element EL according to the present exemplary embodiment is constituted as a bottom emission type in which luminescent light h is extracted from at least the side of the transparent substrate 13.

Although the example shown in FIG. 7 has a constitution in which the transparent electrode 1 is disposed on the side of the anode (i.e., the anode), the constitution may also be a reverse stack type by being used as a cathode (i.e., a cathode).

Furthermore, the whole layer structure of the organic electroluminescent element EL is not limited, and may be a general layer structure. For example, in the organic electroluminescent element EL, the transparent electrode 1 may be disposes as an upper electrode on the luminescent functional layer 3, and in this case, the organic electroluminescent element EL has a constitution in which the counter electrode 5 is disposed as a lower electrode of the luminescent functional layer 3. Furthermore, the transparent electrodes 1 may be disposed as upper and lower electrodes for the luminescent functional layer 3.

<Constitutional Layers of Organic Electroluminescent Element>

Typical constitutions of the organic electroluminescent element EL of the present invention may include, but are not limited to, the following constitutions.

(1) an anode/a luminescent layer/a cathode (2) an anode/a luminescent layer/an electron transport layer/a cathode (3) an anode/a hole transport layer/a luminescent layer/a cathode (4) an anode/a hole transport layer/a luminescent layer/an electron transport layer/a cathode (5) an anode/a hole transport layer/a luminescent layer/an electron transport layer/an electron injection layer/a cathode (6) an anode/a hole injection layer/a hole transport layer/a luminescent layer/an electron transport layer/a cathode (7) an anode/a hole injection layer/a hole transport layer/ (an electron blocking layer/) a luminescent layer/(a hole blocking layer/) an electron transport layer/an electron injection layer/a cathode Among the constitutions mentioned above, the constitution of (7) is preferably used, but the constitution is not limited to this. In the above-mentioned typical constitutions for the element, the layers other than the anodes and cathodes are luminescent functional layers 3 having a luminescent property. Furthermore, the anode or cathode is constituted by either of the transparent electrode 1 or counter electrode 5 of the present application.

<Luminescent Functional Layer 3>

The luminescent functional layer 3 is a layer that is sandwiched between the transparent electrode 1 and the counter electrode 5, and constitutes the organic electroluminescent element EL together with the transparent electrode 1 and the counter electrode 5. This luminescent functional layer 3 may have a layer structure of a luminescent functional layer in a general organic electroluminescent element, and essentially has a luminescent layer 3*c* that is constituted by an organic material.

In the above-mentioned constitution, the luminescent layer 3*c* is constituted by a single layer or plural layers. In the case when the luminescent layer 3*c* is constituted by plural layers, non-luminescent intermediate layers may be disposed between the respective luminescent layers. Furthermore, where necessary, a hole blocking layer (also referred to as a hole barrier layer) or an electron injection layer 3*e* (also referred to as a cathode buffer layer) may be disposed between the luminescent layer 3*c* and the cathode, and an electron blocking layer (also referred to as an electron barrier layer) or a hole injection layer 3*a* (also referred to as an anode buffer layer) may be disposed between the luminescent layer and the anode.

The electron transport layer 3*d* is a layer having a function to transport electrons, and an electron injection layer and a hole blocking layer are also encompassed in the electron transport layer 3*d* in a broad sense. Furthermore, the hole transport layer 3*b* is a layer having a function to transport holes, and a hole injection layer and an electron blocking layer are also encompassed in the hole transport layer 3*b* in broad sense.

Furthermore, the electron transport layer 3*d* and the hole transport layer 3*b* may be constituted by plural layers.

(Tandem Structure)

Alternatively, the organic electroluminescent element may be an element having a so-called tandem structure in which plural luminescent units each including at least one luminescent layer are stacked.

The luminescent unit is, for example, a constitution in which the anode and cathode have been removed from any of the constitutions of (1) to (7) as exemplified in the above-mentioned typical element constitutions. Furthermore, in the constitution of the above-mentioned organic electroluminescent element EL, the luminescent unit corresponds to the luminescent functional layer 3 having a luminescent property.

As the typical element constitutions for the tandem structure, for example, the following constitutions can be exemplified.

(1.1) an anode/a first luminescent unit/an intermediate layer/a second luminescent unit/a cathode (2.2) an anode/a first luminescent unit/an intermediate layer/a second luminescent unit/an intermediate layer/a third luminescent unit/a cathode All of the above-mentioned first luminescent unit, second luminescent unit and third luminescent unit may be identical or different. Alternatively, the two luminescent units may be identical and the other one may be different.

Furthermore, the plural luminescent units may be directly stacked, or may be stacked via intermediate layers, and the intermediate layers are generally also referred to as intermediate electrodes, intermediate electroconductive layers, electrical charge generating layers, electron withdrawing layers, connecting layers or intermediate insulating layers, and known material constitutions can be used as long as they are layers having a function to feed electrons to the adjacent layer at the anode side and to feed holes to the adjacent layer at the cathode side.

Examples of the material used for the intermediate layer include electroconductive inorganic compound layers such as ITO (indium-tin oxide), IZO (indium-zinc oxide), $ZnO_2$, TiN, ZrN, HfN, $TiO_x$, $VO_x$, CuI, InN, GaN, $CuAlO_2$, $CuGaO_2$, $SrCu_2O_2$, $LaB_6$, $RuO_2$ and Al, bilayer films such as $Au/Bi_2O_3$, multilayer films such as $SnO_2/Ag/SnO_2$, $ZnO/Ag/ZnO$, $Bi_2O_3/Au/Bi_2O_3$, $TiO_2/TiN/TiO_2$ and $TiO_2/ZrN/TiO_2$, as well as electroconductive organic substance layers of fullelenes such as C60, oligothiophenes and the like, and electroconductive organic compound layers such as metal phthalocyanines, and non-metal phthalocyanines, metal porphyrins, non-metal porphyrins, and the like, but the present invention is not limited to these.

Examples of the preferable constitution in the luminescent unit include the constitutions of (1) to (7) listed in the above-mentioned typical element constitutions, but the present invention is not limited to these.

Specific examples of the tandem type organic electroluminescent element include element constitutions and constitutional materials and the like described in U.S. Pat. No. 6,337,492 B, U.S. Pat. No. 7,420,203 B, U.S. Pat. No. 7,473,923 B, U.S. Pat. No. 6,872,472 B, U.S. Pat. No. 6,107,734 B, U.S. Pat. No. 6,337,492 B, WO 2005/009087 A, JP 2006-228712 A, JP 2006-24791 A, JP 2006-49393 A, JP 2006-49394 A, JP 2006-49396 A, JP 2011-96679 A, JP 2005-340187 A, JP 4711424 B, JP 3496681 B, JP 3884564 B, JP 4213169 A, JP 2010-192719 A, JP 2009-076929 A, JP 2008-078414 A, JP 2007-059848 A, JP 2003-272860 A, JP 2003-045676 A, WO 2005/094130 A and the like, but the present invention is not limited to these.

The respective layers that constitute the organic electroluminescent element EL of the present invention will be explained below.

[Luminescent Layer 3c]

The luminescent layer 3c is a layer that provides a place where the electrons and holes injected from the electrode or adjacent layer are bound again and emit light through excitons, and the part where light is emitted may be in the layer of the luminescent layer 3c or at the interface of the luminescent layer 3c and the adjacent layer. The constitution of the luminescent layer 3c in the present invention is not specifically limited as long as it satisfies the requirements defined in the present invention.

The total mass of the film thickness of the luminescent layer 3c is not specifically limited, but is adjusted to be preferably in the range of from 2 nm to 5 µm, more preferably in the range of from 2 nm to 500 nm, still more preferably in the range of from 5 nm to 200 nm, from the viewpoints of the homogeneity of the film to be formed and prevention of a high voltage that is unnecessary during emission of light, and improvement of the stability of the color of the luminescence against a driving electrical current.

Furthermore, the film thickness of each luminescent layer 3c is preferably adjusted to be in the range from 2 nm to 1 µm, more preferably adjusted to be in the range from 2 nm to 200 nm, still more preferably adjusted to be in the range from 3 nm to 150 nm.

The luminescent layer 3c preferably contains a luminescent dopant (also referred to as a luminescent dopant compound or a dopant compound, or simply referred to as a dopant) and a host compound (also referred to as a matrix material or a luminescent host compound, or simply referred to as a host).

(1. Luminescent Dopant)

The luminescent dopant used in the luminescent layer 3c will be explained.

As the luminescent dopant, a fluorescence luminescent dopant (also referred to as a fluorescent dopant or a fluorescent compound) and a phosphorescent luminescent dopant (also referred to as a phosphorescent dopant or a phosphorescent compound) are preferably used. In the present invention, it is preferable that at least one luminescent layer 3c contains a phosphorescent luminescent dopant.

The concentration of the luminescent dopant in the luminescent layer 3c can be arbitrary determined based on the specific dopant used and the necessary conditions of the device, and the luminescent dopant may be contained at an even concentration in the film thickness direction of the luminescent layer 3c, or may have an arbitrary concentration distribution.

Furthermore, plural kinds of luminescent dopants may be used in combination, and a combination of dopants having different structures, or a combination of a fluorescent dopant and a phosphorescent luminescent dopant may be used. By this way, an arbitrary luminescent color can be obtained.

The color of the luminescence by the organic electroluminescent element EL is determined by a color when a result of a measurement by a spectral radiance meter CS-2000 (manufactured by Konica Minolta Sensing, Inc.) is put into the CIE color chromaticity coordinates in FIG. 4.16 on page 108 of "Handbook of Color Science, New Edition" (edited by the Color Science Association of Japan, University of Tokyo Press, 1985).

It is also preferable that the organic electroluminescent element EL is such that the luminescent layer 3c having one layer or plural layers contains plural luminescent dopants having different luminescence colors and thus shows white luminescence.

The combination of the luminescent dopants showing white is not specifically limited, and examples include combinations of blue and orange, and of blue, green and red, and the like.

The white in the organic electroluminescent element EL of the present invention is preferably such that a chromaticity in the CIE1931 colorimetric system at 1000 $cd/m^2$ when a front luminance on a visual field angle of 2° is measured by the above-mentioned method is in the region of x=0.39±0.09 and y=0.38±0.08.

(1-1. Phosphorescent Luminescent Dopant)

The phosphorescent luminescent dopant (hereinafter referred to as "phosphorescent dopant") will be explained.

The phosphorescent dopant in the present invention is a compound in which luminescence from an excited triplet is observed, and is specifically defined as a compound that emits phosphorescence at room temperature (25° C.) and has a phosphorescence quantum yield of 0.01 or more at 25° C., and a preferable phosphorescence quantum yield is 0.1 or more.

The above-mentioned phosphorescence quantum yield can be measured by the method described in the 4th Edition of Experimental Chemistry 7, Spectroscopy II, page 398 (1992, Maruzen). The phosphorescence quantum yield in the solution can be measured by using various solvents, and it is sufficient that the phosphorescent dopant in the present invention achieves the above-mentioned phosphorescence quantum yield (0.01 or more) in any solvent.

Two kinds of luminescences of the phosphorescent dopant are principally exemplified, and one of which is an energy transfer type in which re-bonding of a carrier occurs on a host compound on which the carrier is transported, whereby an excite state of the host compound is generated, and the energy of this is transferred to the phosphorescent dopant to obtain luminescence from the phosphorescent dopant. The other is a carrier trap type in which the phosphorescent dopant acts as a carrier trap, and the re-bonding of the carrier occurs on the phosphorescent dopant, whereby luminescence from the phosphorescent dopant can be obtained. In either case, the condition is such that the energy of the excite state of the phosphorescent dopant is lower than the energy of the excite state of the host compound.

The phosphorescent dopant can be suitably selected from known ones that are used in luminescent layers of organic electroluminescent elements, and used.

Specific examples of known phosphorescent dopants that can be used in the present invention include the compounds described in the following publications, and the like.

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009100991 A, WO 2008101842 A, WO 2003040257 A, US 2006835469 A, US 20060202194 A, US 20070087321 A and US 20050244673 A.

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009050290 A, WO 2002015645 A, WO 2009000673 A, US 20020034656 A, U.S. Pat. No. 7,332,232 B, US 20090108737 A, US 20090039776 A, U.S. Pat. No. 6,921,915 B, U.S. Pat. No. 6,687,266 B, US 20070190359 A, US 20060008670 A, US 20090165846 A, US 20080015355, U.S. Pat. No. 7,250,226 B, U.S. Pat. No. 7,396,598 B, US 20060263635 A, US 20030138657 A, US 20030152802 A and U.S. Pat. No. 7,090,928 B.

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002002714 A, WO 2006009024 A, WO 2006056418 A, WO 2005019373 A, WO 2005123873 A, WO 2005123873 A, WO 2007004380 A, WO 2006082742 A, US 20060251923 A, US 20050260441, U.S. Pat. No. 7,393,599 B, U.S. Pat. No. 7,534,505 B, U.S. Pat. No. 7,445,855 B, US 20070190359 A, US 20080297033 A, U.S. Pat. No. 7,338,722 B, US 20020134984 A, U.S. Pat. No. 7,279,704 B, US 2006098120 A and US 2006103874 A.

WO 2005076380 A, WO 2010032663 A, WO 2008140115 A, WO 2007052431 A, WO 2011134013 A, WO 2011157339 A, WO 2010086089 A, WO 2009113646 A, WO 2012020327 A, WO 2011051404 A, WO 2011004639 A, WO 2011073149 A, US 2012228583 A, US 2012212126 A, JP 2012-069737 A, JP 2012-195554 A, JP 2009-114086 A, JP 2003-81988 A, JP 2002-302671 A, JP 2002-363552 A, and the like.

Among these, preferable phosphorescent dopants include organic metal complexes having Ir as a center metal. More preferably, complexes containing at least one coordinate manner from a metal-carbon bond, a metal-nitrogen bond, a metal-oxygen bond and a metal-sulfur bond.

Specific examples D1 to D81 of known phosphorescent dopants that can be applied to the luminescent layer 3c will be exemplified below, but the present invention is not limited to these phosphorescent dopants.

[Chemical Formula 69]

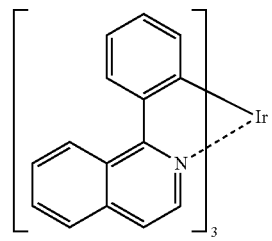

D-1

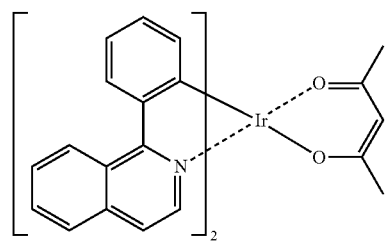

D-2

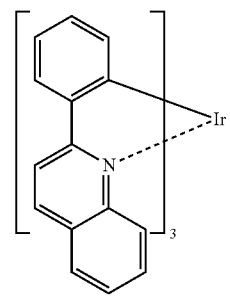

D-3

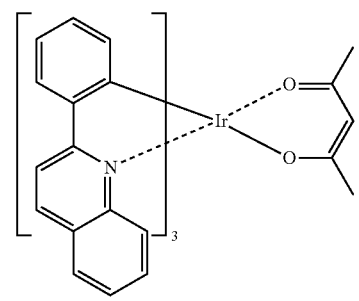

D-4

D-5 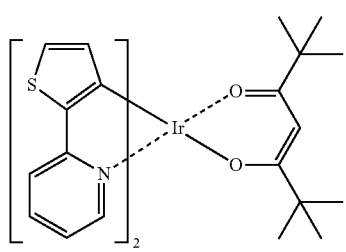
D-6 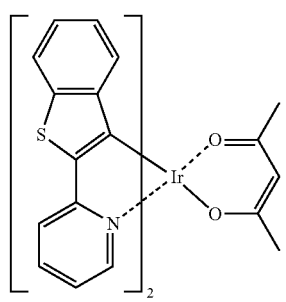
D-7 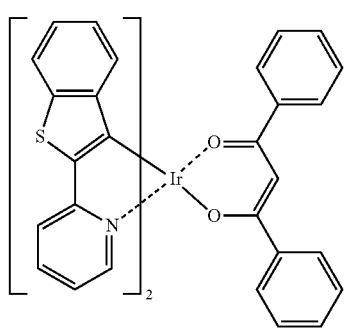
D-8 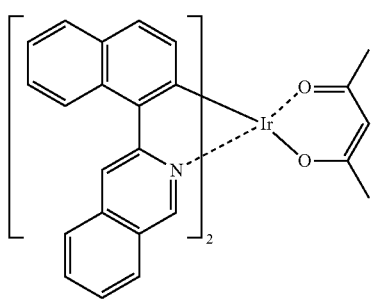
D-9 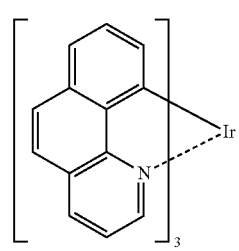
D-10 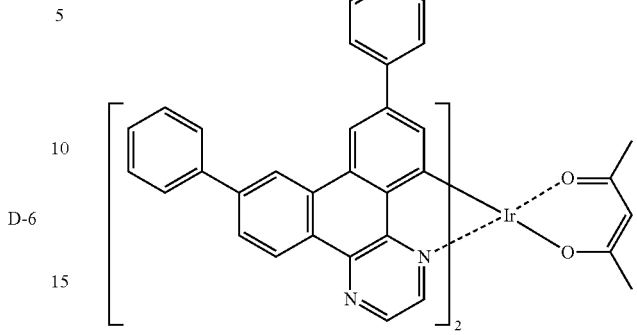
D-11 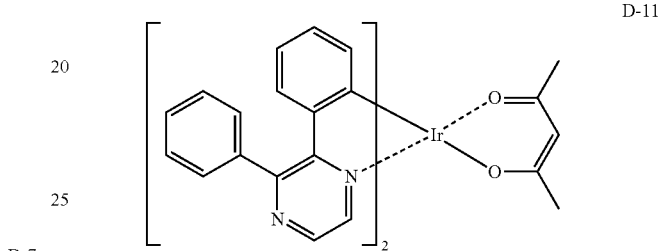
D-12 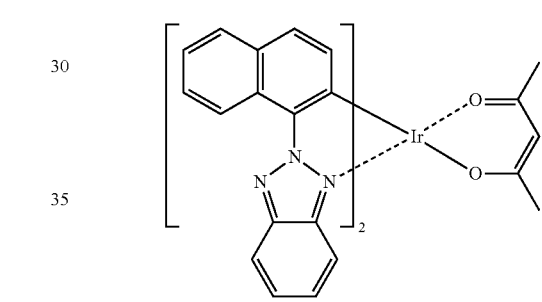
D-13 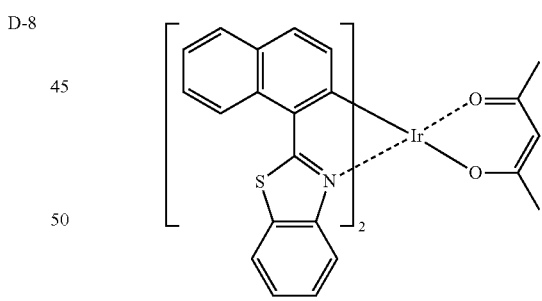
D-14 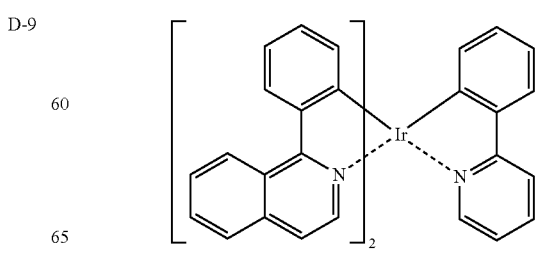

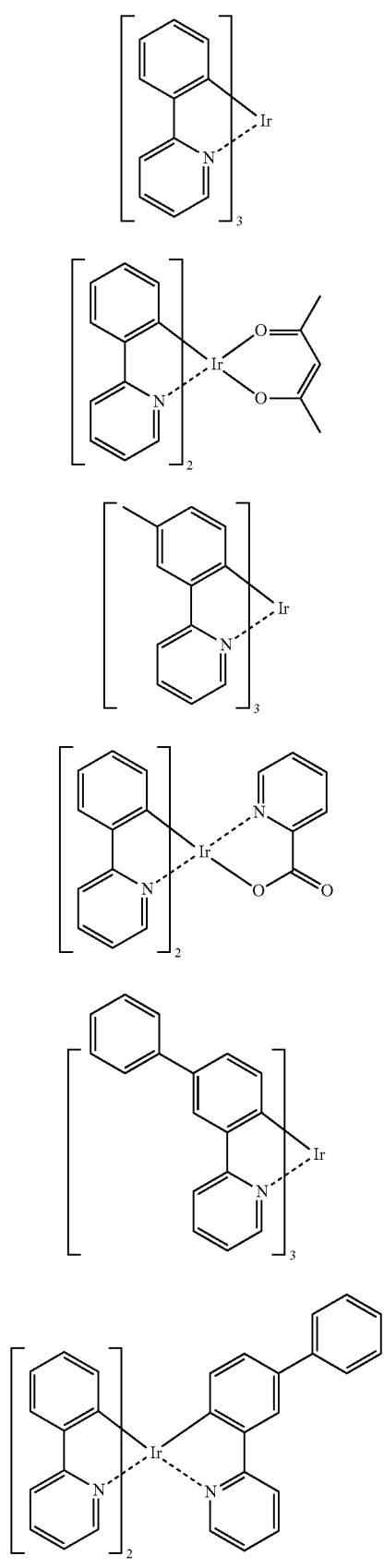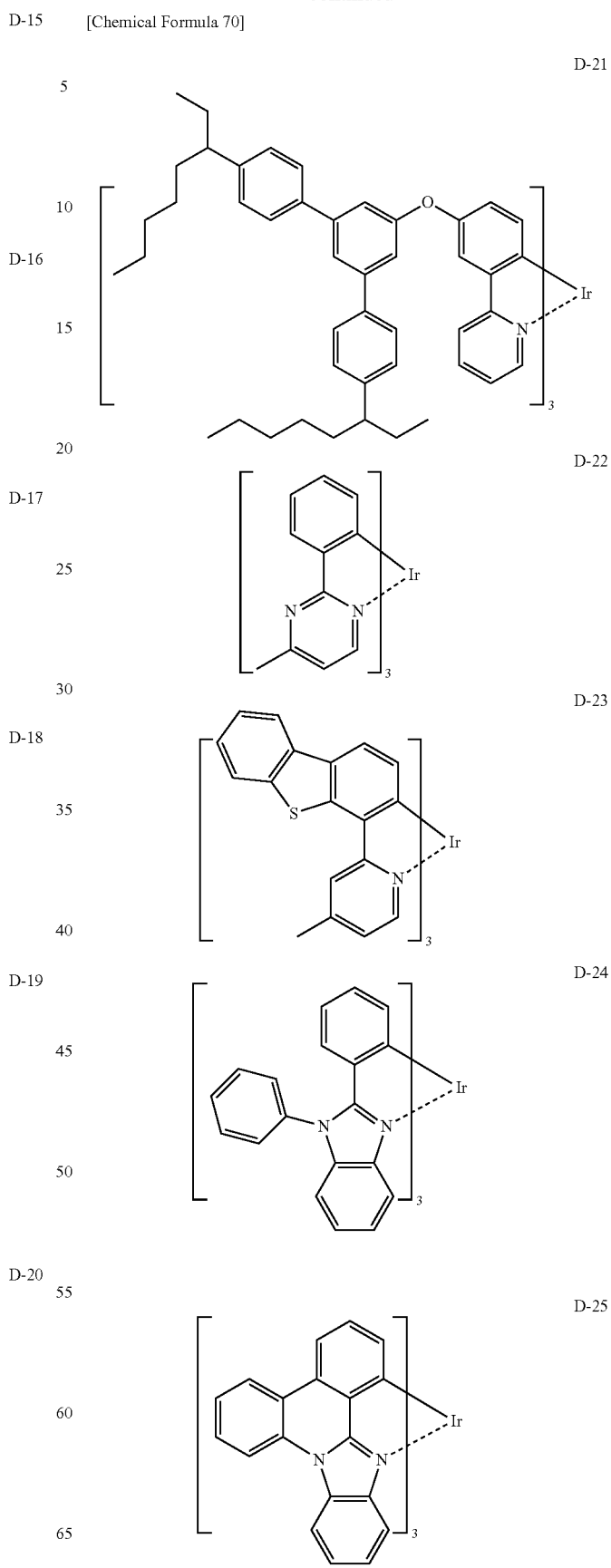

D-26 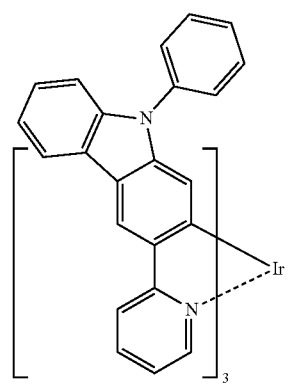
D-27 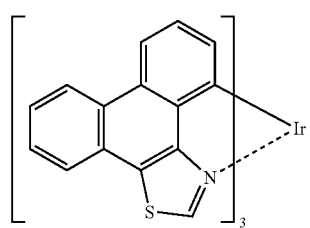
D-28 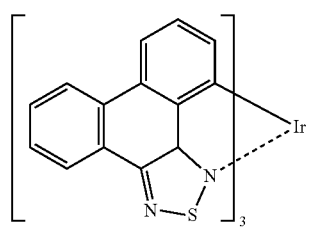
D-29 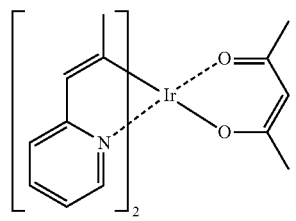
D-30 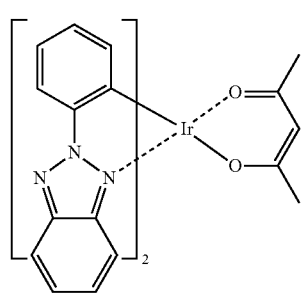
D-31 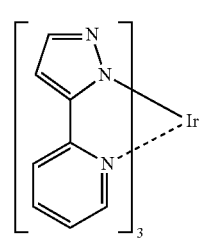
D-32 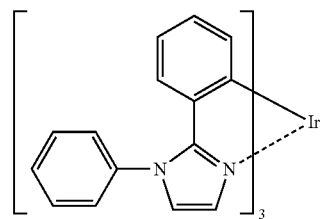
D-33 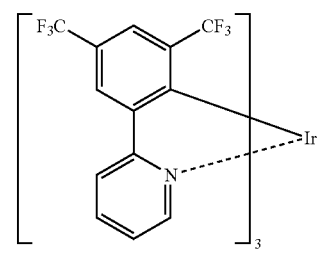
D-34 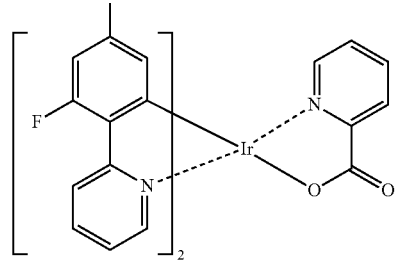
D-35 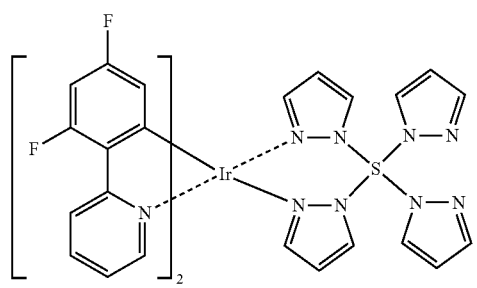
D-36 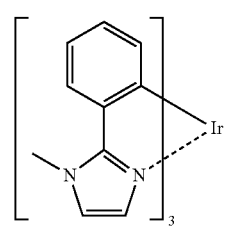
D-37 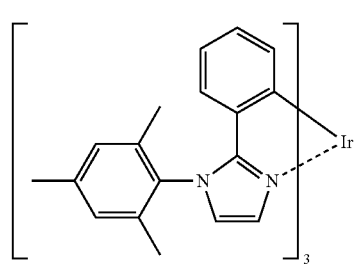

D-38
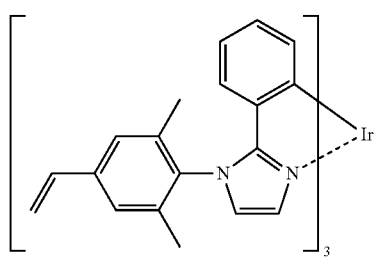
D-39
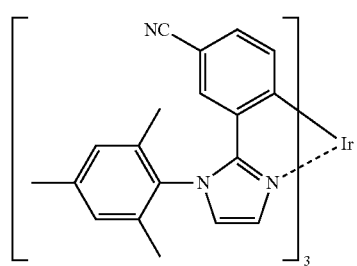
D-40
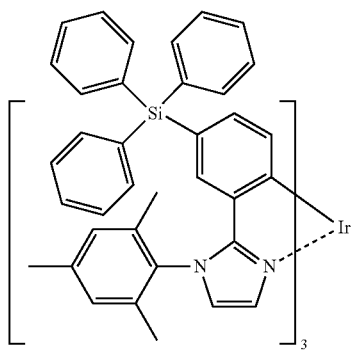
[Chemical Formula 71]
D-41
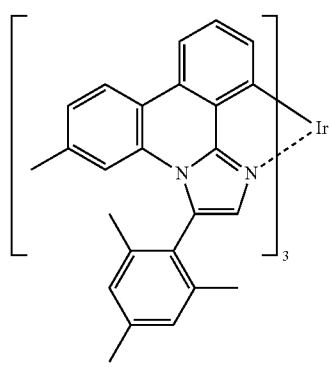
D-42
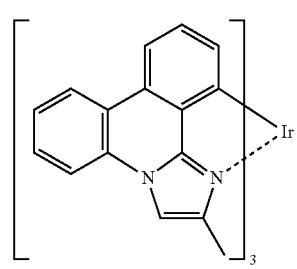
D-43
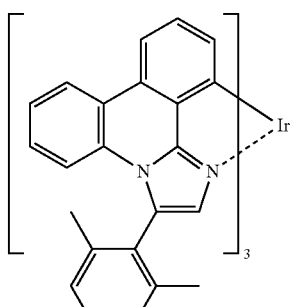
D-44
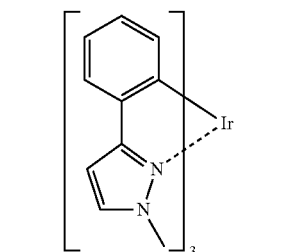
D-45
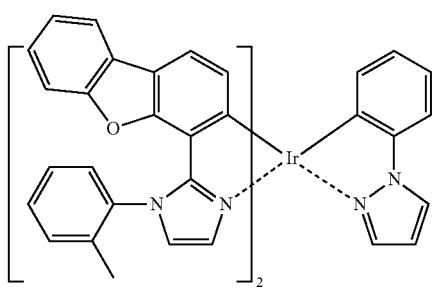
D-46
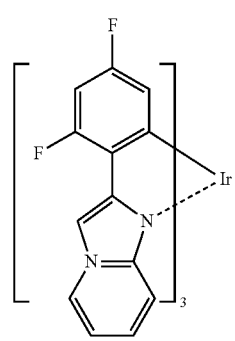
D-47

D-48
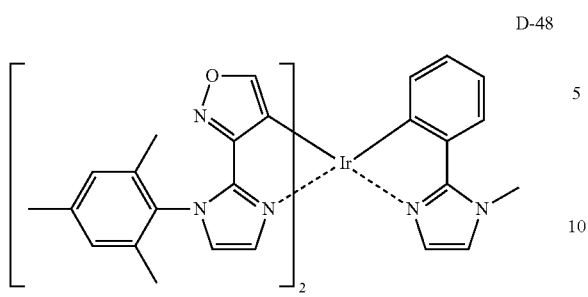
D-49
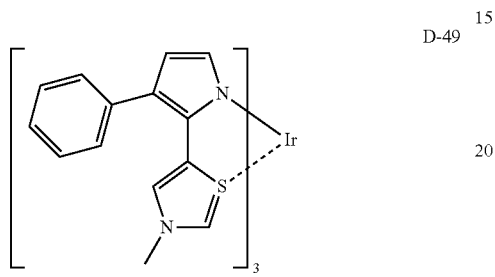
D-50
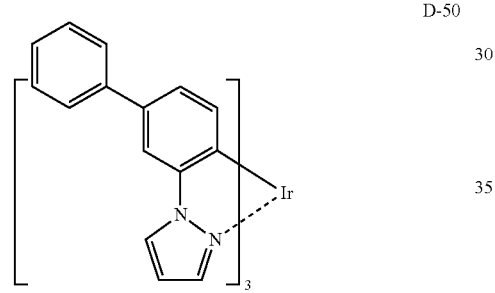
D-51
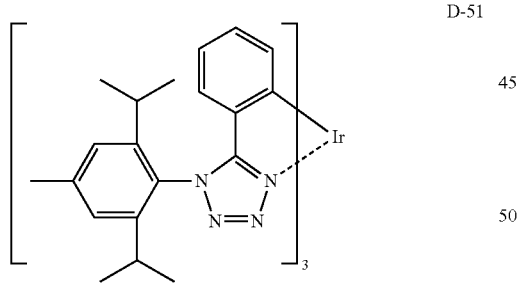
D-52
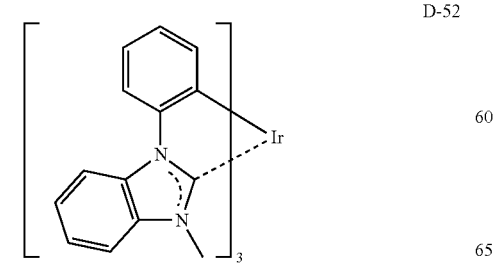
D-53
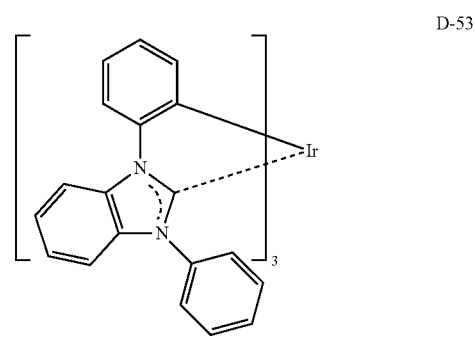
D-54
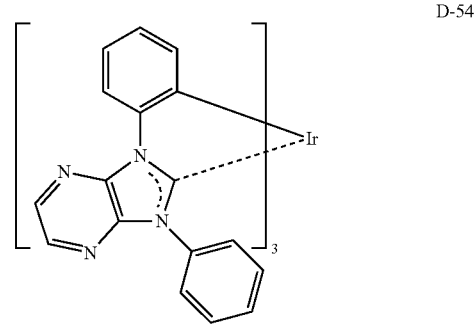
D-55
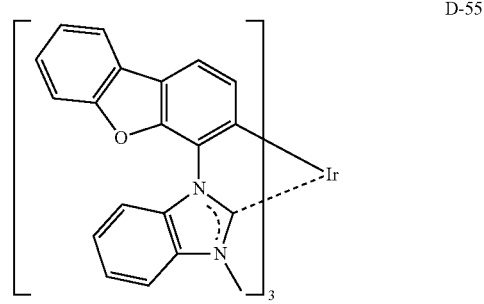
D-56
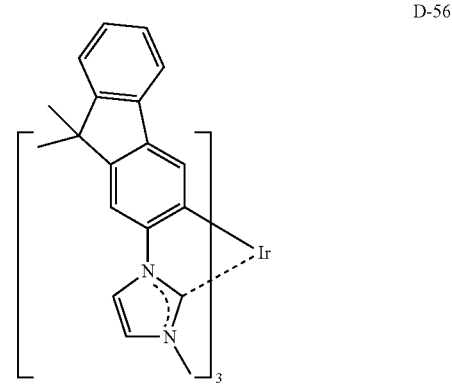

D-57
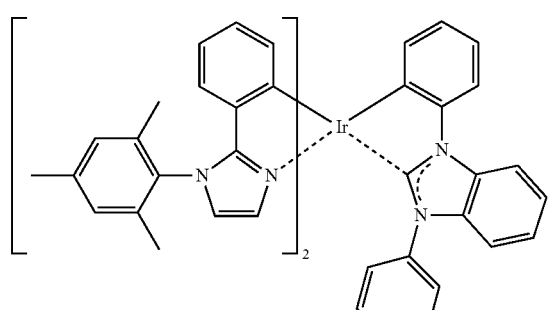
D-58
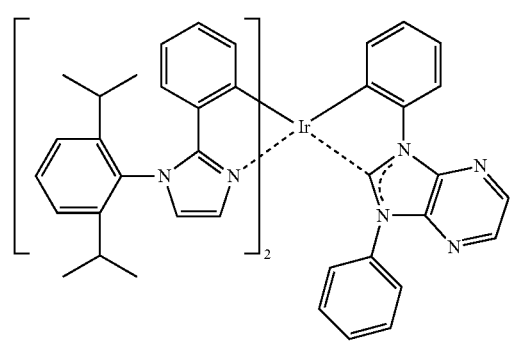
[Chemical Formula 72]
D-59
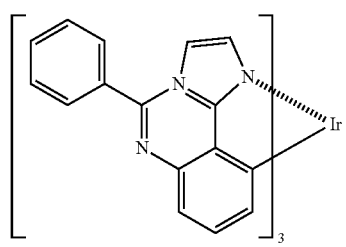
D-60
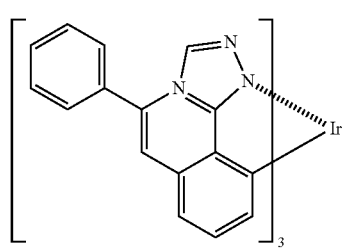
D-61
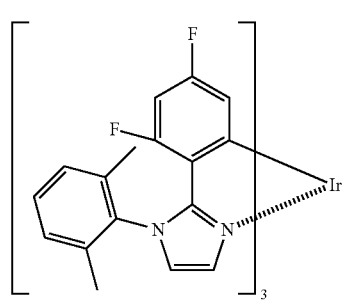
D-62
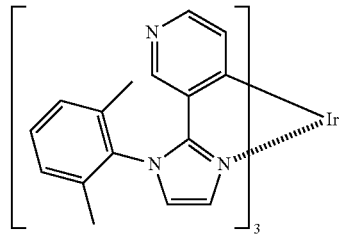
D-63
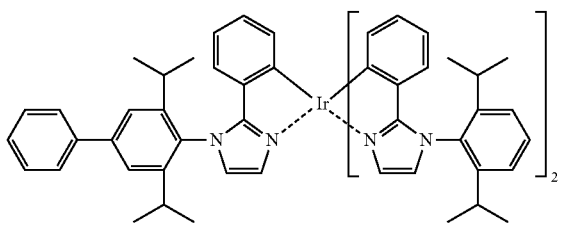
D-64
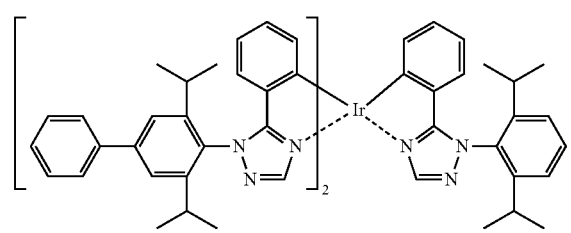
D-65
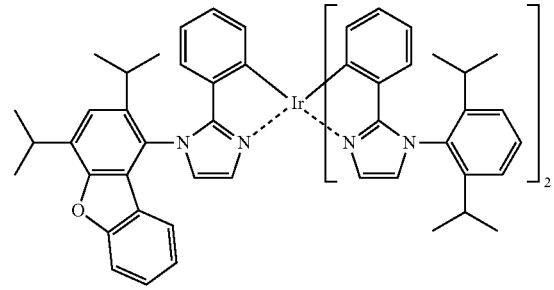
D-66

-continued
D-67
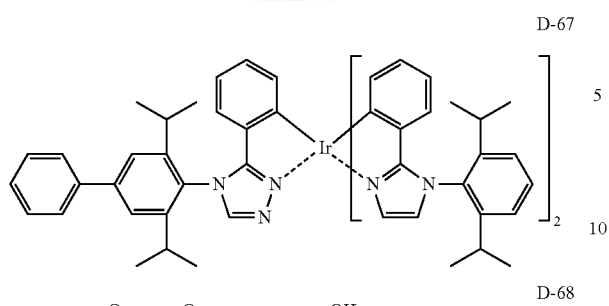
D-68
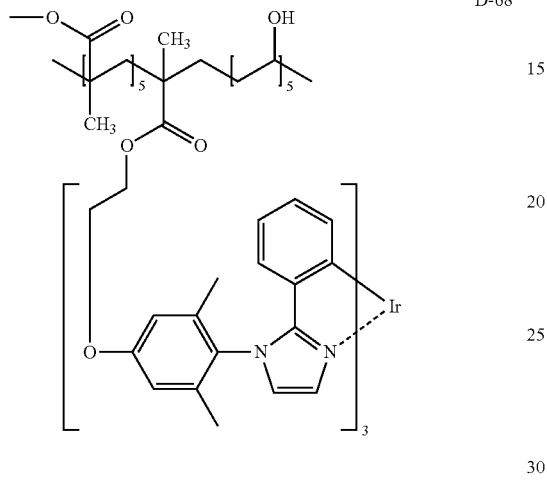
D-69
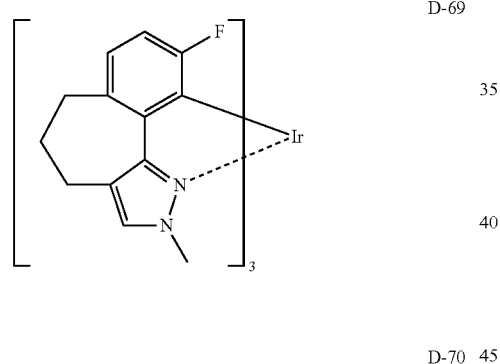
D-70
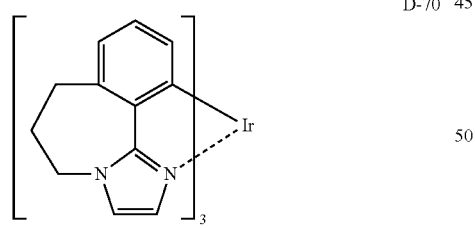
D-71
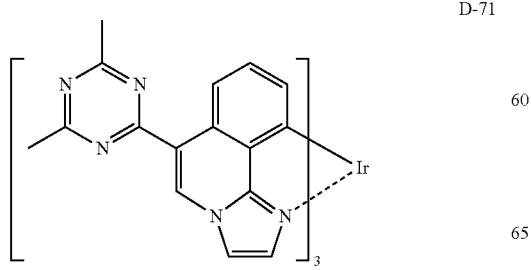
-continued
D-72
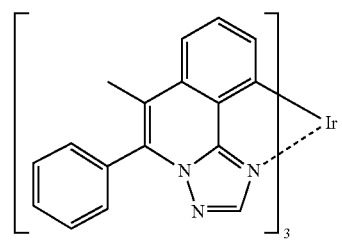
[Chemical Formula 73]
D-73
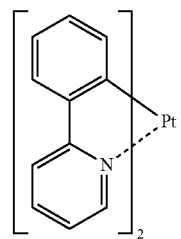
D-74
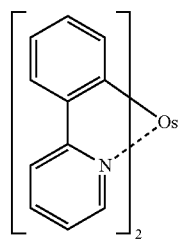
D-75
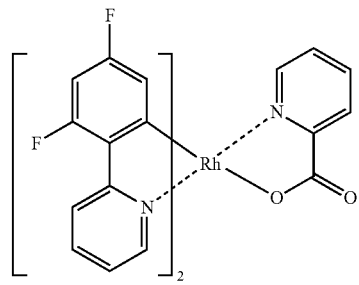
D-76
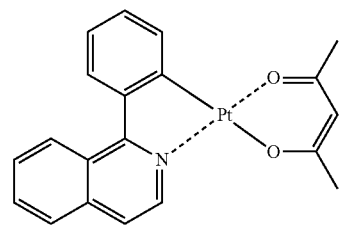
D-77
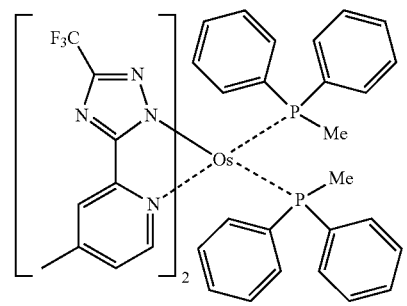

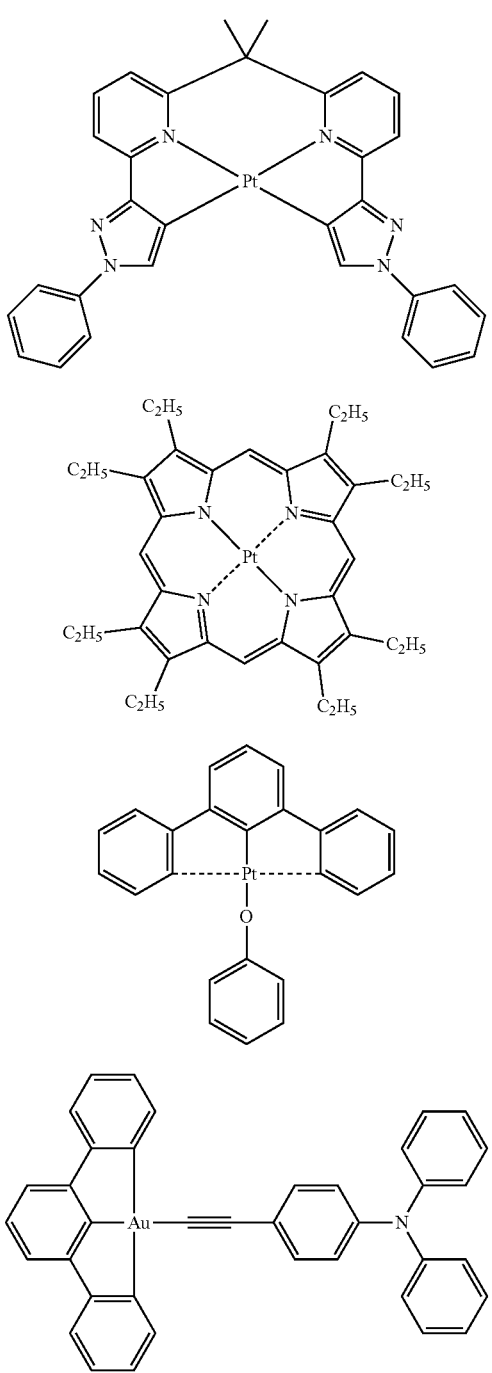

D-78

D-79

D-80

D-81

(1-2. Fluorescence Luminescent Dopant)

The fluorescence luminescent dopant (hereinafter referred to as "fluorescent dopant") will be explained.

The fluorescent dopant is a compound that can emit light from an excited singlet, and is not specifically limited as long as luminescence from the excite singlet is observed.

Examples of the fluorescent dopant include anthracene derivatives, pyrene derivatives, chrysene derivatives, fluoranthene derivatives, perylene derivatives, fluorene derivatives, arylacetylene derivatives, styrylarylene derivatives, styrylamine derivatives, arylamine derivatives, boron complexes, coumarin derivatives, pyran derivatives, cyanine derivatives, chroconium derivatives, squalium derivatives, oxobenzanthracene derivatives, fluorescein derivatives, rhodamine derivatives, pyrylium derivatives, perylene derivatives, polythiophene derivatives, or rare earth complex-based compounds and the like.

Furthermore, luminescent dopants utilizing retarded fluorescence have also been developed in recent years, and these may also be used.

Specific examples of the fluorescent dopants utilizing retarded fluorescence include the compounds described in WO 2011/156793 A, JP 2011-213643 A, JP 2010-93181 A and the like, but the present invention is not limited to these.

(2. Host Compound)

The host compound is a compound that is mainly responsible for the injection and transport of electrical charges in the luminescent layer 3c, and the luminescence of the host compound itself is not substantially observed in the organic electroluminescent element EL.

The host compound is preferably a compound having a phosphorescence quantum yield of phosphorescence is lower than 0.1 at room temperature (25° C.), more preferably a compound having a phosphorescence quantum yield of lower than 0.01. Furthermore, in the compound contained in the luminescent layer 3c, the mass ratio in this layer is preferably 20% or more.

Furthermore, it is preferable that the excited state energy of the host compound is higher than the excited state energy of the luminescent dopant contained in the same layer.

The host compound may be used singly, or plural kinds of host compounds may be used in combination. By using plural kinds of host compounds, the transfer of the electrical charges can be adjusted, and thus the efficiency of the organic electroluminescent element EL can be increased.

The host compound used in the luminescent layer 3c is not specifically limited, and compounds that are used in conventional organic electroluminescent elements can be used. For example, the compounds may be low molecular compounds, or polymer compounds having repeating units, or compounds having a reactive group such as a vinyl group or an epoxy group.

It is preferable that the known host compound has a high glass transition temperature (Tg) from the viewpoint that the host compound prevents a long wavelength of luminescence while the host compound has hole transportability or electron transportability, and the viewpoint of the stability of the organic electroluminescent element EL against heat generation during driving at a high temperature or driving of the element. The host compound has a Tg of preferably 90° C. or more, more preferably 120° C. or more.

The glass transition point (Tg) herein is a value obtained by a method based on JIS-K-7121 by using DSC (Differential Scanning Colorimetry: differential scanning colorimetry).

Specific examples of the known host compounds used in the organic electroluminescent element EL include, but are not limited to, the compounds described in the following publications and the like.

JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, JP 2002-308837 A, US 20030175553 A, US 20060280965 A, US 20050112407 A, US 20090017330A, US 20090030202 A, US 20050238919 A, WO2001039234 A, WO 2009021126 A, WO 2008056746 A, WO 2004093207 A, WO 2005089025 A, WO 2007063796 A, WO 2007063754 A, WO 2004107822 A, WO 2005030900 A, WO 2006114966 A, WO 2009086028 A, WO 2009003898 A, WO 2012023947 A, JP 2008-074939 A, JP 2007-254297 A, EP 2034538 A and the like.

[Electron Transport Layer 3d]

The electron transport layer used in the organic electroluminescent element EL is formed of a material having a function to transport electrons, and has a function to transmit electrons injected from the cathode to the luminescent layer 3c.

The electron transport material may be used singly, or plural kinds of electron transport materials may be used in combination. The total thickness of the electron transport layer 3d is not specifically limited, and is generally in the range of from 2 nm to 5 μm, more preferably from 2 nm to 500 nm, still more preferably from 5 nm to 200 nm.

Furthermore, it is known that, when light generated in the luminescent layer 3c is extracted from the electrode in the organic electroluminescent element EL, the light that is directly taken from the luminescent layer 3c and the light that is reflected by the electrode that is disposed so as to be opposite to the electrode from which light is extracted and then extracted cause interference. In the case when light is reflected at the cathode, it is possible to efficiently utilize this interference effect by suitably adjusting the total film thickness of the electron transport layer 3d between several nanometers and several micrometers.

On the other hand, when the film thickness of the electron transport layer 3d is thickened, the voltage easily increases; therefore, specifically in the case when the film thickness is thick, the electron transfer degree of the electron transport layer 3d is preferably $10^{-5}$ cm$^2$/Vs or more.

The material used in the electron transport layer 3d (hereinafter referred to as an electron transport material) may have either of a property of injecting or transporting electrons, or a hole barrier property, and any material can be selected from conventionally known compounds and used.

Examples include nitrogen-containing aromatic hetero ring derivatives, aromatic hydrocarbon ring derivatives, dibenzofuran derivatives, dibenzothiophene derivatives, silol derivatives and the like.

The above-mentioned nitrogen-containing aromatic hetero ring derivatives include carbazole derivatives, azacarbazole derivatives (one or more of carbon atoms that constitute a carbazole ring is/are substituted with nitrogen atom(s)), pyridine derivatives, pyrimidine derivatives, pyrazine derivatives, pyridazine derivatives, triazine derivatives, quinoline derivatives, quinoxaline derivatives, phenanthroline derivatives, azatriphenylene derivatives, oxazole derivatives, triazole derivatives, oxadiazole derivatives, thiaziazole derivatives, triazole derivatives, benzimidazole derivatives, benzoxazole derivatives, benzothiazole derivatives and the like.

The aromatic hydrocarbon ring derivatives include naphthalene derivatives, anthracene derivatives, triphenylene and the like.

Furthermore, metal complexes having a quinolinol backbone or a dibenzoquinolinol backbone as a ligand such as tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the like, and metal complexes in which the center metals of these metal complexes are replaced with In, Mg, Cu, Ca, Sn, Ga or Pb can also be used as the electron transport material.

In addition, metal-free or metal phthalocyanines, or metal-free or metal phthalocyanines in which their terminals have been substituted with an alkyl group, a sulfonic acid group or the like can also be preferably used as the electron transport material. Furthermore, the distyrylpyrazine derivatives that are exemplified by the materials for the luminescent layer 3c can also be used as the electron transport material, and inorganic semiconductors such as n-type Si and n-type SiC can also be used as the electron transport material as in the hole injection layer 3a and hole transport layer 3b.

Furthermore, polymer materials formed by introducing these materials into polymer chains or using these materials as the main chains of the polymers can also be used.

In the organic electroluminescent element EL, the electron transport layer 3d having a high n-property (being rich in electrons) may be formed by doping the electron transport layer 3d with a dope material as a guest material. Examples of the dope material include n-type dopants such as metal compounds such as metal complexes and halogenated metals. Specific examples of the electron transport layer 3d having such a constitution include those described in publications such as JP 4-297076 A, JP 10-270172 A, JP 2000-196140 A, JP 2001-102175 A and J. Appl. Phys., 95, 5773 (2004).

Specific examples of known preferable electron transport materials used for the organic electroluminescent element EL include the compounds described in the following publications, and the like, but the present invention is not limited to these.

U.S. Pat. No. 6,528,187 B, U.S. Pat. No. 7,230,107 B, US 20050025993 A, US 20040036077 A, US 20090115316 A, US 20090101870 A, US 20090179554 A, WO 2003060956 A, WO 2008132085 A, Appl. Phys. Lett. 75, 4 (1999), Appl. Phys. Lett. 79,449 (2001), Appl. Phys. Lett. 81,162 (2002), Appl. Phys. Lett. 81,162 (2002), Appl. Phys. Lett. 79, 156 (2001), U.S. Pat. No. 7,964,293 B, US 2009030202 A, WO 2004080975 A, WO 2004063159 A, WO 2005085387 A, WO 2006067931 A, WO 2007086552 A, WO 2008114690 A, WO 2009069442 A, WO 2009066779 A, WO 2009054253 A, WO 2011086935 A, WO 2010150593 A, WO 2010047707 A, EP 2311826 A, JP 2010-251675 A, JP 2009-209133 A, JP 2009-124114 A, JP 2008-277810 A, JP 2006-156445 A, JP 2005-340122 A, JP 2003-45662 A, JP 2003-31367 A, JP 2003-282270 A, WO 2012115034 A, and the like.

Furthermore, more preferable electron transport materials include pyridine derivatives, pyrimidine derivatives, pyrazine derivatives, triazine derivatives, dibenzofuran derivatives, dibenzothiophene derivatives, carbazole derivatives, azacarbazole derivatives and benzimidazole derivatives.

The electron transport material may be used singly, or plural kinds of electron transport materials may be used in combination.

[Hole Blocking Layer]

The hole blocking layer is a layer having the function of electron transport layer 3d in a broad sense. The hole blocking layer is preferably formed of a material having a function to transport electrons but having a small ability to transport holes. By blocking holes while transporting electrons, the probability of the re-bonding of the electron and holes can be improved.

Furthermore, where necessary, the above-mentioned constitution of the electron transport layer 3d can be used as a hole blocking layer.

It is preferable that the hole blocking layer disposed on the organic electroluminescent element EL is disposed adjacent to the side of the cathode of the luminescent layer 3c.

In the organic electroluminescent element EL, the thickness of the hole blocking layer is preferably in the range of from 3 to 100 nm, more preferably in the range of from 5 to 30 nm.

As the material used for the hole blocking layer, the material used for the above-mentioned electron transport layer 3d is preferably used, and the material used as the above-mentioned host compound is also preferably used in the hole blocking layer.

[Electron Injection Layer 3e]

The electron injection layer 3e (also referred to as "cathode buffer layer") is a layer that is disposed between the cathode and the luminescent layer 3c to decrease a driving voltage and improve a luminescent luminance. An example of the electron injection layer 3e is described in "Front Line Of Organic EL Elements And Industrialization Thereof (Nov. 30, 1998, published by NTS)", second edition, Chapter II, "Electrode Materials" (pages 123 to 166).

In the organic electroluminescent element EL, the electron injection layer 3e is disposed as necessary, and is disposed between the cathode and the luminescent layer 3c as mentioned above, or between the cathode and the electron transport layer 3d.

It is preferable that the electron injection layer 3e is a quite thin film, and the film thickness thereof is preferably in the range from 0.1 nm to 5 nm depending on the material. Alternatively, the electron injection layer 3e may be an uneven film in which constitutional materials are intermittently present.

The details of the electron injection layer 3e are also described in JP 6-325871 A, JP 9-17574 A, JP 10-74586 A and the like. Specific examples of the material that is preferably used in the electron injection layer 3e include metals as represented by strontium, aluminum and the like, alkali metal compounds as represented by lithium fluoride, sodium fluoride, potassium fluoride and the like, alkaline earth metal compounds as represented by magnesium fluoride, calcium fluoride and the like, metal oxides as represented by aluminum oxide, metal complexes as represented by lithium 8-hydroxyquinolate (Liq) and the like, and the like. Furthermore, it is also possible to use the above-mentioned electron transport materials.

Furthermore, the above-mentioned materials used in the electron injection layer 3e may be used singly, or in combination of plural kinds.

[Hole Transport Layer 3b]

The hole transport layer 3b is formed of a material having a function to transport holes. The hole transport layer 3b is a layer having a function to transport the holes injected from the anode to the luminescent layer 3c.

In the organic electroluminescent element EL, the total film thickness of the hole transport layer 3b is not specifically limited, and is generally in the range of from 5 nm to 5 μm, more preferably from 2 nm to 500 nm, still more preferably from 5 nm to 200 nm.

It is sufficient that the material used in the hole transport layer 3b (hereinafter referred to as a hole transport material) has either of an ability to inject or transport holes, and an electron barrier property. For the hole transport material, any compound can be selected from conventionally-known compounds and used. The hole transport material may be used singly, or plural kinds of hole transport materials may be used in combination.

Examples of the hole transport material include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene-based derivatives such as anthracenes and naphthalenes, fluorene derivatives, fluorenone derivatives, polyvinyl carbazole, polymer materials or oligomers in which an aromatic amine is introduced in the main chain or side chains, polysilanes, electroconductive polymers or oligomers (for example, PEDOT: PSS, aniline-based copolymers, polyanilines, polythiophenes and the like) and the like.

The triarylamine derivatives include benzidine-types as represented by α-NPD, starburst-types as represented by MTDATA, compounds having a triarylamine-connected core part with fluorine or anthracene, and the like.

Furthermore, the hexaazatriphenylene derivatives described in JP 2003-519432 A, JP 2006-135145 A and the like can also be used as the hole transport material.

Furthermore, the hole transport layer 3b having a high p-property in which an impurity is doped can also be used. For example, the constitutions described in the respective publications of JP 4-297076 A, JP 2000-196140 A and JP 2001-102175 A, J. Appl. Phys., 95, 5773 (2004), and the like can also be applied to the hole transport layer 3b.

Furthermore, inorganic compounds such as so-called p-type hole transport materials, p-type Si and p-type SiC as described in JP 11-251067 A and the document authored by J. Huang et. al. (Applied Physics Letters 80 (2002), p. 139) can also be used. In addition, ortho-metalated organic metal complexes having Ir or Pt as a center metal as represented by Ir(ppy)$_3$ are also preferably used.

As the hole transport material, the above-mentioned hole transport materials can be used, and triarylamine derivatives, carbazole derivatives, indolocarbazole derivatives, azatriphenylene derivatives, organic metal complexes, polymer materials or oligomers in which an aromatic amine is introduced in the main chain or side chain, and the like are preferably used.

Specific examples of the hole transport material used in the organic electroluminescent element EL include, but are not limited to, the compounds described in the above-mentioned documents, and in the following documents, and the like.

Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 90, 183503 (2007), Appl. Phys. Lett. 51, 913 (1987), Synth. Met. 87,171 (1997), Synth. Met. 91, 209 (1997), Synth. Met. 111, 421 (2000), SID Symposium Digest, 37, 923 (2006), J. Mater. Chem. 3, 319 (1993), Adv. Mater. 6, 677 (1994), Chem. Mater. 15, 3148 (2003), US 20030162053 A, US 20020158242 A, US 20060240279 A, US 20080220265 A, U.S. Pat. No. 5,061, 569 B, WO 2007002683 A, WO 2009018009 A, EP 650955 A, US 20080124572 A, US 20070278938 A, US 20080106190 A, US 20080018221 A, WO 2012115034 A, JP 2003-519432 A, JP2006-135145 A and U.S. patent application Ser. No. 13/585,981.

The hole transport material can be used singly, or plural kinds of hole transport materials may be used in combination.

[Electron Blocking Layer]

The electron blocking layer is a layer having the function of the hole transport layer 3b in a broad sense. The electron blocking layer is preferably formed of a material that has a function to transport holes and also has a little ability to transport electrons. The electron blocking layer transports holes and blocks electrons, whereby the probability of the re-bonding of the electrons and holes can be improved.

Furthermore, where necessary, the constitution of the above-mentioned hole transport layer 3b can be used as the electron blocking layer for the organic electroluminescent element EL. It is preferable that the electron blocking layer disposed in the organic electroluminescent element EL is disposed adjacent to the side of the anode of the luminescent layer 3c.

The thickness of the electron blocking layer is preferably in the range of from 3 to 100 nm, more preferably in the range of from 5 to 30 nm.

As the material used in the electron blocking layer, the above-mentioned materials used for the hole transport layer 3b can be preferably used. Furthermore, the above-mentioned materials used as the host compound can also be preferably used as the electron blocking layer.

[Hole Injection Layer 3a]

The hole injection layer 3a (also referred to as "anode buffer layer") is a layer that is disposed between the anode and the luminescent layer 3c to decrease a driving voltage and improve a luminescent luminance. An example of the hole injection layer 3a is described in "Front Line of Organic EL elements and industrialization thereof (Nov. 30, 1998, published by NTS)", second edition, Chapter II, "Electrode Materials" (pages 123 to 166).

The hole injection layer 3a is disposed as necessary, and is disposed between the anode and the luminescent layer 3c as mentioned above, or between the anode and the hole transport layer 3b.

The details of the hole injection layer 3a are also described in JP 9-45479 A, JP 9-260062 A, JP 8-288069 A and the like.

Examples of the material used in the hole injection layer 3a include the materials used in the above-mentioned hole transport layer 3b, and the like. Among these, phthalocyanine derivatives as represented by copper phthalocyanine, hexaazatriphenylene derivatives such as those described in JP 2003-519432 A, JP 2006-135145 A and the like, metal oxide as represented by vanadium oxide, electroconductive polymers such as amorphous carbons, polyanilines (emeraldine) and polythiophenes, ortho-metalated complexes as represented by tris(2-phenylpyridine)iridium complex and the like, triarylamine derivatives, and the like.

The above-mentioned materials used in the hole injection layer 3a may be used singly or in combination of plural kinds.

[Contained Substance]

The luminescent functional layer 3 that constitutes the organic electroluminescent element EL may further contain other contained substance.

Examples of the contained substance include halogen elements such as bromine, iodine and chlorine and halogenated compounds, alkali metals and alkaline earth metals such as Pd, Ca and Na, compounds, complexes and salts of transition metals, and the like.

The content of the contained substance can be arbitrarily determined, and is preferably 1,000 ppm or less, more preferably 500 ppm or less, still more preferably 50 ppm or less with respect to the total mass % of the layer in which the substance is contained.

However, the content is not within this range depending on the object of improving the ability of transporting electrons or holes, the object of making the energy transfer of excitons advantageous, and the like.

[Method for Forming Luminescent Functional Layer 3]

The method for forming the luminescent functional layer (hole injection layer, hole transport layer, luminescent layer, hole blocking layer, electron transport layer, electron injection layer or the like) of the organic electroluminescent element EL will be explained. The method for forming the luminescent functional layer 3 is not specifically limited, and the luminescent functional layer can be formed by a conventionally-known method such as a vacuum deposition process, a wet process (wet process) or the like.

Examples of the wet process include a spin coat process, a cast process, an inkjet process, a print process, a die coat process, a blade coat process, a roll coat process, a spray coat process, a curtain coat process, a LB process (a Langmuir-Blodgett process) and the like. From the viewpoints that an even thin film is easily obtained, and of a high producibility, methods that are highly suitable for a roll-to-roll system such as a die coat process, a roll coat process, an inkjet process and a spray coat process are preferable.

In the wet process, examples of a liquid medium for dissolving or dispersing the materials of the luminescent functional layer include ketones such as methyl ethyl ketone and cyclohexanone, aliphatic acid esters such as ethyl acetate, halogenated hydrocarbons such as dichlorobenzene, aromatic hydrocarbons such as toluene, xylene, mesitylene and cyclohexylbenzene, aliphatic hydrocarbons such as cyclohexane, decaline and dodecane, and organic solvents such as DMF and DMSO can be used.

Furthermore, the dispersion can be conducted by a dispersion method such as ultrasonification, high-shear force dispersion or media dispersion.

In the case when a deposition process is used for the formation of each layer that constitutes the luminescent functional layer 3, the deposition conditions therefor differ depending on the kind of the compound used and the like, and it is desirable to suitably select the conditions generally in the ranges of a boat heating temperature of from 50° C. to 450° C., a degree of vacuum of from $10^{-6}$ Pa to $10^{-2}$ Pa, a deposition velocity of from 0.01 nm/sec to 50 nm/sec, a substrate temperature of from −50° C. to 300° C., a film thickness of from 0.1 nm to 5 µm, preferably from 5 nm to 200 nm.

It is preferable that the organic electroluminescent element EL is formed by consistent preparation with one vacuum drawing from the luminescent functional layer 3 to the counter electrode 5, but the product may be extracted in the midstream and subjected to a different film formation process. At this time, it is preferable to conduct the operation under a dried inert gas atmosphere.

Alternatively, a different formation method may be used for each layer.

<Transparent Electrode 1>

The transparent electrode 1 is the transparent electrode 1 in FIG. 1 explained above, and constitutes the anode or cathode of the organic electroluminescent element EL.

In the organic electroluminescent element EL of the present exemplary embodiment, the constitution is such that the high-refractive index layer H2 is disposed between the luminescent functional layer 3 and the electrode layer 1b that is used as a substantial cathode. Since the electroconductivity of the electrode layer 1b, which contains silver (Ag) as a main component, is extremely high in the transparent electrode 1 of this constitution, electroconductivity is not required for the high-refractive index layer H2. Therefore, for the high-refractive index layers H1 and H2, materials having suitable refractive indices may be used among the high-refractive index materials exemplified in the previous transparent electrode 1. Furthermore, it is not necessary that these high-refractive index layers H1 and H2 have film thicknesses that are required as electrodes, and may have film thicknesses that are suitably preset depending on the state of disposition of the transparent electrode 1 in the electronic device in which the electronic device including these high-refractive index layers H1 and H2 is used.

In addition, although the transparent electrode 1 is deemed to be patterned into a shape in which the terminal parts thereof are exposed from the sealing material 17, each of the high-refractive index layers H1 and H2 and the nitrogen-containing layer 1a may be not patterned as long as it has a fine insulating property, and it is sufficient that only the electrode layer 1b is patterned.

<Counter Electrode 5>

The counter electrode 5 is an electrode that constitutes the anode or cathode of the organic electroluminescent element EL, and is an electrode that is disposed on one main surface of the transparent electrode 1 through the luminescent functional layer 3. This counter electrode 5 is used as a cathode when the transparent electrode 1 is an anode, or used as an anode when transparent electrode 1 is a cathode, with respect to the luminescent functional layer 3 of the organic electroluminescent element EL. Therefore, it is deemed that at least the interface layer at the side in contact with the luminescent functional layer 3 is constituted by a material that is suitable as a cathode or an anode.

Such counter electrode 5 is constituted as, for example, a reflection electrode that allows reflection of the luminescent light h generated at the luminescent layer 3c of the luminescent functional layer 3 to the side of a light extraction surface 13a of the transparent substrate 13. Furthermore, the counter electrode 5 may have transmittability against visible light, and in such case, it is also possible to extract the luminescent light h from the side of the counter electrode 5.

The anode and cathode that constitute the above-mentioned counter electrode 5 are as follows.

[Anode]

As the anode in the organic electroluminescent element EL, electrode substances formed of metals, alloys, and electroconductive compounds having a high work function (4 eV or more, preferably 4.5 V or more) and mixtures thereof are used. Specific examples of such electrode substances are metals such as Au, and electroconductive transparent materials such as CuI, indium tin oxide (ITO), $SnO_2$ and ZnO. Furthermore, materials that are amorphous and capable of preparing transparent conductive coatings, such as IDIXO ($In_2O_3$—ZnO), may also be used.

For the anode, these electrode substances are formed into a thin film by a method such as deposition or sputtering, and a pattern having a desired shape is formed by a photolithography process. Alternatively, in the case when a high pattern accuracy is not required (about 100 μm or more), the pattern may be formed thorough a mask having a desired shape when the above-mentioned electrode substance is formed by a deposition process or a sputtering process.

Alternatively, in the case when a substance that can be applied such as an organic electroconductive compound is used, a wet film formation process such as a printing system or a coating system can also be used. Furthermore, the sheet resistance as the anode is preferably several hundred Ω/sq. or less.

The thickness of the anode is selected in the range of generally from 10 nm to 1 μm, preferably from 10 nm to 200 nm depending on the material with consideration for permeability or reflectivity.

[Cathode]

As the cathode, electrode substances formed of metals having a small work function (4 eV or less) (hereinafter referred to as electron injecting metals), alloys, electroconductive compounds and mixtures thereof are used. Specific examples of such electrode substances include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al2O_3$) mixtures, indium, lithium/aluminum mixtures, aluminum, rare earth metals and the like.

Among these, mixtures of an electron injecting metal and a second metal that has a work function of a value that is higher than that of this electron injecting metal and is stable, such as magnesium/silver mixtures, magnesium/aluminum mixtures, magnesium/indium mixtures, aluminum/aluminum oxide ($Al_2O_3$) mixtures, lithium/aluminum mixtures, aluminum, and the like are preferable from the viewpoints of electron injection property and resistance against oxidation, and the like.

The cathode can be prepared from the above-mentioned electrode substance by using a method such as deposition or sputtering. Furthermore, the sheet resistance of the cathode is preferably several hundred Ω/sq. or less.

The thickness of the cathode is selected in the range of generally from 10 nm to 5 μm, preferably from 50 nm to 200 nm depending on the material, with consideration for the permeability or reflectivity.

A sealing means, a protective film, a protective plate, a light extraction technology and a light collection sheet which can be applied to the organic electroluminescent element EL will be explained below in this order.

(External Extraction Efficiency)

The external extraction efficiency of the luminescence of the organic electroluminescent element EL at room temperature is preferably 1% or more, more preferably 5% or more.

The external extraction quantum efficiency (%)=the number of photons emitted out of the organic electroluminescent element/the number of electrons flown into the organic electroluminescent element×100.

Furthermore, a hue improving filter such as a color filter or the like may be used in combination, or a color conversion filter that converts a luminescent color from the organic electroluminescent element EL to multi-colors by fluorescent substances may be used in combination.

[Sealing]

Although the organic electroluminescent element EL finely emits light with a small electrical power, but is susceptible to water content, and thus a non-luminescent part is formed by water absorption of the water content. Therefore, it is preferable to seal the organic electroluminescent element EL with a sealing material 17.

As a sealing means that is used for the sealing of the organic electroluminescent element EL, for example, a method including attaching the sealing material 17, the counter electrode 5 and the transparent substrate 13 with an adhesive 19 can be exemplified. The sealing material 17 is preferably disposed so as to cover the display region of the organic electroluminescent element EL, and may have either a concave plate shape or a flat plate shape. Furthermore, although the transparency and electrical insulating property of the sealing material 17 are not specifically limited, for example, in the case of a constitution in which the transparent electrode 1 of the organic electroluminescent element EL is used as the upper electrode on the luminescent functional layer 3 as mentioned above, the sealing material is constituted by a transparent material.

Specific examples include glass plates, polymer plates and films, metal plates and films and the like. Specific examples of the glass plates can include soda lime glass, barium-strontium-containing glass, lead glass, aluminosilicate glass, borosilicate glass, barium borosilicate glass, quartz and the like. Furthermore, examples of the polymer plate can include polycarbonates, acrylics, polyethylene telephthalates, polyether sulfides, polysulfones and the like. Furthermore, examples of the metal plates include those formed of one or more metals or alloys selected from the group consisting of stainless steel, iron, copper, aluminum, magnesium, nickel, zinc, chromium, titanium, molybdenum, silicon, germanium and tantalum, and alloys thereof.

For processing the sealing material 17 into a concaved shape, sand blast processing, chemical etching processing or the like is used.

For forming the organic electroluminescent element EL into a thin film, it is preferable to use a polymer film or a metal film. Furthermore, it is preferable that the polymer film has an oxygen permeation degree measured by a method based on JIS K 7126-1987 of $1 \times 10^{-3}$ ml/(m$^2$/24 h) or less, and a water vapor permeation degree measured by a method based on JIS K 7129-1992 (25±0.5° C., relative humidity (90±2)%) of $1 \times 10^{-3}$ g/(m$^2$/24 h) or less.

Examples of the adhesive 19 can include adhesives such as photocurable and thermally curable adhesives of acrylic acid-based oligomers and methacrylic acid-based oligomers having a reactive vinyl group, and moisture curable adhesives such as 2-cyanoacrylic acid esters. Furthermore, examples can include thermally-chemically curable types (two-liquid mixing) such as epoxy-based types. Furthermore, examples can include hot-melt type polyamides, polyesters and polyolefins. Furthermore, examples can include cation-curable type ultraviolet-ray curable epoxy resin adhesives.

Since there are some cases when the organic electroluminescent element EL is deteriorated by a thermal treatment, adhesives that can be adhered and cured at from room temperature to 80° C. or less are preferable. Furthermore, a desiccant may be dispersed in the adhesive 19 in advance. The adhesive 19 may be applied to a part to be sealed by using a commercially available dispenser, or may be printed as in screen printing.

Furthermore, the sealing material 17 can also be formed into a sealing film on the counter electrode 5 that is at the side that is opposed to the transparent substrate 13 across the luminescent functional layer 3 by coating the counter electrode 5 and the luminescent functional layer 3 to form a layer of an inorganic substance or an organic substance in contact with the transparent substrate 13. In this case, the material for forming the sealing film may be any material having a function to suppress the invasion of elements such as water content and oxygen, and for example, silicon oxide, silicon dioxide, silicon nitride and the like can be used.

Furthermore, in order to improve the brittleness of the sealing film, it is preferable to impart a stacked structure of an inorganic layer and a layer formed of an inorganic layer in a similar manner to that for the above-mentioned barrier film. The method for forming these films is not specifically limited, and for example, a vacuum deposition process, a sputtering process, a reactive sputtering process, a molecular ray epitaxy process, a cluster ion beam process, an ion plating process, a plasma polymerization process, an atmospheric pressure plasma polymerization process, a plasma CVD process, a laser CVD process, a thermal CVD process, a coating process and the like can be used.

It is preferable to inject a gas phase by an inert gas such as nitrogen or argon, or a liquid phase by an inert liquid such as a fluorohydrocarbon or a silicone oil into the gap between the sealing material 17 and the organic electroluminescent element EL. Furthermore, it is also possible to evacuate the gap between the sealing material 17 and the display region of the organic electroluminescent element EL.

In addition, it is also possible to enclose a hygroscopic compound in the gap between the sealing material 17 and the display region of the organic electroluminescent element EL.

Examples of the hygroscopic compound include metal oxides such as sodium oxide, potassium oxide, calcium oxide, barium oxide, magnesium oxide and aluminum oxide, sulfate salts such as sodium sulfate, calcium sulfate, magnesium sulfate and cobalt sulfate, metal halides such as calcium chloride, magnesium chloride, cesium fluoride, tantalum fluoride, cerium bromide, magnesium bromide, barium iodide and magnesium iodide, perchlorates such as barium perchlorate and magnesium perchlorate, and the like. As the sulfate salts, metal halides and perchlorates, anhydrous salts are preferably used.

[Protective Film and Protective Plate]

A protective film or protective plate may be disposed on the outside of the sealing film or film for sealing for sealing the organic electroluminescent element EL so as to increase the mechanical strength of the element. Specifically, in the case when the organic electroluminescent element EL is sealed by the sealing film, the mechanical strength is not necessarily high, and thus it is preferable to dispose a protective film or protective plate. As the material that can be used as the protective film or protective plate, for example, glass plates, polymer plates and films, metal plates and films and the like can be used in a similar manner to that in the above-mentioned sealing material 17. As the protective film or protective plate, it is preferable to use a polymer film that enables weight saving and formation of a thin film.

[Technique for Improving Light Extraction]

It is generally known that the organic electroluminescent element EL emits light inside a layer having a higher refractive index than that of air (a refractive index in the range of about 1.6 to 2.1), and thus only about 15% to 20% of the light that has been emitted in the luminescent layer $3c$ can be extracted. The reasons are that light that enters into an interface (for example, the interface between the transparent substrate 13 and air) at an angle θ that is equal to or more than the critical angle causes total reflection, and thus is difficult to extract the reflected light out of the element, and that light causes total reflection between the transparent substrate 13 and the transparent electrode 1, or the transparent electrode 1 and the luminescent layer $3c$, and the light is guided from the transparent electrode 1 to the luminescent layer $3c$, and consequently the light escapes in the direction of the side surface of the element.

Examples of the means for improving the efficiency of light extraction of the organic electroluminescent element include a method including forming concavity and convexity on a surface of a transparent substrate to thereby prevent total reflection at the interface between the transparent substrate and air (for example, U.S. Pat. No. 4,774,435 B), a method including improving the efficiency of light extraction by imparting a light collection property to a substrate (for example, JP 63-314795 A), a method including forming a reflective surface on a side surface or the like of an element (for example, JP 1-220394A), a method including forming an anti-reflection film by introducing a flat layer having an intermediate refractive index between a substrate and a luminescent body to thereby form an anti-reflection film (for example, JP 62-172691 A), a method including introducing a flat layer having a lower refractive index than that of a substrate between the substrate and a luminescent body (for example, JP 2001-202827 A), a method for forming a diffraction grating between either of a substrate, a transparent electrode layer and a luminescent layer (including the gap between the substrate and the external environment) (JP 11-283751 A) and the like.

In the organic electroluminescent element EL of the present exemplary embodiment, the above-mentioned methods can be used in combination. Specifically, the method including introducing a flat layer having a lower refractive index than that of the transparent substrate between the transparent substrate 13 and the luminescent layer 3c, or the method for forming a diffraction grating between layers can be preferably used.

In the organic electroluminescent element EL, the light extraction efficiency can further be improved by combining these means.

For example, when a medium having a low refractive index is formed at a thickness that is longer than the wavelength of light that penetrates in the gap between the transparent electrode 1 and the transparent substrate 13 is formed in the organic electroluminescent element EL, the efficiency of extraction of the light that comes out of the transparent electrode 1 to the outside of the element becomes higher as the refractive index of the medium becomes lower.

Examples of the low-refractive index layer formed of a medium having a low refractive index include aerogel, porous silica, magnesium fluoride, fluorine-based polymers and the like. Since the refractive index of the transparent substrate is generally within the range of from about 1.5 to 1.7, it is preferable that the low-refractive index layer has a refractive index of approximately 1.5 or less. Furthermore, the refractive index is more preferably 1.35 or less.

Furthermore, it is desirable that the thickness of the low-refractive index layer is twice or more of the wavelength of the light that penetrates into the medium. The reason is that, in the case when the thickness of the low-refractive index layer is about the thickness of the light, the film thickness becomes such a film thickness that allows an electromagnetic wave that has exuded by evanescent to enter the layer that is adjacent to the side of the light extraction surface of the low-refractive index layer, and thus the effect of the low-refractive index layer is decreased.

The interface that causes total reflection, or the method including introducing a diffraction grating in either medium has a characteristic that the effect of improving the light extraction efficiency is high. This method utilizes the property of the diffraction grating of being capable of changing the direction of the light to a specific direction that is different from refraction, by so-called Bragg's diffraction such as primary diffraction or secondary diffraction. By introducing a diffraction grating into the gap between the layers or into the medium, the light by the total reflection between the layers or the like can be diffracted, and the light generated from the luminescent layer 3c can be extracted outside.

As the diffraction grating to be introduced, either of a general unidimensional diffraction grating that has a periodic refractive index distribution only in a certain direction, and a diffraction grating having a two-dimensional periodic refractive index can be used.

Specifically, since the light emitted in the luminescent layer 3c is randomly generated in every direction, lights that are randomly generated in every direction can be diffracted by introducing a diffraction grating having a two-dimensional periodic refractive index. Therefore, by introducing the diffraction grating having a two-dimensional periodic refractive index into the organic electroluminescent element, the refractive index distribution can be a two-dimensional distribution and lights that go to in every direction is diffracted, whereby the light extraction efficiency is improved.

The position where the diffraction grating is to be introduced may be the gap between any of the layers, or may be in the medium of the transparent substrate 13, the transparent electrode 1 or the like, and is desirably in the vicinity of the luminescent functional layer 3, which is the place where light is generated. At this time, the period of the diffraction grating is preferably in the range of about ½ to 3 times of the wavelength of the light in the medium. The array of the diffraction grating is preferably such that arrays are repeated in a two-dimensional manner such as a square lattice shape, a triangle lattice shape or a honeycomb lattice shape.

[Light Collection Sheet]

The organic electroluminescent element EL can increase the luminance in a specific direction by collecting light in a specific direction such as a front direction against a luminescent surface of the element, by disposing, for example, a microlens array or so-called a light collection sheet at the side of the light extraction surface.

Furthermore, in order to control a light radiation angle from the organic electroluminescent element EL, a light diffusion plate or film may be used in combination with a light collection sheet. For example, a diffusion film (LIGHT-UP) manufactured by Kimoto Co., Ltd. and the like can be used.

As an example of the microlens array, quadrangular pyramids each having sides of 30 μm and an apex of 90° are arrayed in a two-dimensional manner on the side of the light extraction surface of the substrate. Each side is preferably within the range of from 10 to 100 μm. If the side is shorter than this, it is not preferable since the effect of diffraction is generated and thus the microlens array is colored, whereas when the side is too large, it is not preferable since the thickness becomes thick.

As the light collection sheet, for example, practical sheets for use in LED backlights for liquid crystal display devices can be used. As such sheets, for example, a luminance-increasing film (BEF) manufactured by Sumitomo 3M Limited and the like can be used. As prism sheets, for example, a shape in which stripes each having a cross-sectional surface of a triangle shape having an apex angle of 90° and a pitch of 50 μm are formed on a substrate, a shape having a rounded apex angle, a shape having a pitch that is randomly changed, and other shapes can be used.

[Use]

The organic electroluminescent element EL can be applied to electronic instruments such as display devices, displays and various luminescent light sources.

Examples of the luminescent light sources include, but are not limited to, illumination apparatuses such as household illuminations and in-car illuminations, backlights for clocks and liquid crystals, light sources for signboards for advertisement, traffic lights, optical storage media and the like, light sources for electrophotgraphic copying machines, light sources for optical communication processors, light sources for light sensors, and the like. Specifically, the organic electroluminescent element EL can be effectively used for use in backlights for liquid crystal display devices in illumination light sources.

The organic electroluminescent element EL may be subjected to patterning during the film formation as necessary by a metal mask, an inkjet printing process or the like. In the case of patterning, only the transparent electrode 1 and the counter electrode 5 may be patterned, or these electrodes and the luminescent layer 3c may be patterned, or all of the layers of the element may be patterned. In the preparation of the element, a conventionally-known method can be used.

<<4. Illumination Apparatus>>

The organic electroluminescent element used in the illumination apparatus may have a design in which an organic electroluminescent element EL having the above-mentioned constitution is provided with a resonator structure. Examples of the purposes of use of the organic electroluminescent element constituted as a resonator structure include, but are not limited to, light sources for optical storage media, light sources for electrophotographic copying machines, light sources for optical communication processors and light sources for optical sensors. Furthermore, the organic electroluminescent element may also be used for the above-mentioned purposes of use by causing laser oscillation.

The material used in the organic electroluminescent element can be applied to an organic electroluminescent element that generates substantially white luminescent (also referred to as a white organic electroluminescent element). For example, white luminescence can also be obtained by simultaneous luminescence of plural luminescent colors from plural luminescent materials to cause mixed colors. The combination of the luminescent colors may be a combination including the three luminescence maximum wavelengths of three elementary colors: red, green and blue, or may be a combination including two luminescence maximum wavelengths utilizing the relationship of complementary colors such as blue and yellow, and blue green and orange.

Furthermore, the combination of the luminescent materials for obtaining plural luminescent colors may be either of a combination of plural materials that cause luminescent by fluorescence or phosphorescence, and a combination of a luminescent material that causes luminescent by fluorescence or phosphorescence, and a pigment material that emit light from a luminescent material as excited light, and in a white organic electroluminescent element, the combination may be one obtained by combining and mixing plural luminescent dopants.

In such white organic EL element, unlike a constitution in which organic EL elements that emit respective colors are individually disposed in parallel in the form of arrays to thereby give white luminescent, the organic EL element itself emits white light. Therefore, masks are not necessary in the film formation of most of the layers that constitute the element, and thus an electrode film can be formed on one surface by a deposition process, a cast process, a spin coat process, an inkjet process, a printing process or the like, and the producibility is also improved.

Furthermore, the luminescent materials used in the luminescent layer of such white organic electroluminescent element are not specifically limited, and for example, in the case of a backlight in a liquid crystal display element, any luminescent material may be selected from the metal complexes in the present invention or known luminescent materials so as to conform to a wavelength range that corresponds to CF (color filter) properties, and combined to thereby make white light.

If the white organic electroluminescent element explained above is used, an illumination apparatus that generates substantially white luminescent can be prepared.

Furthermore, the illumination apparatus can also be used as an illumination apparatus having a luminescent surface with an enlarged surface area by, for example, using plural organic electroluminescent elements. In this case, the surface area of the luminescent surface is enlarged by arraying (i.e., tiling) plural luminescent panels on which the organic electroluminescent elements have been disposed, on a support substrate. The support substrate may also serves as a sealing material, and the respective luminescent panels are tiled in the state that the organic electroluminescent elements are sandwiched between this support substrate and the transparent substrates of the luminescent panels. The organic electroluminescent elements may be sealed by filling the gap between the support substrates and the transparent substrates with an adhesive. The terminals of the transparent electrode and counter electrode are exposed around the luminescent panels.

In an illumination apparatus having such a constitution, the centers of the respective luminescent panels are luminescent regions, and non-luminescent regions are formed between the luminescent panels. Therefore, a light extraction element for increasing a light extraction amount from the non-luminescent regions may be disposed on the non-luminescent regions of the light extraction surface. As the light extraction element, a light collection sheet or a light diffusion sheet can be used.

<Effect>

The organic electroluminescent element EL explained above has a constitution in which the transparent electrode 1 of the present invention, which has both electroconductivity and light transmission property and improved reliability, is used as a cathode, and the luminescent functional layer 3, and the counter electrode 5 that serves as a cathode are disposed in this order on the side of the high-refractive index layer H2 in this transparent electrode 1. Therefore, it is possible to actualize a high-luminance luminescent in the organic electroluminescent element EL by applying a sufficient voltage to between the transparent electrode 1 and the counter electrode 5, and to increase the luminance by improving the extraction efficiency of the luminescent light h from the side of the transparent electrode 1. Furthermore, such performances can be maintained for a long time, and it is also possible to improve long time reliability. In addition, the luminescence lifetime can also be improved by decreasing a driving voltage for obtaining a predetermined luminance.

EXAMPLE 1

<<Preparation of Transparent Electrode>>

As shown by the constitutions in the following Table 2, the transparent electrodes of Samples 101 to 137 were each prepared so as to have a surface area of an electroconductive region of 5 cm×5 cm.

<Procedures for Preparation of Samples 101 and 102>

Electrode layers formed of silver (Ag) were formed on glass substrates as follows, at the respective film thicknesses shown in the following Table 2.

Firstly, a substrate made of transparent non-alkali glass was fixed on a substrate holder of a commercially available vacuum deposition apparatus, and attached to the inside of a vacuum bath of the vacuum deposition apparatus. Furthermore, silver (Ag) was put into a resistance heating boat made of tungsten, and the resistance heating boat was attached to the inside of the vacuum bath. The pressure in the vacuum bath was then reduced to $4\times10^{-4}$ Pa, and the resistance heating boat was heated by energization to form an electrode layer formed of silver at a deposition velocity of from 0.1 nm/sec to 0.2 nm/sec at each film thickness. For Sample 101, the electrode layer was formed at a film thickness of 6 nm, and for Sample 102, the electrode layer was formed at a film thickness of 15 nm.

<Procedures for Preparation of Samples 103 and 104>

A transparent electrode having a constitution in which an electrode layer are sandwiched by high-refractive index layers constituted by the respective materials shown in the following Table 2 was prepared as follows.

Firstly, a high-refractive index layer was formed on a transparent substrate made of non-alkali glass.

For Sample 103, a high-refractive index layer constituted by titanium oxide ($TiO_2$) was formed by using an electron beam deposition apparatus. At this time, a hearth liner made of copper (Cu) and containing titanium oxide ($TiO_2$) was set in a vacuum bath of the electron beam deposition apparatus, oxygen gas ($O_2$) was added to the inside of the vacuum bath and the pressure was reduced to $2\times10^{-2}$ Pa, and a high-refractive index layer having a film thickness of 40 nm was formed by using an ion assist deposition (IAD) at a film formation velocity of 0.2 nm/sec.

On the other hand, for Sample 104, a high-refractive index layer formed of niobium oxide ($Nb_2O_5$) was formed by using a sputter film formation apparatus. At this time, a high-refractive index layer having a film thickness of 40 nm was formed at a RF (high frequency) bias of 300 W in a sputter film formation apparatus at a film formation velocity of 0.2 nm/sec.

The substrate on which the high-refractive index layer had been formed was then transferred to the vacuum bath of the vacuum deposition apparatus while retaining a vacuum state in each film formation apparatus, the pressure in the vacuum bath was reduced to $4\times10^{-4}$ Pa, and the heating boat containing silver was heated by energization. By this way, an electrode layer formed of silver and having a film thickness of 9 nm was formed at a deposition velocity of 0.1 nm/sec.

Thereafter, in each of Samples 103 and 104, a high-refractive index layer was formed on the upper part of the electrode layer by a similar procedure to that mentioned above. Namely, in Sample 103, a high-refractive index layer constituted by titanium oxide ($TiO_2$) was formed at a film thickness of 40 nm by ion assist deposition (IAD) using an electron beam deposition apparatus. Furthermore, in Sample 104, a high-refractive index layer constituted by niobium oxide ($Nb_2O_5$) was formed at a film thickness of 40 nm by using a sputter film formation apparatus. At this time, the substrate on which the electrode layer had been formed was transferred to each film formation apparatus while retaining a vacuum state in the vacuum bath of the film formation apparatus.

By this way, the transparent electrodes of Samples 103 and 104 each having a high-refractive index layer, an electrode layer including silver and a high-refractive index layer stacked in this order were prepared.

<Procedure for Preparation of Sample 105>

An electrode layer in which aluminum (Al) had been added silver (Ag) was formed as follows on a substrate made of glass.

Firstly, a transparent substrate made of non-alkali glass was fixed on a substrate holder of a commercially available vacuum deposition apparatus. Furthermore, silver (Ag) and aluminum (Al) were respectively put into a resistance heating boat made of tungsten, and these substrate holder and resistance heating boat were attached to a vacuum bath of the vacuum deposition apparatus. The pressure in the vacuum bath was then reduced to $4\times10^{-4}$ Pa, and an electrode layer in which an alloy had been formed by adding aluminum (Al) to silver (Ag) at a concentration of 20.0 atom % was formed at a film thickness of 9 nm, by co-deposition in which a deposition velocity was adjusted by adjusting an electrical current to each resistance heating boat.

<Procedures for Preparation of Samples 106 to 109>

A transparent electrode having a two-layer structure of a nitrogen-containing layer containing nitrogen and including the respective materials shown in the following Table 2 and an electrode layer formed of silver was formed on a substrate made of glass as follows. In addition, in Sample 106, a primer layer free from nitrogen was formed instead of the nitrogen-containing layer.

Firstly, a transparent substrate made of non-alkali glass was fixed on a substrate holder of a commercially available vacuum deposition apparatus. Furthermore, in the preparation of each transparent electrode, each compound shown in the following Table 2 was put into a resistance heating boat made of tantalum. These substrate holder and resistance heating boat were attached to a first vacuum bath in the vacuum deposition apparatus. Furthermore, silver (Ag) was put into a resistance heating boat made of tungsten, and the resistance heating boat was attached to inside of a second vacuum bath of the vacuum deposition apparatus.

Of the compounds used herein, Compound (1) is anthracene, which is free from nitrogen atoms, and Compound (2) is a compound containing nitrogen and having a value of an effective non-covalent electron pair content rate [n/M] of $[n/M]<2.0\times10^{-3}$.

[Chemical Formula 74]

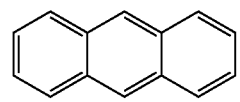

Compound (1) anthracene

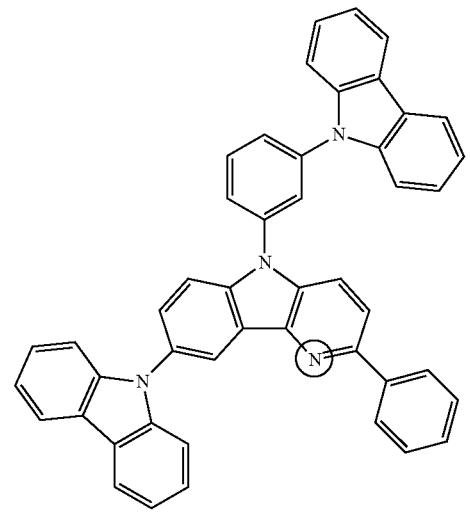

Compound (2)

Furthermore, Compound Nos. 1 and 39 are compounds each having a value of an effective non-covalent electron pair content rate [n/M] of $2.0 \times 10^{-3} \leq [n/M]$, which are suitably selected from the compounds shown in the above-mentioned Table 1. The following Table 2 also shows the numbers [n] of the effective non-covalent electron pairs, the molecular weight [M] and the effective non-covalent electron pair content rates [n/M] of the compounds used herein.

The pressure of the first vacuum bath was then reduced to $4 \times 10^{-4}$ Pa, and the heating boat containing each compound was heated by energization, whereby a nitrogen-containing layer constituted by each compound and having a film thickness of 3 nm was formed on the substrate at a deposition velocity of from 0.1 nm/sec to 0.2 nm/sec.

The substrate on which the nitrogen-containing layer had been formed was then transferred to the second vacuum bath under the original vacuum, and the pressure in the second vacuum bath was reduced to $4 \times 10^{-4}$ Pa, and the heating boat containing silver was heated by energization. By this way, an electrode layer formed of silver and having a film thickness of 9 nm was formed at a deposition velocity of from 0.1 nm/sec to 0.2 nm/sec, whereby the respective transparent electrodes of Samples 106 to 109 each having a stacked structure of the nitrogen-containing layer and the upper electrode layer were obtained.

<Procedures for Preparation of Transparent Electrodes of Samples 110 to 135>

A transparent electrode in which a high-refractive index layer, a nitrogen-containing layer, an electrode layer containing silver (Ag) as a main component and a high-refractive index layer had been stacked in this order was prepared on a substrate made of glass with referring to the following Table 2.

Firstly, a high-refractive index layer having a film thickness of 40 nm was formed on a transparent substrate made of non-alkali glass. At this time, film formation using a different film formation apparatus was conducted depending on the material constituting the high-refractive index layer. Specifically, for the formation of a high-refractive index layer constituted by niobium oxide ($Nb_2O_5$), indium zinc oxide (IZO) or indium tin oxide (ITO), film formation using a sputtering film formation apparatus was conducted. On the other hand, for the formation of a high-refractive index layer constituted by titanium oxide ($TiO_2$), film formation was conducted by ion assist deposition (IAD) using an electron beam deposition apparatus. The formation of the high-refractive index layers using these respective apparatuses were conducted as in the procedures explained for Samples 103 and 104.

Furthermore, each of the compounds shown in Table 2 was put into a resistance heating boat made of tantalum, and the resistance heating boat was attached into a first vacuum bath of the vacuum deposition apparatus. Furthermore, silver (Ag) was put into a resistance heating boat made of tungsten, the resistance heating boat was attached into a second vacuum bath of the vacuum deposition apparatus. In Sample 116, silver (Ag) and aluminum (Al) were respectively put into respective resistance heating boats made of tungsten.

The substrate on which the high-refractive index layer had been formed was then transferred to the first vacuum bath of the vacuum deposition apparatus while the vacuum state in each film formation apparatus was retained, the pressure in the first vacuum bath was reduced to $4 \times 10^{-4}$ Pa, and the heating boat containing each compound was heated by energization, whereby a nitrogen-containing layer formed of each compound and having a film thickness of 3 nm was formed on a substrate at a deposition velocity of from 0.1 nm/sec to 0.2 nm/sec.

The substrate on which the nitrogen-containing layer and the other lower layers had been formed was then transferred to the second vacuum bath under the original vacuum, and the pressure in the second vacuum bath was reduced to $4 \times 10^{-4}$ Pa, and an electrode layer formed of silver (Ag) was formed at a film thickness of 9 nm by deposition in which the deposition velocity was adjusted by adjusting the electrical current to the stance heating boat. However, in Sample 116, an electrode layer in which an alloy had been formed by adding silver (Ag) and aluminum (Al) at a concentration of 20.0 atom % was formed at a film thickness of 9 nm by co-deposition in which the deposition velocity had been adjusted.

Thereafter, in each sample, a high-refractive index layer having a film thickness of 40 nm was formed on the upper part of the electrode layer by a similar procedure to that mentioned above. Specifically, for the formation of a high-refractive index layer constituted by niobium oxide ($Nb_2O_5$), indium zinc oxide (IZO) or indium tin oxide (ITO), film formation using a sputtering film formation apparatus was conducted. On the other hand, for the formation of a high-refractive index layer constituted by titanium oxide ($TiO_2$), film formation was conducted by ion assist deposition (IAD) using an electron beam deposition apparatus. The formation of the high-refractive index layers using these respective apparatuses were conducted as in the procedures explained in Samples 103 and 104. Furthermore, at this time, the substrate on which the electrode layer and the other lower layers had been formed was transferred to each film formation apparatus while the vacuum state in the vacuum bath of the vacuum deposition apparatus was retained. By this way, the respective transparent electrodes of Samples 110 to 135 in which a high-refractive index layer, a nitrogen-containing layer, an electrode layer and a high-refractive index layer were stacked in this order were prepared.

<Procedures for Preparation of Transparent Electrodes of Samples 136 and 137>

The respective transparent electrodes of Samples 136 and 137 were prepared in a similar procedure to that for the above-mentioned Samples 122 and 129, except that a substrate made of polyethylene telephthalate (PET) was used in the procedure explained in the preparation of Samples 122 and 129.

<Evaluations of Respective Samples of Example 1>

For the respective transparent electrodes of Samples 101 to 137 prepared above, (1) the transmittance of light at a wavelength of 550 nm, (2) a sheet resistance, and (3) a high temperature-high humidity storage property were measured.

(1) The light transmittance was measured by using a spectrometer (U-3300 manufactured by Hitachi, Ltd.) and using the same substrate as in the sample as a base line. (2) The sheet resistance was measured by measuring a resistance in a contactless manner with a resistance meter (EC-80 manufactured by Napson Corporation). (3) In the measurement of the high temperature-high humidity storage property, the sheet resistance was measured after each of the transparent electrodes of Samples 101 to 136 was stored under a high temperature-high humidity circumstance (temperature 60° C., humidity 90%) for 300 hours. Furthermore, the increase rate of the sheet resistance after the storage relative to the sheet resistance before the storage was calculated as the high temperature-high humidity storage property. The smaller the obtained value is, the more preferable the result is. The result is also shown in the following Table 2.

TABLE 2

| Sample No. | Substrate Material | Transparent electrode (electrode at lower part of anode) ||||||||||| Results of evaluations ||||
|---|---|---|---|---|---|---|---|---|---|---|---|---|---|---|---|---|
| | | High-refractive index layer || Nitrogen-containing layer ||||| Electrode layer || High-refractive index layer || Light transmittance (550 nm) | Sheet resistance (Ω/sq.) | High temperature-high humidity storage property (resistance increase rate) | Notes |
| | | Material | Film thickness (nm) | Material | Film thickness (nm) | Number of non-covalent electron pairs [n] | Molecular weight [M] | [n/M] | Material | Film thickness (nm) | Material | Film thickness (nm) | | | | |
| 101 | Glass | — | — | — | — | — | — | — | Ag | 6 | — | — | 45 | N/D | — | Comparative |
| 102 | Glass | TiO$_2$ | 40 | — | — | — | — | — | Ag | 15 | — | — | 25 | 5.0 | 700% | Comparative |
| 103 | Glass | Nb$_2$O$_5$ | — | — | — | — | — | — | Ag | 9 | TiO$_2$ | 40 | >80 | 9.0 | 650% | Comparative |
| 104 | Glass | — | — | — | — | — | — | — | AgAl | 9 | Nb$_2$O$_5$ | — | >80 | 9.0 | 650% | Comparative |
| 105 | Glass | — | — | Compound (1) | 3 | 0 | 178.23 | 0.0E+00 | Ag | 9 | — | — | 70 | 10.0 | 600% | Comparative |
| 106 | Glass | — | — | Compound (2) | 3 | 1 | 650.77 | 1.5E-03 | Ag | 9 | — | — | 40 | 10.0 | 400% | Comparative |
| 107 | | | | No. 1 | | 1 | 500.55 | 2.0E-03 | | | | | 50 | 7.0 | 160% | |
| 108 | | | | No. 39 | | 3 | 537.65 | 5.6E-03 | | | | | 59 | 6.0 | 155% | |
| 109 | | | | No.1 | | 1 | 500.55 | 2.0E-03 | | | | | 59 | 5.0 | 150% | |
| 110 | Glass | Nb$_2$O$_5$ | 40 | Compound (2) | 3 | 1 | 650.77 | 1.5E-03 | Ag | 9 | Nb$_2$O$_5$ | 40 | >85 | 5.0 | 100% | Present invention |
| 111 | | IZO | | | | | | | | | IZO | | >80 | 5.0 | 100% | |
| 112 | | ITO | | | | | | | | | ITO | | >80 | 5.0 | 100% | |
| 113 | | TiO$_2$ | | | | | | | | | TiO$_2$ | | >80 | 5.0 | 100% | |
| 114 | Glass | TiO$_2$ | 40 | Compound (2) | 3 | 1 | 650.77 | 1.5E-03 | Ag | 9 | Nb$_2$O$_5$ | 40 | >80 | 7.5 | 140% | Present invention |
| 115 | Glass | Nb$_2$O$_5$ | 40 | No. 1 | | 1 | 500.55 | 2.0E-03 | Ag | 9 | TiO$_2$ | 40 | >85 | 5.0 | 100% | Present invention |
| 116 | Glass | Nb$_2$O$_5$ | 40 | No. 1 | | 1 | 500.55 | 2.0E-03 | AgAl | 9 | TiO$_2$ | 40 | >85 | 9.0 | 100% | Present invention |
| 117 | Glass | Nb$_2$O$_5$ | 40 | No. 1 | 3 | 1 | 500.55 | 2.0E-03 | Ag | 9 | | | >85 | 5.0 | 100% | Present invention |
| 118 | | | | No. 4 | | 2 | 655.81 | 3.0E-03 | | | | | >85 | 5.0 | | |
| 119 | | | | No. 39 | | 3 | 537.65 | 5.6E-03 | | | | | >85 | 4.5 | | |
| 120 | | | | No. 40 | | 2 | 332.40 | 6.0E-03 | | | | | >85 | 4.0 | | |
| 121 | | | | No. 38 | | 4 | 538.64 | 7.4E-03 | | | | | >85 | 3.0 | | |
| 122 | | | | No. 7 | | 4 | 716.83 | 5.6E-03 | | | | | >85 | 4.0 | | |
| 123 | | | | No. 8 | | 6 | 1036.19 | 5.8E-03 | | | | | >85 | 4.0 | | |
| 124 | | | | No. 9 | | 4 | 551.64 | 7.3E-03 | | | | | >85 | 3.0 | | |
| 125 | | | | No. 10 | | 4 | 516.60 | 7.7E-03 | | | | | >85 | 3.0 | | |
| 126 | | | | No. 11 | | 5 | 539.63 | 9.3E-03 | | | | | >85 | 3.0 | | |
| 127 | | | | No. 12 | | 6 | 646.76 | 9.3E-03 | | | | | >85 | 3.0 | | |
| 128 | | | | No. 13 | | 4 | 412.45 | 9.7E-03 | | | | | >85 | 3.0 | | |
| 129 | | | | No. 14 | | 6 | 616.71 | 9.7E-03 | | | | | >85 | 3.0 | | |
| 130 | | | | No. 15 | | 5 | 463.53 | 1.1E-02 | | | | | >85 | 3.0 | | |
| 131 | | | | No. 18 | | 6 | 312.33 | 1.9E-02 | | | | | >85 | 3.0 | | |
| 132 | | | | No. 42 | | 6 | 579.19 | 1.0E-02 | | | | | >85 | 3.0 | | |

TABLE 2-continued

| | | High-refractive index layer | | Transparent electrode (electrode at lower part of anode) | | | | | | High-refractive index layer | | Results of evaluations | | | |
|---|---|---|---|---|---|---|---|---|---|---|---|---|---|---|---|
| | | | | Nitrogen-containing layer | | | | Electrode layer | | | | | | High temperature-high humidity storage property (resistance increase rate) | |
| Sample No. | Substrate Material | Material | Film thickness (nm) | Material | Film thickness (nm) | Number of non-covalent electron pairs [n] | Molecular weight [M] | [n/M] | Material | Film thickness (nm) | Material | Film thickness (nm) | Light transmittance (550 nm) | Sheet resistance (Ω/sq.) | | Notes |
| 133 | PET | Nb$_2$O$_5$ | 40 | No. 46 | 3 | 3 | 576.65 | 5.2E-03 | Ag | 9 | TiO$_2$ | 40 | >85 | 4.0 | | |
| 134 | | | | No. 47 | | 3 | 545.55 | 5.5E-03 | | | | | >85 | 4.0 | | |
| 135 | | | | No. 48 | | 6 | 379.38 | 1.6E-02 | | | | | >85 | 3.0 | | |
| 136 | | | | No. 7 | | 4 | 716.83 | 5.6E-03 | | | | | >85 | 3.0 | 100% | Present invention |
| 137 | | | | No. 14 | | 6 | 616.71 | 9.7E-03 | | | | | >85 | 3.0 | | |

<Evaluation Results of Example 1>

Table 2 indicates that the respective transparent electrodes of Samples 110 to 137, i.e., transparent electrodes each having a high-refractive index layer, a nitrogen-containing layer, an electrode layer containing silver (Ag) as a main component and a high-refractive index layer stacked in this order, had a sheet resistance value of lower than 10 Ω/sq. and a high temperature-high humidity storage property of 140% or less, despite that the light transmittance was 80% or more, and thus they were transparent electrodes having both improved electroconductivity and improved light transmission property, and improved reliability.

Furthermore, the comparison of Samples 110 to 113, 115 and 117, which were different in only the materials of the high-refractive index layer, among Samples 110 to 137 revealed a tendency that the value of the light transmittance was higher at a higher refractive index of the high-refractive index layer (Samples 110, 113, 115 and 117 including niobium oxide ($Nb_2O_5$), titanium oxide ($TiO_2$) and the like). The same also applied to the cases when the two high-refractive index layers were constituted by different kinds of compounds, as indicated in the results of Samples 115 and 117.

Furthermore, among Samples 110 to 115 and 117 to 137, the transparent electrodes 110 to 113, 115 and 117 to 137, each of which had a nitrogen-containing layer constituted by using a compound having an effective non-covalent electron pair content rate [n/M] of $2.0 \times 10^{-3} \le [n/M]$, had lower sheet resistances than that of the transparent electrode without such nitrogen-containing layer (Sample 114), and thus it was confirmed that the transparent electrodes were formed at approximately even film thicknesses by film growth of a single layer growth type (Frank-van der Merwe: FM type).

Furthermore, when the transparent electrodes of Sample 105 and Sample 116, i.e., the transparent electrodes each having an electrode layer including an alloy of silver (Ag) and aluminum (Al) were compared, it was confirmed that the transparent electrode 116, which had a nitrogen-containing layer constituted by using a compound having an effective non-covalent electron pair content rate [n/M] of $2.0 \times 10^{-3}$ [n/M], had a lower sheet resistance than that of the transparent electrode 105 without such nitrogen-containing layer, and thus was formed at an approximately even film thickness by film growth of a single layer growth type (Frank-van der Merwe: FM type).

Furthermore, it was confirmed that these transparent electrodes of Samples 110 to 113 and 115 to 137 had a high temperature-high humidity storage property of 100%, and thus were excellent in high temperature-high humidity resistance.

Furthermore, the comparison of Samples 117 to 135, in which only the values of the effective non-covalent electron pair content rate [n/M] were different, among Samples 110 to 137 revealed that the sheet resistance tended to be lower at a higher effective non-covalent electron pair content rate [n/M], and the film growth of a FM-type was thus affected by the effective non-covalent electron pair content rate [n/M].

The above-mentioned results were similar to those in the cases when the substrate was glass or a plastic material (PET).

On the other hand, in Sample 101 without a primer layer such as a nitrogen-containing layer, the sheet resistance was not able to be measured; and Sample 102 has a thick electrode layer with a film thickness of 15 nm, and had a low sheet resistance but had a low light transmittance, and thus was not able to be used as a transparent electrode. Furthermore, in Samples 103 and 104 in which only an electrode layer constituted by silver (Ag) is sandwiched by high-refractive index layers, Sample 105, which contained silver (Ag) as a main component and to which only aluminum was added, and Samples 106 to 109, in which an electrode layer constituted by silver (Ag) was stacked on a primer layer and a nitrogen-containing layer, transparent electrodes that achieved both improvement of the electroconductivity and improvement of the light transmission property and had improved reliability were not able to be obtained.

Furthermore, the transparent electrode of Sample 134 was such that a nitrogen-containing layer was formed by using the compound of No. 47 having a nitro group, and for which it was confirmed that fine results in light transmittance, sheet resistance and high temperature-high humidity storage property were obtained. Furthermore, fine results were similarly obtained when compared with Sample 133 that was constituted by using No. 46 having an approximately similar effective non-covalent electron pair content rate [n/M] to that of Sample 134. Therefore, it was confirmed that the non-covalent electron pair of the nitrogen atom of the nitro group ($-NO_2$) was utilized in the resonance structure with the oxygen atoms, but was a non-covalent electron pair that was neither involved in aromaticity nor coordinated to a metal, and thus exerted an effect in the bonding with silver (Ag) as [effective non-covalent electron pair].

Figure 8:
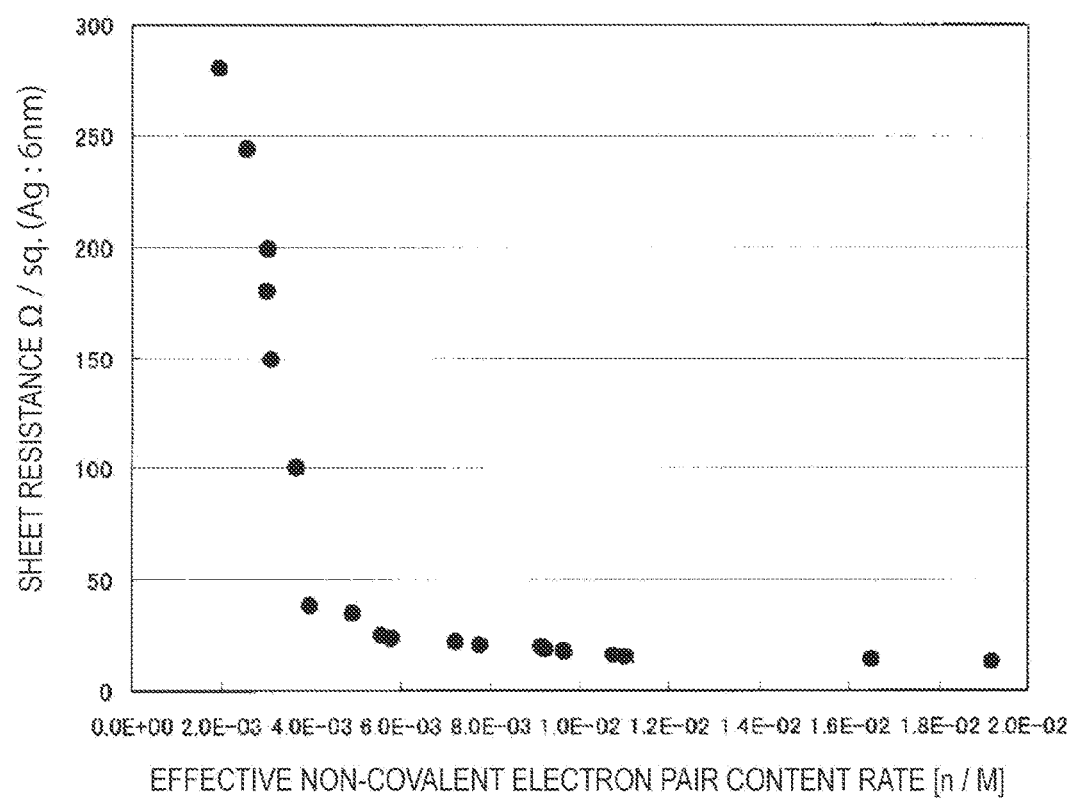
FIG. 8 is a graph showing the relationship between the effective non-covalent electron pair content rate [n/M] of the nitrogen-containing layer and the sheet resistance of the electrode layer stacked on the nitrogen-containing layer.

In addition, FIG. 8 shows a graph in which the effective non-covalent electron pair content rates [n/M] of the compounds that constitute the nitrogen-containing layer and the values of the sheet resistances measured on the respective transparent electrodes are plotted, for the transparent electrodes in which an electrode layer formed of silver (Ag) and having a film thickness of 6 nm was disposed on the upper part of the nitrogen-containing layer including each of Compounds No. 1 to No. 20 having an effective non-covalent electron pair content rate [n/M] of $2.0 \times 10^{-3} \le [n/M]$ $1.9 \times 10^{-2}$.

In the graph of FIG. 8, a tendency that the sheet resistance of the transparent electrode became lower at a larger value of the effective non-covalent electron pair content rate [n/M] was seen in the range of the effective non-covalent electron pair content rate [n/M] of $2.0 \times 10^{-3} \le [n/M]$ $1.9 \times 10^{-2}$. Furthermore, it was confirmed that the effect of dramatically decreasing the sheet resistance was obtained in the range of $3.9 \times 10^{-3} \le [n/M]$, with deeming the effective non-covalent electron pair content rate [n/M]=$3.9 \times 10^{-3}$ as a boundary. Furthermore, it was confirmed that the effect of surely decreasing the sheet resistance can be obtained in the range of $6.5 \times 10^{-3} \le [n/M]$.

The above-mentioned results were similar to those in the samples in which the nitrogen-containing layer was formed by film formation by application. Furthermore, similar results were obtained also in the sample in which the nitrogen-containing layer was constituted by mixing a nitrogen-containing compound with other compound.

Accordingly, it was confirmed that an electrode film that is a thin film so as to obtain a light transmission property but has a low resistance (i.e., a transparent electrode) can be obtained by selecting and using a compound for constituting a nitrogen-containing layer disposed adjacent to an electrode layer by using an effective non-covalent electron pair content rate [n/M] as an index.

EXAMPLE 2

<<Preparation of Bottom Emission Type Organic Electroluminescent Elements>>

Figure 9:
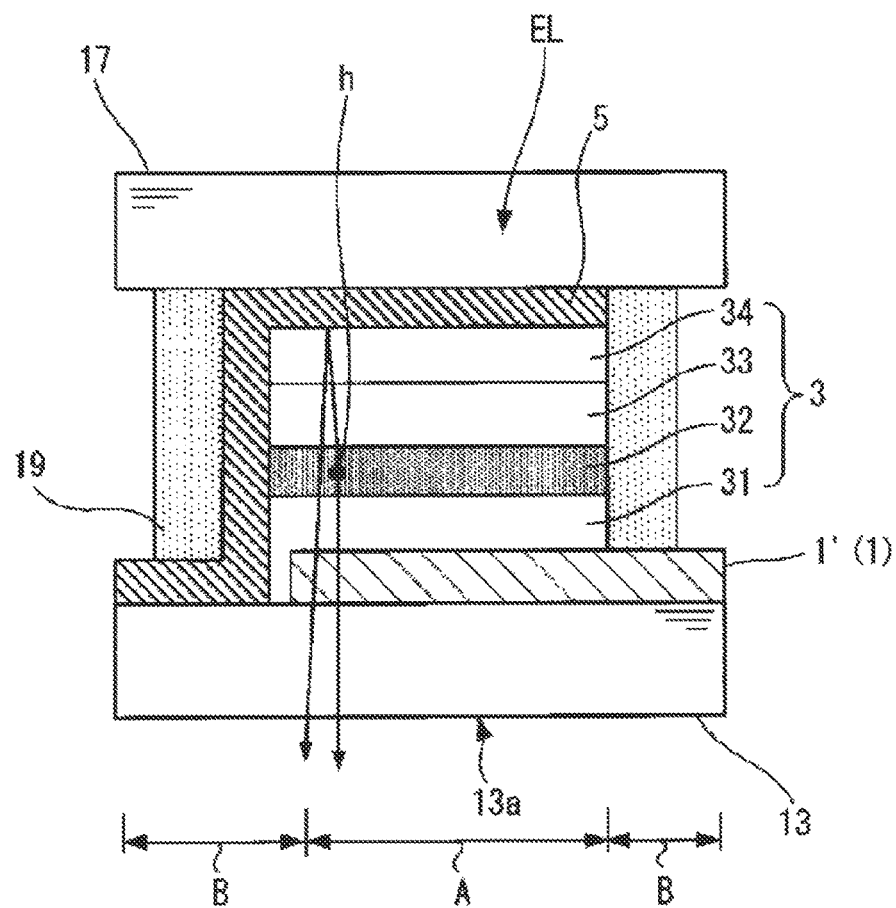
FIG. 9 is a cross-sectional constitutional drawing for explaining the bottom emission type organic electroluminescent element prepared in Example 2.

Respective bottom emission type organic electroluminescent elements of Samples 201 to 229, in which a transparent electrode having each constitution was disposed as an anode on the lower part of the luminescent functional layer, were prepared, as the following Table 3 show the constitutions. The preparation procedure will be explained with referring to FIG. 9. In addition, the following Table 3 shows the constitutions of the transparent electrodes used in the organic electroluminescent elements of Samples 201 to 229.

<Procedure for Preparation of Organic Electroluminescent Elements of Samples 201 to 229>

(Formation of Transparent Electrode 1')

Firstly, in Samples 201 to 229, a transparent electrode 1' having each constitution shown in the following Table 3 was formed on the upper part of a transparent substrate 13 made of polyethylene telephthalate (PET). The procedure for the formation of the transparent electrode having each structure was conducted in a similar manner to the preparation of the transparent electrode having a structure corresponding to that in Example 1. Among the transparent electrodes 1' having the respective constitutions, the transparent electrodes in Samples 208 to 229 were each the transparent electrode 1 having the constitution of the present invention.

(Formation of Hole Transport/Injection Layer 31)

A heating boat containing α-NPD shown in the following structural formula as a hole transport injection material was heated by energization, whereby a hole transport/injection layer 31 formed of α-NPD, which serves as both a hole injection layer and a hole transport layer, was formed on the transparent electrode 1'. At this time, the deposition velocity was 0.1 nm/sec to 0.2 nm/sec, and the film thickness was 20 nm.

[Chemical Formula 75]

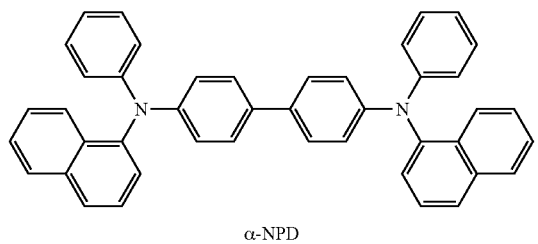

α-NPD (Formation of Luminescent Layer 32)

Secondly, a heating boat containing Host material H-1 shown in the following structural formula, and a heating boat containing Phosphorescent compound Ir1 shown in the following structural formula were each independently energized, whereby a luminescent layer 32 formed of Host material H-1 and Phosphorescent compound In was formed on the hole transport/injection layer 31. At this time, the energization of the heating boats was adjusted so that the deposition velocities became host material H-1: phosphorescent compound Ir1=100:6. Furthermore, the film thickness was 30 nm.

[Chemical Formula 76]

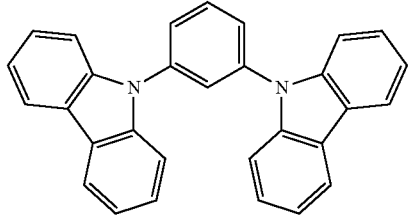

H-1

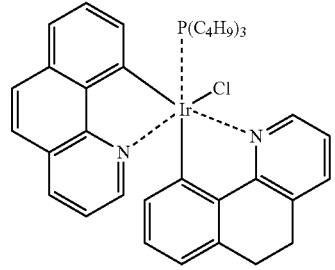

Ir1

(Formation of Hole Blocking Layer 33)

Secondly, a heating boat containing BAlq shown in the following structural formula as a hole blocking material was heated by energization, whereby a hole blocking layer 33 formed of BAlq was formed on the luminescent layer 32. At this time, the deposition velocity was 0.1 nm/sec to 0.2 nm/sec, and the film thickness was 10 nm.

[Chemical Formula 77]

BAlq

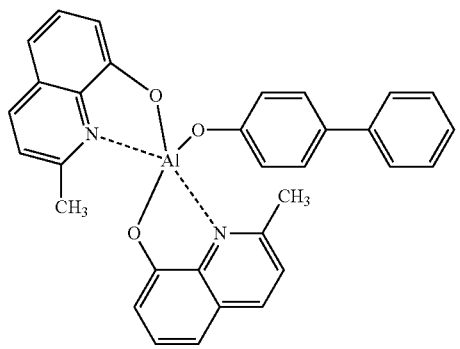

(Formation of Electron Transport/Injection Layer 34)

Thereafter, a heating boat containing Compound 10, an electron transport material, having the structural formula previously shown as the compound for constituting the nitrogen-containing layer, and a heating boat containing potassium fluoride, were each independently energized, whereby an electron transport/injection layer 34 formed of Compound 10 and potassium fluoride and serving as both an electron injection layer and an electron transport layer was formed on the hole blocking layer 33. At this time, the energization of the heating boats was adjusted so that the deposition velocities became Compound 10:potassium fluoride=75:25. Furthermore, the film thickness was 30 nm.

(Formation of Counter Electrode 5:Cathode)

After the above-mentioned formation, the transparent substrate 13 on which the luminescent functional layer 3 had been formed was transferred into a second vacuum bath of the vacuum deposition apparatus, the pressure in the second vacuum bath was reduced to $4\times10^{-4}$ Pa, and a heating boat containing aluminum and attached to the inside of the second vacuum bath was heated by energization. This formed a counter electrode 5 formed of aluminum and having a film thickness of 100 nm at a deposition velocity of 0.3 nm/sec. This counter electrode 5 is used as a cathode. In this way, a bottom emission type organic electroluminescent element EL was formed on the transparent substrate 13.

(Sealing of Element)

Thereafter, the organic electroluminescent element EL was covered with a sealing material 17 formed of a glass substrate having a thickness 300 μm, and the gap between the sealing material 17 and the transparent substrate 13 was filled with an adhesive 19 (sealant material) to surround the organic electroluminescent element EL. As the adhesive 19, an epoxy-based photocurable adhesive (LUXTRACK LC0629B manufactured by Toagosei Co., Ltd.) was used. The adhesive 19 was cured by irradiating the adhesive 19 filling the gap between the sealing material 17 and the transparent substrate 13 with UV light from the side of the sealing material 17 formed of a glass substrate to thereby the seal the organic electroluminescent element EL.

In the formation of the organic electroluminescent element EL, a deposition mask was used in the formation of each layer, and 4.5 cm×4.5 cm on the center of the transparent substrate 13 of 5 cm×5 cm was set as a luminescent region A, and a non-luminescent region B with a width 0.25 cm was disposed on the whole circumstance of the luminescent region A. Furthermore, the electrode layer 1b of the transparent electrode 1' as an anode and the counter electrode 5 as a cathode were formed in a shape in which the terminal parts were drawn out of the circumference of the transparent substrate 13, in a state that the electrodes were insulated by from the hole transport/injection layer 31 to the electron transport/injection layer 34.

In this way, respective luminescent panels of the organic electroluminescent elements of Samples 201 to 229 in which the organic electroluminescent element EL was disposed on the transparent substrate 13, and this was sealed with the sealing material 17 and the adhesive 19, were obtained. In these respective luminescent panels, each luminescent light h generated in the luminescent layer 32 is extracted from the side of the transparent substrate 13.

<Evaluation of Respective Samples of Example 2>

The organic electroluminescent element ELs (luminescent panels) prepared in Samples 201 to 229 were evaluated for (1) the external quantum efficiency (External Quantum. Efficiency:EQE) and (2) the high temperature-high humidity storage property. The results thereof are also shown in the following Table 3.

(1) The external quantum efficiency (EQE) was obtained by measuring the luminance and the luminescent spectrum in the luminescence of each organic electroluminescent element with a spectral radiance meter CS-1000 (manufactured by Konica Minolta Sensing), and calculating the efficiency by a luminance conversion process based on these measured values. Here, the value was represented as a relative value when the value of the organic electroluminescent element of Sample 201 was deemed as 1.0.

(2) For the high temperature-high humidity storage property, 10 pieces of each of the organic electroluminescent element ELs sealed as in Samples 201 to 229 were prepared, and the property was evaluated for a) the number of luminescence when these were stored at a high-temperature, high-humidity environment (n/10), b) the amount of change in the driving voltages before and after the storage (ΔV), and c) the rectification ratio [log]. The high-temperature, high-humidity environment was such that the temperature was 60° C. and the humidity was 90%, and the storage time was 300 hours. In the storage, each organic electroluminescent element EL was driven at a driving voltage at which the luminance became 1000 cd.

a) The number of luminescence (n/10) was the number of the samples in which luminescent was confirmed even after the storage for 300 hours among 10 samples for each of Samples 201 to 229, and the number closer to 10 is more preferable.

b) The amount of change in driving voltage ΔV was calculated as an average value for the organic electroluminescent element EL for which luminescent was confirmed after the storage in each of Samples 201 to 229, and a smaller numerical value is more preferable.

c) For the rectification ratio [log], an electrical current value in the case when a driving voltage of +2.5 V was applied in the forward direction and an electrical current value in the case when a driving voltage of −2.5 V was applied in the reverse direction to each luminescent panel after the storage were measured, and the logarithm value of the ratio of these electrical current values [electrical current value (+2.5 V)/electrical current value (−2.5 V)] was calculated and used as a rectification ratio [log]. A higher rectification ratio [log] represents a more excellent leak property. The result thereof is also shown in the following Table 3.

| | Transparent electrode (electrode on lower part of anode) | | | | | | | | | Results of Evaluation | | | | |
|---|---|---|---|---|---|---|---|---|---|---|---|---|---|---|
| | High-refractive index layer | | Nitrogen-containing layer | | | | Electrode layer | | High-refractive index layer | | | High temperature-high humidity storage property | | |
| Sample No. | Material | Film thickness (nm) | Material | Film thickness (nm) | Number of non-covalent electron pairs [n] | Molecular weight [M] | [n/M] | Material | Film thickness (nm) | Material | Film thickness (nm) | EQF (ratio to Sample 201) | Number of luminescence [/10 pieces] | Difference in driving voltages [ΔV] | Rectification ratio [Log] | Notes |
| 201 | $TiO_2$ | 40 | — | — | — | — | — | Ag | 9 | $TiO_2$ | 40 | 1.00 | 3 | >10 | 2.0 | Comparative |
| 202 | $Nb_2O_5$ | — | — | — | — | — | — | — | — | $Nb_2O_5$ | — | 1.00 | 3 | >10 | 2.0 | |
| 203 | — | — | — | — | — | — | — | AgAl | 9 | — | — | 0.68 | 3 | >10 | 2.0 | Comparative |
| 204 | — | — | Compound (1) | 3 | 0 | 178.23 | 0.0E+00 | Ag | 9 | — | — | 0.42 | 3 | >10 | 2.0 | Comparative |
| 205 | — | — | Compound (2) | | 1 | 650.77 | 1.5E-03 | | | — | — | 0.61 | 4 | 8.2 | 2.0 | |
| 206 | — | — | No.1 | | 1 | 500.55 | 2.0E-03 | | | — | — | 0.71 | 6 | 7.6 | 2.0 | |
| 207 | — | — | No.39 | | 3 | 537.65 | 5.6E-03 | | | — | — | 0.78 | 8 | 5.8 | 2.0 | |
| 208 | $TiO_2$ | 40 | Compound (2) | 3 | 1 | 650.77 | 1.5E-03 | Ag | 9 | $Nb_2O_5$ | 40 | 1.01 | 10 | 1.5 | 4.0 | Present invention |
| 209 | $Nb_2O_5$ | 40 | No.1 | | 1 | 500.55 | 2.0E-03 | AgAl | 9 | $TiO_2$ | 40 | 1.19 | 10 | 1.1 | 4.0 | |
| 210 | $Nb_2O_5$ | 40 | No.1 | 3 | 1 | 500.55 | 2.0E-03 | Ag | 9 | $TiO_2$ | 40 | 1.21 | 10 | 1.0 | 4.0 | Present invention |
| 211 | | | No.1 | | 1 | 500.55 | 2.0E-03 | | | | | 1.21 | 10 | 1.2 | 4.0 | |
| 212 | | | No.4 | | 2 | 655.81 | 3.0E-03 | | | | | 1.20 | 10 | 1.0 | 4.0 | |
| 213 | | | No.39 | | 3 | 537.65 | 5.6E-03 | | | | | 1.25 | 10 | 1.0 | 4.0 | |
| 214 | | | No.40 | | 2 | 332.40 | 6.0E-03 | | | | | 1.27 | 10 | 1.0 | 4.0 | |
| 215 | | | No.38 | | 4 | 538.64 | 7.4E-03 | | | | | 1.27 | 10 | 1.0 | 4.0 | |
| 216 | | | No.7 | | 4 | 716.83 | 5.6E-03 | | | | | 1.26 | 10 | 1.0 | 5.0 | |
| 217 | | | No.8 | | 6 | 1036.19 | 5.8E-03 | | | | | 1.26 | 10 | 1.0 | 5.0 | |
| 218 | | | No.9 | | 4 | 551.64 | 7.3E-03 | | | | | 1.28 | 10 | 1.0 | 5.0 | |
| 219 | | | No.10 | | 4 | 516.60 | 7.7E-03 | | | | | 1.27 | 10 | 1.0 | 5.0 | |
| 220 | | | No.11 | | 5 | 539.63 | 9.3E-03 | | | | | 1.28 | 10 | 1.0 | 5.0 | |
| 221 | | | No.12 | | 6 | 646.76 | 9.3E-03 | | | | | 1.26 | 10 | 1.0 | 5.0 | |
| 222 | | | No.13 | | 4 | 412.45 | 9.7E-03 | | | | | 1.27 | 10 | 1.0 | 5.0 | |
| 223 | | | No.14 | | 6 | 616.71 | 9.7E-03 | | | | | 1.27 | 10 | 1.0 | 5.0 | |
| 224 | | | No.15 | | 5 | 463.53 | 1.1E-02 | | | | | 1.28 | 10 | 1.0 | 5.0 | |
| 225 | | | No.18 | | 6 | 312.33 | 1.9E-02 | | | | | 1.28 | 10 | 1.0 | 5.0 | |
| 226 | | | No.42 | | 6 | 579.19 | 1.0E-02 | | | | | 1.28 | 10 | 1.0 | 5.0 | |
| 227 | | | No.46 | | 3 | 576.65 | 5.2E-03 | | | | | 1.26 | 10 | 1.0 | 5.0 | |
| 228 | | | No.47 | | 3 | 545.55 | 5.5E-03 | | | | | 1.24 | 10 | 1.0 | 5.0 | |
| 229 | | | No.48 | | 6 | 379.38 | 1.6E-02 | | | | | 1.28 | 10 | 1.0 | 5.0 | |

<Results of Evaluations of Example 2>

As is apparent from Table 3, it was confirmed that the respective organic electroluminescent element ELs of Samples 208 to 229, i.e., organic electroluminescent element ELs each including a transparent electrode in which a high-refractive index layer, a nitrogen-containing layer, an electrode layer containing silver (Ag) as a main component and containing additional elements, and a high-refractive index layer are stacked in this order, had higher external quantum efficiencies (EQE) and more excellent luminescent properties, and a lower difference in driving voltages after storage at a high-temperature, high-humidity environment than those in Samples 201 to 207. All of the ten samples for each of Samples 208 to 229 exhibited luminescence and also had sufficient rectification ratios [log] after the storage and thus had suppressed leak, and were also excellent in high temperature-high humidity resistance.

Among these, the respective organic electroluminescent element ELs of Samples 209 to 229 each including a compound having an effective non-covalent electron pair content rate [n/M] of $2.0 \times 10^{-3} \leq [n/M]$ as a compound for constituting a nitrogen-containing layer each had a high external quantum efficiency (EQE) of 1.19 or more, a difference in driving voltages after high temperature-high humidity storage that was suppressed to be 1.2 or less, and also had a rectification ratio of 4.0 or more and a fine high temperature-high humidity resistance.

Accordingly, it was confirmed that an organic electroluminescent element EL including the transparent electrode 1' having the constitution of the present invention enables luminescent at a high luminance and a low driving voltage, and is excellent in long term reliability. Furthermore, it was also confirmed that a decrease in driving voltage for obtaining a predetermined luminance and an improvement in luminescent lifetime due to the decrease in driving voltage are also expected.

EXAMPLE 3

Using each of the transparent electrodes of Samples 208 to 229 each having the constitution of the present invention prepared in Example 1 as an anode, each organic electroluminescent element of a bottom emission type which emits white light including this anode on the lower part of a luminescent functional layer was prepared. When the prepared respective organic electroluminescent elements were evaluated similarly to Example 2, it was confirmed that the organic electroluminescent elements had high external quantum efficiencies (EQE), were excellent in luminescent property and excellent in high temperature-high humidity storage property as in Example 2. Accordingly, it was confirmed that the present invention is also effective as a constitution of a white luminescence organic electroluminescent element.

In addition, the procedure of the preparation of each white luminescence organic electroluminescent element prepared in Example 3 is as follows.

Firstly, each of the transparent electrodes of Samples 208 to 229 having the constitution of the present invention prepared in Example 1 was formed as an anode on a transparent substrate made of glass of 30 mm×30 mm having a thickness of 0.7 mm. The transparent substrate on which each anode had been formed was then fixed on a substrate holder of a commercially available vacuum deposition apparatus.

On the other hand, the constitutional materials of the respective layers to be subsequently formed were filled in respective deposition crucibles in the vacuum deposition apparatus by only optimal amounts for the preparation of the respective elements, and the deposition crucibles were fixed in the vacuum deposition apparatus. As the deposition crucibles, those prepared by materials for resistance heating made of molybdenum or tungsten were used.

Thereafter, the pressure in the vacuum deposition apparatus was reduced to a vacuum degree of $1 \times 10^{-4}$ Pa, and the above-mentioned deposition crucible containing α-NPD was heated by energization to deposit on the transparent electrode at a deposition velocity of 0.1 nm/sec, whereby a hole injection transport layer having a film thickness of 40 nm was formed.

Subsequently, the following Compound BD-1, which is a blue luminescent dopant, and the following Compound H-2, which is a host compound, were co-deposited at a deposition velocity of 0.1 nm/sec so that the concentration of Compound BD-1 became 5%, whereby a fluorescent luminescence layer having a film thickness of 15 nm and exhibiting blue luminescence was formed.

[Chemical Formula 78]

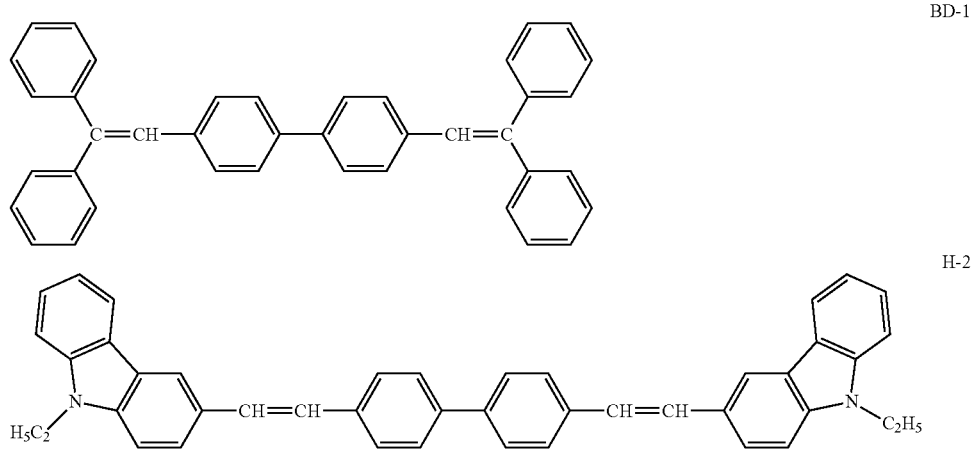

Secondly, the following Compound GD-1, which is a green luminescent dopant, the following Compound RD-1, which is a red luminescent dopant, and the following Compound H-3, which is a host compound, were co-deposited at a deposition velocity of 0.1 nm/sec so that the concentration of Compound GD-1 became 17% and the concentration of Compound RD-1 became 0.8%, whereby a phosphorescent luminescent layer having a film thickness 15 nm and exhibiting yellow was formed. In addition, Compound GD-1 is Compound D-15 shown above as a luminescent dopant, and Compound RD-1 is Compound D-1 shown above as a luminescent dopant.

[Chemical Formula 79]

GD-1 (D15)

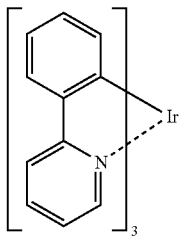

RD-1 (D-1)

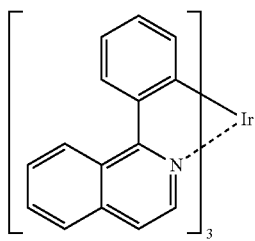

H-3

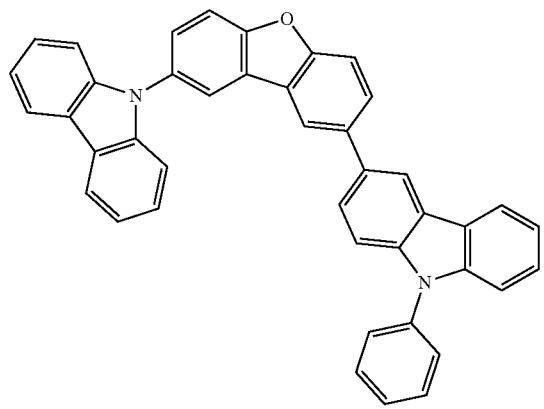

Thereafter, the following Compound E-1 was deposited at a deposition velocity of 0.1 nm/sec to thereby form an electron transport layer having a film thickness of 30 nm. Compound E-1 is Compound 10 shown above as a material for constituting a nitrogen-containing layer.

[Chemical Formula 80]

E-1 (10)

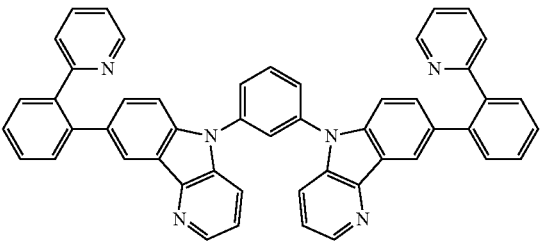

Furthermore, LiF was formed at a film thickness of 1.5 nm, and aluminum of 110 nm was then deposited to form a counter electrode (cathode).

The non-luminescent surface of the above-mentioned element was then covered with a glass case, whereby each organic electroluminescent element was prepared.

EXAMPLE 4

Using each of the transparent electrodes of Samples 208 to 229 each having the constitution of the present invention prepared in Example 1 as an anode, each white luminescence tandem-type organic electroluminescent element in which this anode was disposed on the lower part of the luminescent functional layer was prepared. When each of the prepared organic electroluminescent elements was evaluated as in Example 2, it was found that the organic electroluminescent elements had high external quantum efficiencies (EQE), and were excellent in luminescent property and also excellent in high temperature-high humidity storage property as in Example 2. Accordingly, it was confirmed that the present invention is also effective as a constitution of a tandem type organic electroluminescent element.

In addition, the procedure for preparing each of the tandem type organic electroluminescent elements prepared in Example 4 is as follows.

Firstly, each of the transparent electrodes of Samples 208 to 229 each having the constitution of the present invention prepared in Example 1 was formed as an anode on a transparent substrate made of glass of 30 mm×30 mm and having a thickness of 0.7 mm. The transparent substrate on which each anode had been formed was fixed on a substrate holder of a commercially available vacuum deposition apparatus.

On the other hand, the constitutional materials of the respective layers to be subsequently formed were filled in respective deposition crucibles in the vacuum deposition apparatus by only optimal amounts for the preparation of the respective elements, and the deposition crucibles were fixed in the vacuum deposition apparatus. As the deposition crucibles, those prepared by materials for resistance heating made of molybdenum or tungsten were used.

Thereafter, the pressure in the vacuum deposition apparatus was reduced to a vacuum degree of $1 \times 10^{-4}$ Pa, and the above-mentioned deposition crucible containing α-NPD was heated by energization to deposit on the transparent electrode at a deposition velocity of 0.1 nm/sec, whereby a hole injection transport layer having a film thickness of 40 nm was formed.

Subsequently, the above-mentioned Compound BD-1, which is a blue luminescent dopant, and the above-mentioned Compound H-2, which is a host compound, were co-deposited at a deposition velocity of 0.1 nm/sec so that the concentration of Compound BD-1 became 5%, whereby a fluorescent layer having a film thickness of 30 nm and exhibiting blue luminescence was formed.

The above-mentioned compound E-1 was then deposited at a deposition velocity of 0.1 nm/sec, whereby an electron transport layer having a film thickness of 30 nm was formed.

Subsequently, lithium was deposited at a film thickness of 1 nm, whereby an intermediate metal layer was formed.

Subsequently, the above-mentioned α-NPD was deposited at a deposition velocity of 0.1 nm/sec, whereby a hole injection transport layer having a film thickness of 50 nm was formed.

Subsequently, the above-mentioned Compound GD-1, which is a green luminescent dopant, the above-mentioned Compound RD-1, which is a red luminescent dopant, and the above-mentioned Compound H-3, which is a host compound, were co-deposited at a deposition velocity of 0.1 nm/sec so that the concentration of Compound GD-1 became 17% and the concentration of Compound RD-1 became 0.8%, whereby a phosphorescent luminescent layer having a film thickness of 30 nm and exhibiting yellow was formed.

Thereafter, the above-mentioned compound E-1 was deposited at a deposition velocity of 0.1 nm/sec, whereby an electron transport layer having a film thickness of 30 nm was formed.

Furthermore, LiF was formed at a film thickness of 1.5 nm, and aluminum of 110 nm was then deposited to form a counter electrode (cathode).

The non-luminescent surface of the above-mentioned element was then covered with a glass case, whereby each organic electroluminescent element was prepared.

REFERENCE SIGNS LIST 1, 1' . . . transparent electrodes, 1a . . . nitrogen-containing layer, 1b . . . electrode layer, 3 . . . luminescent functional layer, 5 . . . counter electrode, H1, H2 . . . high-refractive index layers, EL . . . organic electroluminescent element (electronic device)

The invention claimed is:

1. A transparent electrode, comprising:

a nitrogen-containing layer constituted by using a compound containing a nitrogen atom (N), the compound has an effective non-covalent electron pair content rate [n/M] of $6.5 \times 10^{-3} \leq [n/M]$, given that the number of non-covalent electron pairs that are neither involved on aromaticity nor coordinated to a metal among non-covalent electron pairs of nitrogen atoms (N) contained in the compound is n and the molecular weight of the compound is M;

an electrode layer containing silver (Ag) as a main component, is the electrode layer being disposed adjacent to the nitrogen-containing layer; and two high-refractive index layers each having a higher refractive index than that of the nitrogen-containing layer, the high-refractive index layers being disposed to sandwich the electrode layer and the nitrogen-containing layer.

2. A transparent electrode, comprising:

a nitrogen-containing layer constituted by using a compound containing a nitrogen atom (N), the compound has an effective non-covalent electron pair content rate [n/M] of $2.0 \times 10^{-3} \leq [n/M]$, given that the number of non-covalent electron pairs that are neither involved in aromaticity nor coordinated to a metal among non-covalent electron pairs of nitrogen atoms (N) contained in the compound is n and the molecular weight of the compound is M;

an electrode layer containing silver (Ag) as a main component, is the electrode layer being disposed adjacent to the nitrogen-containing layer;

two high-refractive index layers each having a higher refractive index than that of the nitrogen-containing layer, the high-refractive index layers being disposed to sandwich the electrode layer and the nitrogen-containing layer; and the nitrogen-containing layer is such that the effective non-covalent electron pair content rate [n/M] at the interface on the side of the electrode layer has a value of $2.0 \times 10^{-3} \leq [n/M]$.

3. A transparent electrode, comprising:

a nitrogen-containing layer constituted by using a compound containing a nitrogen atom (N);

an electrode layer containing silver (Ag) as a main component, is the electrode layer being disposed adjacent to the nitrogen-containing layer;

two high-refractive index layers each having a higher refractive index than that of the nitrogen-containing layer, the high-refractive index layers being disposed to sandwich the electrode layer and the nitrogen-containing layer; and the nitrogen-containing layer contains a compound having a structure represented by the following General Formula (1):

General Formula (1)

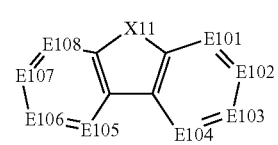

wherein,

X11 represents —N(R11)- or —O—,

E101 to E108 each represent —C(R12)= or —N=, wherein at least one of E101 to E108 is —N=, and the R11 and the R12 each represent a hydrogen atom (H) or a substituent.

4. The transparent electrode according to claim 3, wherein X11 in the General Formula (1) is —N(R11)- and is represented by the following General Formula (1a):

General Formula (1a)

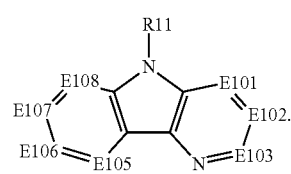

5. The transparent electrode according to claim 4, wherein E104 in the General Formula (1a) is —N= and is represented by the following General Formula (1a):

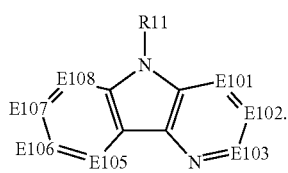

General Formula (1a-1)

6. The transparent electrode according to claim 4, wherein E103 and E106 in the General Formula (1a) are each —N= and is represented by the following General Formula (1a-2):

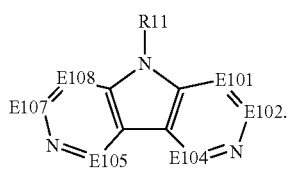

General Formula (1a-2)

7. The transparent electrode according to claim 3, wherein X11 is —O— and E104 is —N= in the General Formula (1) and is represented by the following General Formula (1b):

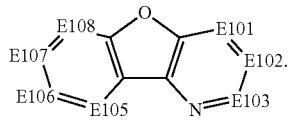

General Formula (1b)

8. The transparent electrode according to claim 3, wherein the compound having a structure represented by General Formula (1) has a structure represented by the following General Formula (2):

General Formula (2)

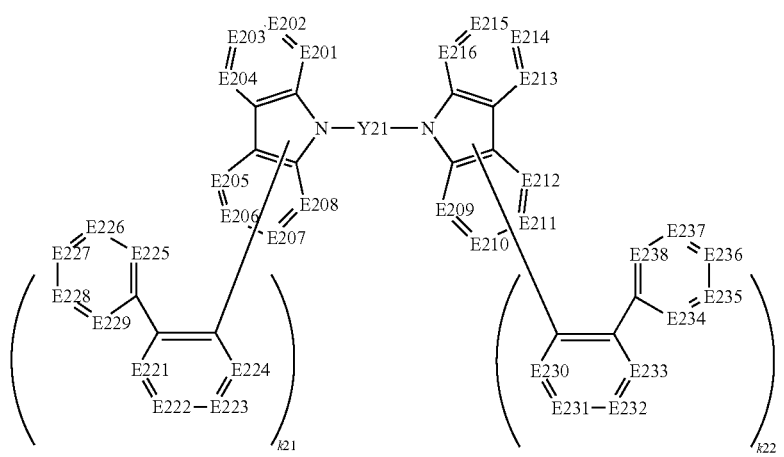

wherein,

Y21 represents a bivalent linking group formed of an arylene group, a heteroarylene group or a combination thereof, E201 to E216 and E221 to E238 each represent —C(R21)= or —N=, wherein the R21 represents a hydrogen atom (H) or a substituent, and at least one of E221 to E229 and at least one of E230 to E238 are each —N=, and k21 and k22 each represent an integer of 0 to 4, provided that k21+k22 is an integer of 2 or more.

9. The transparent electrode according to claim 3, wherein the compound represented by General Formula (1) has a structure represented by the following General Formula (3):

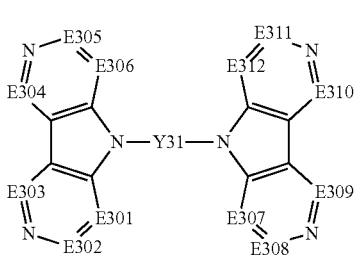

General Formula (3)

wherein,

E301 to E312 each represent —C(R31)=, wherein the R31 represents a hydrogen atom (H) or a substituent, and Y31 represents a bivalent linking group formed of an arylene group, a heteroarylene group or a combination thereof.

10. The transparent electrode according to claim 3, wherein the compound having a structure represented by General Formula (4) has a structure represented by the following General Formula (4):

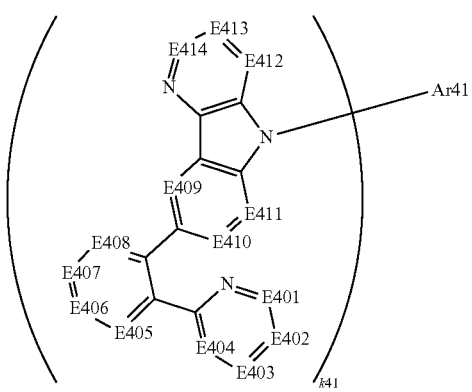

General Formula (4)

wherein,
E401 to E414 each represent —C(R41)=, wherein the R41 represents a hydrogen atom (H) or a substituent,
Ar41 represents a substituted or unsubstituted, aromatic hydrocarbon ring or aromatic hetero ring, and
k41 represents an integer of 3 or more.

11. A transparent electrode, comprising:
a nitrogen-containing layer constituted by using a compound containing a nitrogen atom (N);
an electrode layer containing silver (Ag) as a main component, is the electrode layer being disposed adjacent to the nitrogen-containing layer;
two high-refractive index layers each having a higher refractive index than that of the nitrogen-containing layer, the high-refractive index layers being disposed to sandwich the electrode layer and the nitrogen-containing layer; and
the nitrogen-containing layer contains a compound having a structure represented by the following General Formula (5):

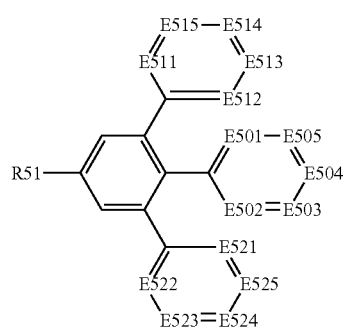

General Formula (5)

wherein,
R51 represents a substituent,
E501, E502, E511 to E515 and E521 to E525 each represent —C(R52)= or —N=,
E503 to E505 each represent —C(R52)=,
wherein the R52 represents a hydrogen atom (H) or a substituent,
at least one of E501 and E502 is —N=,
at least one of E511 to E515 is —N=, and
at least one of E521 to E525 is —N=.

12. The transparent electrode of claim 11, wherein the compound containing a nitrogen atom (N) has a structure represented by General Formula 5.

13. A transparent electrode, comprising:
a nitrogen-containing layer constituted by using a compound containing a nitrogen atom (N);
an electrode layer containing silver (Ag) as a main component, is the electrode layer being disposed adjacent to the nitrogen-containing layer;
two high-refractive index layers each having a higher refractive index than that if the nitrogen-containing layer, the high-refractive index layers being disposed to sandwich the electrode layer and the nitrogen-containing layer; and
the nitrogen-containing layer contains a compound having a structure represented by the following General Formula (6):

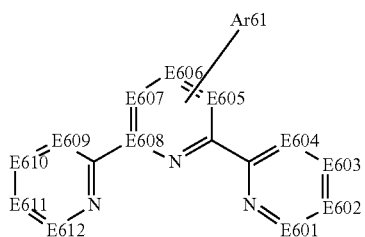

General Formula (6)

wherein,
E601 to E612 each represent —C(R61)= or —N=,
wherein the R61 represents a hydrogen atom (H) or a substituent, and
Ar61 represents a substituted or unsubstituted, aromatic hydrocarbon ring or aromatic hetero ring.

14. The transparent electrode of claim 13, wherein the compound containing a nitrogen atom (N) has a structure represented by General Formula 6.

15. A transparent electrode, comprising:
a nitrogen-containing layer constituted by using a compound containing a nitrogen atom (N);
an electrode layer containing silver (Ag) as a main component, is the electrode layer being disposed adjacent to the nitrogen-containing layer;
two high-refractive index layers each having a higher refractive index than that of the nitrogen-containing layer, the high-refractive index layers being disposed to sandwich the electrode layer and the nitrogen-containing layer; and
the nitrogen-containing layer contains a compound having a structure represented by the following General Formula (7):

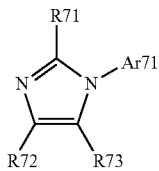

General Formula (7)

wherein,
R71 to R73 each represent a hydrogen atom (H) or a substituent, and
Ar71 represents an aromatic hydrocarbon ring group or an aromatic hetero ring group.

16. The transparent electrode according to claim 15, wherein
the compound having a structure represented by General Formula (7) has a structure represented by the following General Formula (8):

General Formula (8)

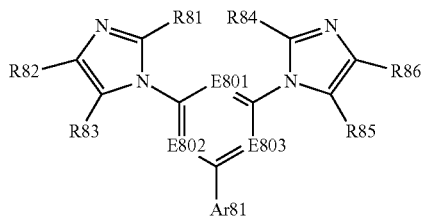

wherein,
R81 to R86 each represent a hydrogen atom (H) or a substituent,
E801 to E803 each represent —C(R87)= or —N=, wherein the R87 represents a hydrogen atom (H) or a substituent, and
Ar81 represents an aromatic hydrocarbon ring group or an aromatic hetero ring group.

17. The transparent electrode according to claim 16, wherein the compound having a structure represented by General Formula (8) has a structure represented by the following General Formula (8a):

General Formula (8a)

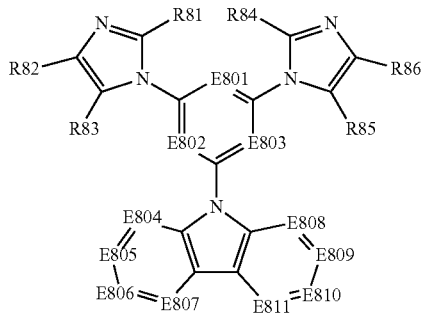

wherein,
E804 to E811 each represent —C(R88)= or —N=,
wherein the R88 represents a hydrogen atom (H) or a substituent,
at least one of E808 to E811 is —N=, and
E804 to E807, and E808 to E811 each may bind to each other to form a new ring.

18. The transparent electrode of claim 17, wherein the compound containing a nitrogen atom (N) has a structure represented by General Formula 7.

19. An organic electroluminescent element, comprising:
a transparent electrode, the transparent electrode, comprising:
a nitrogen-containing layer constituted by using a compound containing a nitrogen atom (N);
an electrode layer containing silver (Ag) as a main component, the electrode layer being disposed adjacent to the nitrogen-containing layer, and
two high-refractive index layers each having a higher refractive index than that of the nitrogen-containing layer, the high-refractive index layers being disposed to sandwich the electrode layer and the nitrogen-containing layer;
a luminescent functional layer disposed by being stacked on the transparent electrode, and
a counter electrode disposed in the state that the luminescent functional layer is sandwiched between the counter electrode and the transparent electrode.

20. The organic electroluminescent element according to claim 19, wherein the luminescent functional layer is disposed on a position where the electrode layer is sandwiched between the luminescent functional layer and the nitrogen-containing layer.

21. The transparent electrode of claim 3, wherein the compound containing a nitrogen atom (N) has a structure represented by General Formula 1.

* * * * *